US011881465B2

(12) United States Patent
Okada et al.

(10) Patent No.: US 11,881,465 B2
(45) Date of Patent: Jan. 23, 2024

(54) SEMICONDUCTOR STORAGE DEVICE WITH TRANSISTORS OF PERIPHERAL CIRCUITS ON TWO CHIPS

(71) Applicant: KIOXIA CORPORATION, Tokyo (JP)

(72) Inventors: Nobuaki Okada, Yokohama Kanagawa (JP); Toshiki Hisada, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 197 days.

(21) Appl. No.: 17/183,809

(22) Filed: Feb. 24, 2021

(65) Prior Publication Data
US 2022/0077088 A1    Mar. 10, 2022

(30) Foreign Application Priority Data

Sep. 10, 2020  (JP) ................................. 2020-152188

(51) Int. Cl.
*G11C 16/04*    (2006.01)
*H01L 23/00*    (2006.01)
(Continued)

(52) U.S. Cl.
CPC .......... *H01L 24/08* (2013.01); *G11C 16/0483* (2013.01); *G11C 16/08* (2013.01);
(Continued)

(58) Field of Classification Search
CPC ..... H01L 24/08; H01L 25/0657; H01L 25/18; H01L 2224/08145; H01L 2924/1431; H01L 2924/14511; H01L 24/48; H01L 24/49; H01L 2224/05554; H01L 2224/06135; H01L 25/50; H01L 24/73; H01L 2224/32145; H01L 2224/32225;
(Continued)

(56) References Cited

U.S. PATENT DOCUMENTS 9,558,945 B2    1/2017 Fukuzumi et al.
9,666,296 B1    5/2017 Maejima
(Continued)

FOREIGN PATENT DOCUMENTS

JP         2017-157260 A    9/2017

*Primary Examiner* — Tha-O H Bui
(74) *Attorney, Agent, or Firm* — Kim & Stewart LLP

(57) ABSTRACT

A semiconductor storage device includes first and second chips. The first chip includes a first semiconductor substrate, first conductive layers arranged in a first direction and extending in a second direction, a semiconductor column extending in the first direction and facing the first conductive layers, a first charge storage film formed between the first conductive layers and the semiconductor column, a plurality of first transistors on the first semiconductor substrate, and first bonding electrodes electrically connected to a portion of the plurality of first transistors. The second chip includes a second semiconductor substrate, a plurality of second transistors on the second semiconductor substrate, and second bonding electrodes electrically connected to a portion of the plurality of second transistors, and bonded to the first bonding electrodes. A thickness of the second semiconductor substrate in the first direction is smaller than a thickness of the first semiconductor substrate in the first direction.

18 Claims, 35 Drawing Sheets

(51) Int. Cl.
H01L 25/065 (2023.01)
H01L 25/18 (2023.01)
G11C 16/08 (2006.01)
H10B 41/27 (2023.01)
H10B 43/27 (2023.01)
G11C 16/24 (2006.01)

(52) U.S. Cl.
CPC .......... *G11C 16/24* (2013.01); *H01L 25/0657* (2013.01); *H01L 25/18* (2013.01); *H10B 41/27* (2023.02); *H10B 43/27* (2023.02); *H01L 2224/08145* (2013.01); *H01L 2924/1431* (2013.01); *H01L 2924/14511* (2013.01)

(58) Field of Classification Search
CPC . H01L 2224/48091; H01L 2224/48145; H01L 2224/48147; H01L 2224/48227; H01L 2224/49175; H01L 2224/73265; H01L 2225/06506; H01L 2225/0651; H01L 2225/06524; H01L 2924/00014; H01L 2924/1434; G11C 16/0483; G11C 16/08; G11C 16/24; G11C 16/30; G11C 5/025; G11C 16/10; G11C 16/26; H10B 41/27; H10B 43/27; H10B 43/10; H10B 41/10; H10B 41/50; H10B 43/50; H10B 41/35; H10B 43/35
USPC .................................................... 365/185.17
See application file for complete search history.

(56) References Cited

U.S. PATENT DOCUMENTS

| | | | |
|---|---|---|---|
| 10,283,493 | B1 | 5/2019 | Nishida |
| 10,629,616 | B1* | 4/2020 | Kai .......................... H10B 43/10 |
| 10,685,689 | B2* | 6/2020 | Date ....................... H10B 43/40 |
| 10,881,108 | B2* | 1/2021 | Sada ..................... A01N 43/653 |
| 11,158,604 | B2* | 10/2021 | Cheng ..................... H01L 21/78 |
| 2019/0088676 | A1 | 3/2019 | Tagami et al. |

* cited by examiner

SEMICONDUCTOR STORAGE DEVICE WITH TRANSISTORS OF PERIPHERAL CIRCUITS ON TWO CHIPS

CROSS-REFERENCE TO RELATED APPLICATION(S)

This application is based upon and claims the benefit of priority from Japanese Patent Application No. 2020-152188, filed Sep. 10, 2020, the entire contents of which are incorporated herein by reference.

FIELD

Embodiments described herein relate generally to a semiconductor storage device.

BACKGROUND

A semiconductor storage device is known which includes a substrate, a plurality of conductive layers stacked in a direction intersecting the upper surface of the substrate, semiconductor columns that face the plurality of conductive layers, and a charge storage film formed between a conductive layer and a semiconductor column.

DETAILED DESCRIPTION

Figure 1:
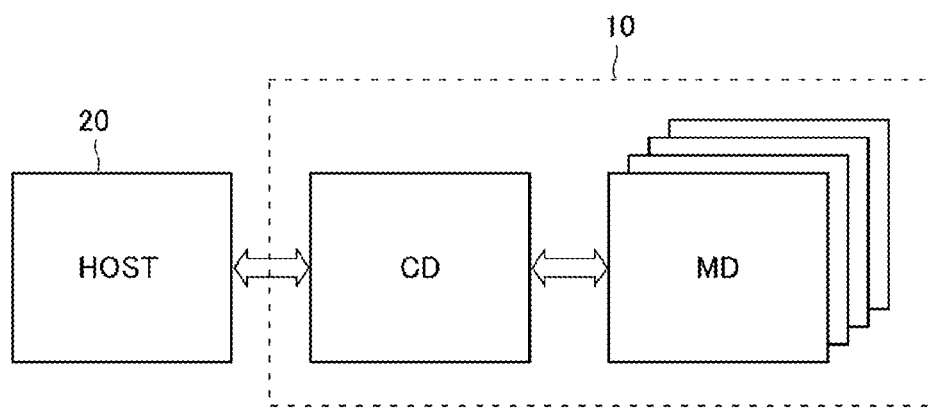
FIG. 1 is a schematic block diagram illustrating a configuration of a memory system according to a first embodiment.

Embodiments provide a semiconductor storage device in which a memory cell array and high voltage transistors of a peripheral circuit are formed on a first substrate and low voltage transistors of the peripheral circuit are formed on a second substrate.

In general, according to one embodiment, a semiconductor storage device includes a first chip and a second chip. The first chip includes a first semiconductor substrate, a plurality of first conductive layers arranged in a first direction intersecting a surface of the first semiconductor substrate, and extending in a second direction intersecting the first direction, a first semiconductor column extending in the first direction and facing the plurality of first conductive layers, a first charge storage film formed between the plurality of first conductive layers and the first semiconductor column, a plurality of first transistors provided on the first semiconductor substrate, and a plurality of first bonding electrodes electrically connected to at least a portion of the plurality of first transistors. The second chip includes a second semiconductor substrate, a plurality of second transistors provided on the second semiconductor substrate, and a plurality of second bonding electrodes electrically connected to at least a portion of the plurality of second transistors, and bonded to the plurality of first bonding electrodes. A thickness of the second semiconductor substrate in the first direction is smaller than a thickness of the first semiconductor substrate in the first direction.

Next, a semiconductor storage device according to embodiments will be described in detail with reference to the accompanying drawings. The embodiments to be described herein below are merely examples, and are not intended to limit the scope of the present disclosure. Further, the drawings are schematic, and may omit some components for the convenience of descriptions. Further, similar portions in the plurality of embodiments will be denoted by the same reference numerals, and descriptions thereof may be omitted.

Throughout the descriptions herein, the "semiconductor storage device" may indicate a memory die or a memory system that includes a controller die, such as a memory chip, a memory card or an SSD (solid state drive). Alternatively, the "semiconductor storage device" may indicate a configuration that includes a host computer, such as a smart phone, a tablet terminal or a personal computer.

In the descriptions herein, when a first element is "electrically connected" to a second element, the first element may be connected directly to the second element, or the first element may be connected to the second element via a wiring, a semiconductor member or a transistor. For example, when three transistors are connected to each other in series, the first transistor is "electrically connected" to the third transistor, even when the second transistor is in an OFF state.

In the descriptions herein, when a first element is "connected between" second and third elements, this description may indicate that the first, second, and third elements are connected to each other in series, and the second element is connected to the third element via the first element.

In the descriptions herein, when a circuit or the like "conducts" two wirings or the like, this description may indicate, for example, that the circuit or the like includes a transistor or the like, and the transistor or the like is provided in a current path between the two wirings or the like such that the transistor or the like enters an ON state.

In the descriptions herein, a predetermined direction parallel to the upper surface of the substrate will be referred to as an X direction, a direction parallel to the upper surface of the substrate and perpendicular to the X direction will be referred to as a Y direction, and a direction perpendicular to the upper surface of the substrate will be referred to as a Z direction.

In the descriptions herein, a direction along a predetermined surface will be referred to as a first direction, a direction intersecting the first direction along the predetermined surface will be referred to as a second direction, and a direction intersecting the predetermined surface will be referred to as a third direction. Each of the first, second, and third directions may or may not correspond to any of the X, Y, and Z directions.

In the descriptions herein, the criterion for expressions such as "upper (above)" and "lower (below)" is the substrate on which a memory cell array is provided. For example, the direction away from the substrate along the Z direction will be referred to as an upward direction, and the direction that approaches the substrate along the Z direction will be referred to as a downward direction. Further, the lower surface or end of a certain element indicates the surface or end of the element close to the substrate, and the upper surface or end of the element indicates the surface or end of the element opposite to the surface or end thereof close to the substrate. Further, the surface of the element that intersects the X or Y direction will be referred to as a side surface or the like of the element.

In the descriptions herein, the "width," "length," "thickness" or the like of an element, a member or the like may indicate the width, length, thickness or the like of the cross section of the element that is observed by, for example, a SEM (scanning electron microscopy) or a TEM (transmission electron microscopy).

First Embodiment

[Memory System 10]

FIG. 1 is a schematic block diagram illustrating a configuration of a memory system 10 according to a first embodiment.

The memory system 10 performs reading, writing, erasing or the like of user data in response to a signal transmitted from a host computer 20. The memory system 10 is, for example, a memory chip, a memory card, an SSD or other memory systems capable of storing user data. The memory system 10 includes a plurality of memory dies MD that stores user data, and a controller die CD connected to the plurality of memory dies MD and the host computer 20. The controller die CD includes, for example, a processor, RAM or the like, and executes processes such as a conversion of a logical address and a physical address, detection/correction of a bit error, a garbage collection (compaction), and a wear leveling.

Figure 2:
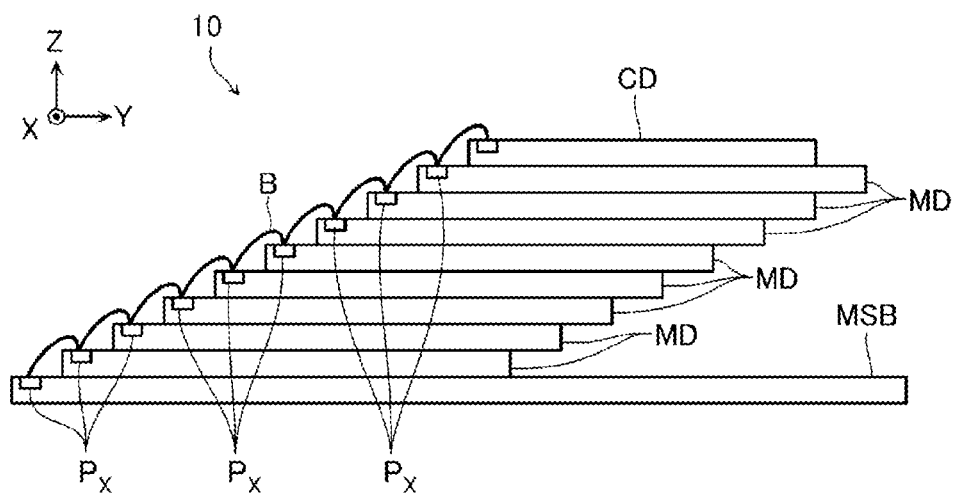
FIG. 2 is a schematic side view illustrating an example of the configuration of the memory system of FIG. 1.
Figure 3:
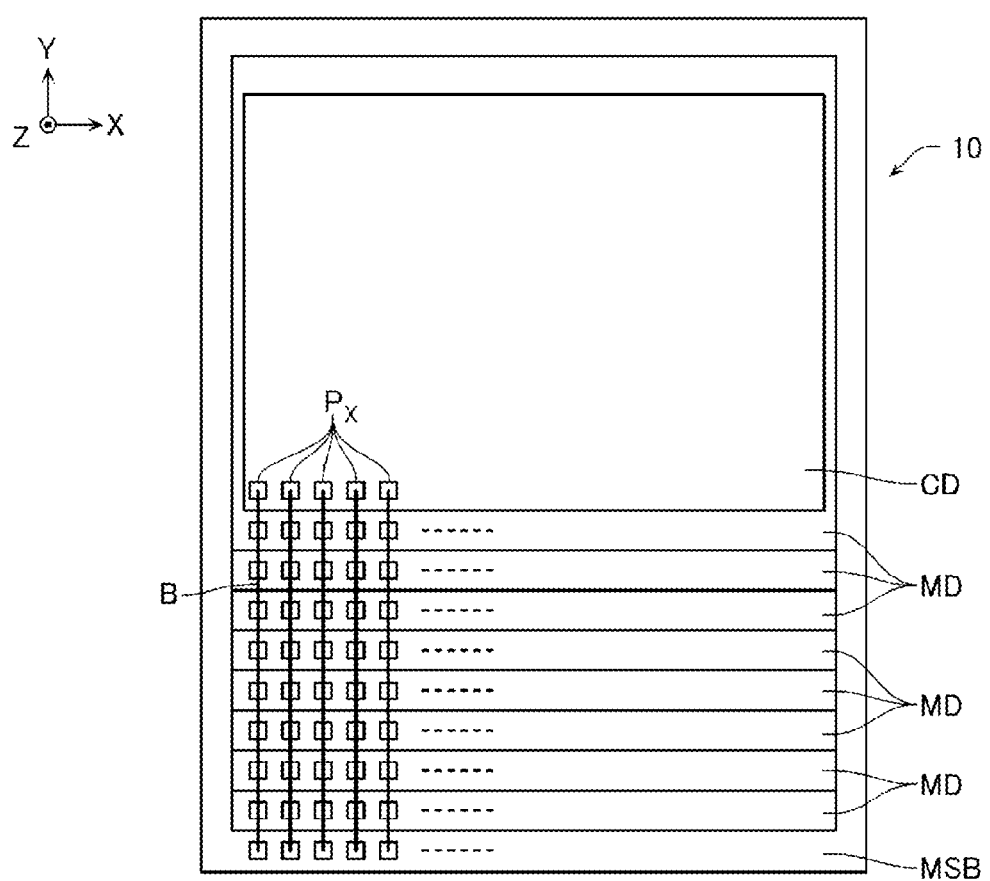
FIG. 3 is a schematic plan view illustrating the example of the configuration of the memory system of FIG. 1.

FIG. 2 is a schematic side view illustrating an example of the configuration of the memory system 10 according to the present embodiment. FIG. 3 is a schematic plan view illustrating the example of the same configuration. For the convenience of descriptions, FIGS. 2 and 3 omit a portion of the configuration.

As illustrated in FIG. 2, the memory system 10 according to the present embodiment includes a mounting substrate MSB, the plurality of memory dies MD stacked on the mounting substrate MSB, and the controller die CD stacked on the memory dies MD. In the upper surface of the mounting substrate MSB, the end region in the Y direction is provided with bonding pad electrodes $P_X$, and a portion of the other region is adhered to the lower surface of a memory die MD via an adhesive or the like. In the upper surface of the memory die MD, the end region in the Y direction is provided with bonding pad electrodes $P_X$, and the other region is adhered to the lower surface of another memory die MD or a controller die CD via an adhesive or the like. In the upper surface of the controller die CD, the end region in the Y direction is provided with bonding pad electrodes $P_X$.

As illustrated in FIG. 3, each of the mounting substrate MSB, the plurality of memory dies MD, and the controller die CD includes the plurality of bonding pad electrodes $P_X$ arranged in the X direction. The plurality of bonding pad electrodes $P_X$ provided in the mounting substrate MSB, the plurality of memory dies MD, and the controller die CD are connected to each other via bonding wires B.

Further, the configuration illustrated in FIGS. 2 and 3 is merely an example, and the details of the configuration may be appropriately adjusted. For example, in the example illustrated in FIGS. 2 and 3, the controller die CD is stacked on the plurality of memory dies MD, and the controller die CD and the memory dies MD are connected to each other by the bonding wires B. In this configuration, the plurality of memory dies MD and the controller die CD are provided in one package. However, the controller die CD may be provided in a package different from that of the memory dies MD.

[Circuit Configuration of Memory Die MD]

Figure 4:
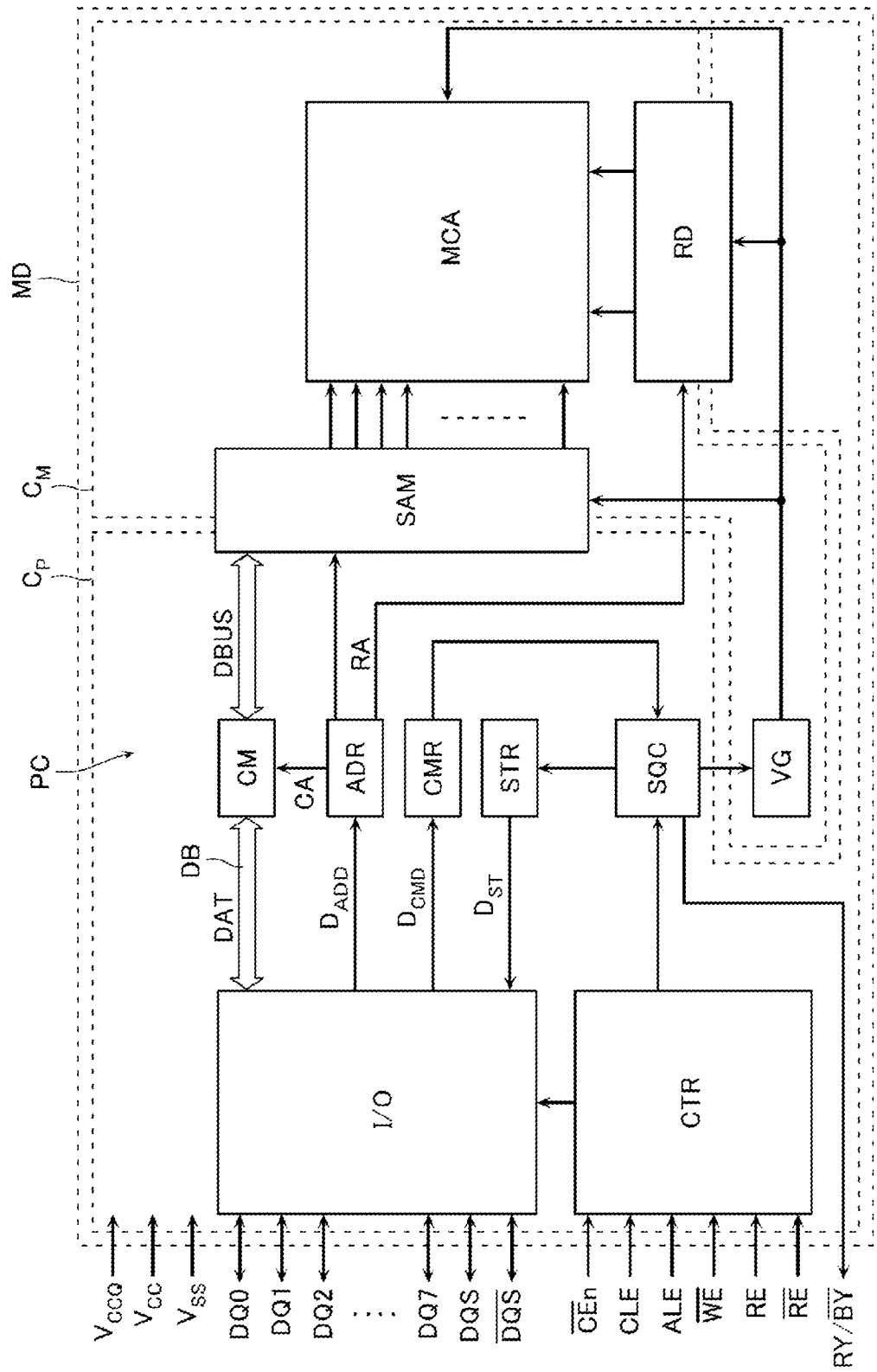
FIG. 4 is a schematic block diagram illustrating a configuration of a memory die according to the first embodiment.

FIG. 4 is a schematic block diagram illustrating a configuration of a memory die MD according to the first embodiment. FIGS. 5 to 10 are schematic circuit diagrams illustrating a portion of the configuration of the memory die MD.

Further, FIG. 4 illustrates a plurality of control terminals and others. The plurality of control terminals may be represented as control terminals that correspond to a high active signal (a positive logic signal), control terminals that correspond to a low active signal (a negative logic signal), and control terminals that correspond to both the high active signal and the low active signal. In FIG. 4, the code of a control terminal that corresponds to the low active signal includes an overline (upper line). In the descriptions herein, the code of the control terminal that corresponds to the low active signal includes a slash ("/"). The configuration in FIG. 4 is an example, and the specific aspect of the configuration may be appropriately adjusted. For example, some or all of the high active signals may be changed to the low active signals, or some or all of the low active signals may be changed to the high active signals.

As illustrated in FIG. 4, the memory die MD includes a memory cell array MCA that stores data, and a peripheral circuit PC connected to the memory cell array MCA. The peripheral circuit PC includes a voltage generation circuit VG, a row decoder RD, a sense amplifier module SAM, and a sequencer SQC. Further, the peripheral circuit PC includes a cache memory CM, an address register ADR, a command register CMR, and a status register STR. Further, the peripheral circuit PC includes an input/output control circuit I/O and a logic circuit CTR.

[Circuit Configuration of Memory Cell Array MCA]

Figure 5:
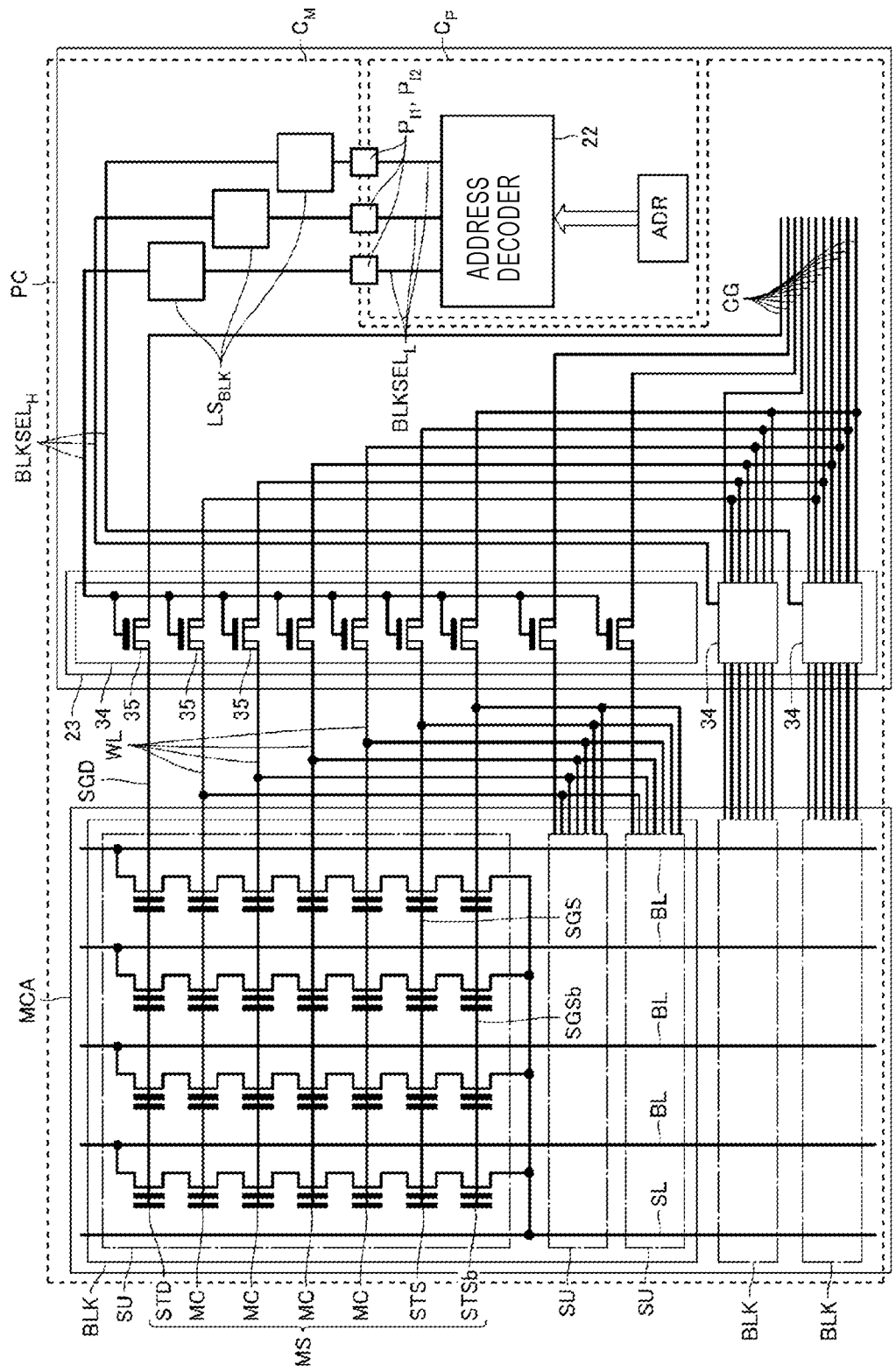
FIG. 5 is a schematic circuit diagram illustrating a portion of the configuration of the memory die of FIG. 4.

As illustrated in FIG. 5, the memory cell array MCA includes a plurality of memory blocks BLK. Each memory block BLK includes a plurality of string units SU. Each string unit SU includes a plurality of memory strings MS. One end of each of the plurality of memory strings MS is connected to the peripheral circuit PC via a bit line BL. Further, the other end of each of the plurality of memory strings MS is connected to the peripheral circuit PC via a common source line SL.

Each memory string MS includes a drain-side select transistor STD, a plurality of memory cells MC (memory transistors), and source-side select transistors STS and STSb that are connected to each other in series between a bit line BL and the source line SL. Hereinafter, the drain-side select transistor STD and the source-side select transistors STS and STSb may be simply referred to as the select transistors STD, STS, and STSb.

Each memory cell MC is a field-effect type transistor provided with a semiconductor layer that functions as a channel region, a gate insulating film that includes a charge storage film, and a gate electrode. A threshold voltage of the memory cell MC varies according to an amount of charges in the charge storage film. One-bit or multiple-bit data is recorded in the memory cell MC. Further, word lines WL are connected to the gate electrodes of the plurality of memory cells MC that correspond to one memory string MS, respectively. The word lines WL are connected in common to all of the memory strings MS, respectively, in one memory block BLK.

The select transistors STD, STS, and STSb are field-effect type transistors each provided with a semiconductor layer that functions as a channel region, a gate insulating film, and a gate electrode. Select gate lines SGD, SGS, and SGSb are connected to the gate electrodes of the select transistors STD, STS, and STSb, respectively. The drain-side select gate line SGD is provided to correspond to each string unit SU, and is connected in common to all of the memory strings MS in one string unit SU. The source-side select gate line SGS is connected in common to all of the memory strings MS in the plurality of string units SU. The source-side select gate line SGSb is connected in common to all of the memory strings MS in the plurality of string units SU.

[Circuit Configuration of Voltage Generation Circuit VG]

Figure 6:
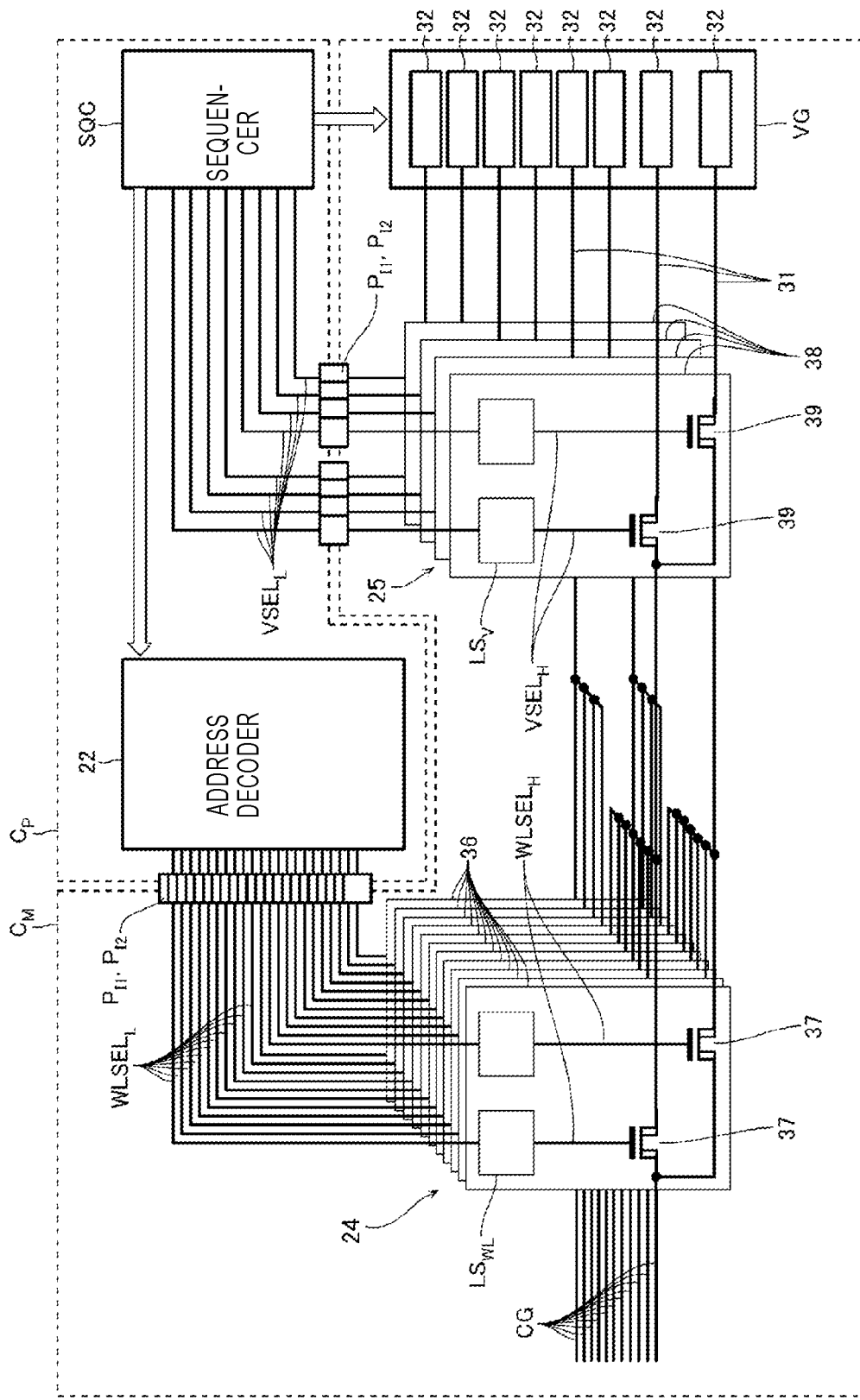
FIG. 6 is a schematic circuit diagram illustrating a portion of the configuration of the memory die of FIG. 4.

For example, as illustrated in FIG. 6, the voltage generation circuit VG (FIG. 4) is connected to a plurality of voltage supply lines 31. The voltage generation circuit VG includes, for example, step-down circuits such as regulators and step-up circuits such as charge pump circuits 32. The step-down circuits and the step-up circuits are connected to voltage supply lines to which a power supply voltage $V_{CC}$ and a ground voltage $V_{SS}$ (FIG. 4) are supplied, respectively. The voltage supply lines are connected to the bonding pad electrodes $P_X$ described above with reference to, for example, FIGS. 2 and 3. The voltage generation circuit VG generates a plurality of types of operation voltages to be applied to the bit lines BL, the source line SL, the word lines WL, and the select gate lines SGD, SGS, and SGSb when a read operation, a write operation or an erase operation is performed with respect to the memory cell array MCA in response to, for example, a control signal from the sequencer SQC, and outputs the operation voltages to the plurality of voltage supply lines 31 at the same time. The operation voltages output from the voltage supply lines 31 are appropriately adjusted according to a control signal from the sequencer SQC.

Figure 7:
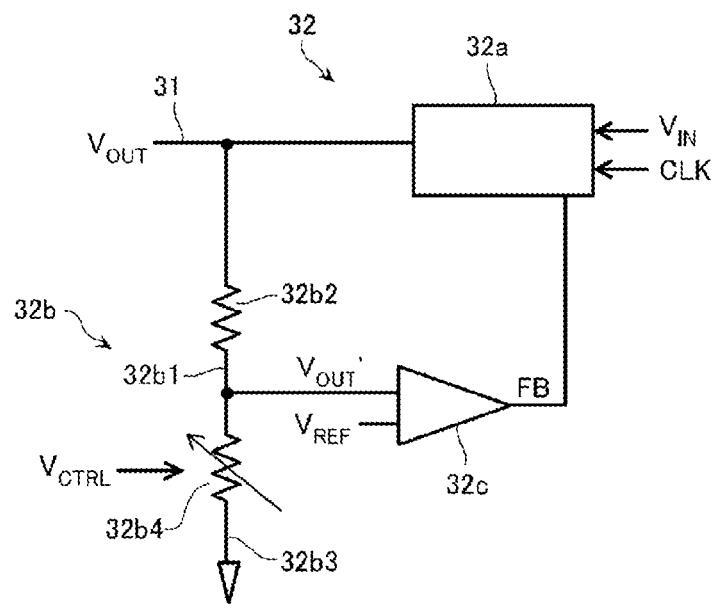
FIG. 7 is a schematic circuit diagram illustrating a portion of the configuration of the memory die of FIG. 4.

For example, as illustrated in FIG. 7, the charge pump circuit 32 includes a voltage output circuit 32a that outputs a voltage $V_{OUT}$ to a voltage supply line 31, a voltage division circuit 32b connected to the voltage supply line 31, and a comparator 32c that outputs a feedback signal FB to the voltage output circuit 32a according to a magnitude relationship between a voltage $V_{OUT}'$ output from the voltage division circuit 32b and a reference voltage $V_{REF}$.

Figure 8:
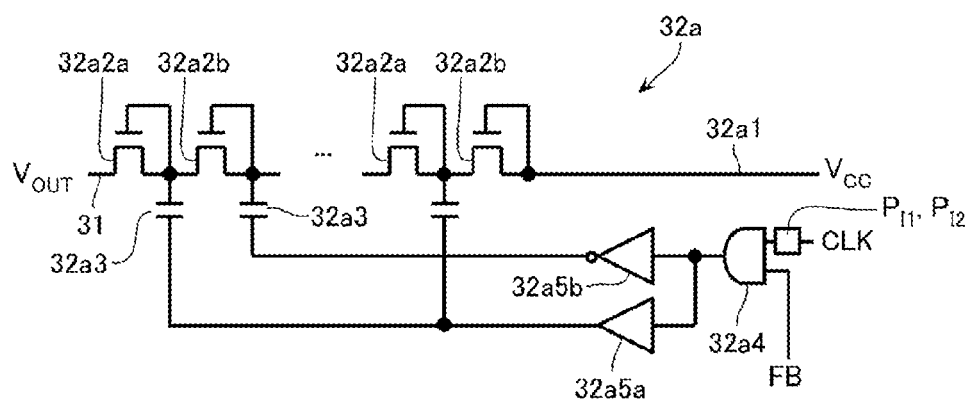
FIG. 8 is a schematic circuit diagram illustrating a portion of the configuration of the memory die of FIG. 4.

As illustrated in FIG. 8, the voltage output circuit 32a includes a plurality of high voltage transistors 32a2a and 32a2b that are connected to each other in an alternate manner between the voltage supply line 31 and a voltage supply line 32a1. The power supply voltage $V_{CC}$ is supplied to the voltage supply line 32a1. The gate electrode of each of the plurality of high voltage transistors 32a2a and 32a2b connected to each other in series is connected to its drain electrode and capacitor 32a3. Further, the voltage output circuit 32a includes an AND circuit 32a4 that outputs the logical sum of a clock signal CLK and the feedback signal FB, a level shifter 32a5a that steps up, and outputs, an output signal of the AND circuit 32a4, and a level shifter 32a5b that steps up, and outputs, an inversion signal of the output signal of the AND circuit 32a4. The output signal of the level shifter 32a5a is connected to the gate electrode of the high voltage transistor 32a2a via the capacitor 32a3. The output signal of the level shifter 32a5b is connected to the gate electrode of the high voltage transistor 32a2b via the capacitor 32a3.

When the feedback signal FB is in an "H" state, the AND circuit 32a4 outputs the clock signal CLK. As a result, electrons are transferred from the voltage supply line 31 to the voltage supply line 32a1, so that the voltage of the voltage supply line 31 increases. Meanwhile, when the feedback signal FB is in an "L" state, the AND circuit 32a4 does not output the clock signal CLK. Thus, the voltage of the voltage supply line 31 does not increase.

As illustrated in FIG. 7, the voltage division circuit 32b includes a resistance element 32b2 connected between the voltage supply line 31 and a voltage division terminal 32b1, and a variable resistance element 32b4 connected in series between the voltage division terminal 32b1 and a voltage supply line 32b3. The ground voltage $V_{SS}$ is supplied to the voltage supply line 32b3. The resistance value of the variable resistance element 32b4 may be adjusted according to an operation voltage control signal $V_{CTRL}$. Accordingly, the magnitude of the voltage $V_{OUT}'$ of the voltage division terminal 32b1 may be adjusted according to the operation voltage control signal $V_{CTRL}$.

Figure 9:
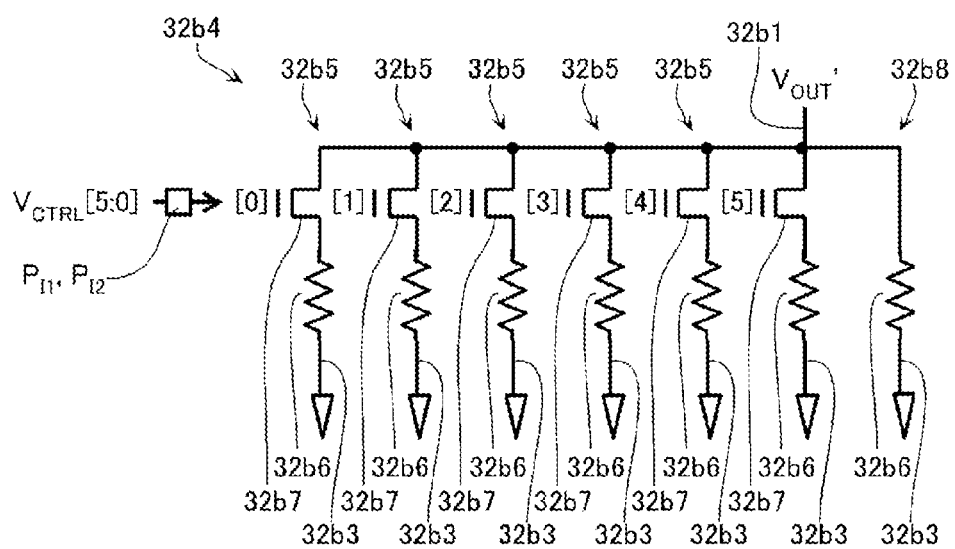
FIG. 9 is a schematic circuit diagram illustrating a portion of the configuration of the memory die of FIG. 4.

As illustrated in FIG. 9, the variable resistance element 32b4 includes a plurality of current paths 32b5 connected in parallel between the voltage division terminal 32b1 and the voltage supply line 32b3. Each of the plurality of current paths 32b5 includes a resistance element 32b6 and a transistor 32b7 that are connected to each other in series. The resistance values of the resistance elements 32b6 provided in the current paths 32b5, respectively, may have different magnitudes from each other. The operation voltage control signals $V_{CTRL}$ having different bits are input to the gate electrodes of the transistors 32b7 provided in the current paths 32b5, respectively. Further, the variable resistance element 32b4 may include a current path 32b8 that does not include the transistor 32b7.

As illustrated in FIG. 7, the comparator 32c outputs the feedback signal FB. The feedback signal FB enters the "L" state, for example, when the voltage $V_{OUT}'$ of the voltage division terminal 32b1 is higher than the reference voltage $V_{REF}$. Further, the feedback signal FB enters the "H" state, for example, when the voltage $V_{OUT}'$ is lower than the reference voltage $V_{REF}$.

[Circuit Configuration of Row Decoder RD]

In one example of the row decoder, as illustrated in FIGS. 5 and 6, the row decoder RD (FIG. 4) includes an address decoder 22 that decodes address data $D_{ADD}$, and a block selection circuit 23 (FIG. 5), a word line selection circuit 24 (FIG. 6), and a voltage selection circuit 25 (FIG. 6) that transfer an operation voltage to the memory cell array MCA according to an output signal of the address decoder 22.

The address decoder 22 includes a plurality of block selection lines $BLKSEL_L$ (FIG. 5) and a plurality of word line selection lines $WLSEL_L$ (FIG. 6). For example, the address decoder 22 sequentially refers to a row address RA of the address register ADR (FIG. 4) according to a control signal from the sequencer SQC, and decodes the row address RA. Then, the address decoder 22 turns ON predetermined block select transistors 35 and a predetermined word line select transistor 37 that correspond to the row address RA, and turns OFF the other block select transistors 35 and the other word line select transistors 37. For example, the address decoder 22 brings the voltages of a predetermined block selection line $BLKSEL_L$ and a predetermined word line selection line $WLSEL_L$ into the "H" state, and brings the other voltages into the "L" state. When a P-channel type transistor rather than an N-channel type transistor is used, voltages are applied in reverse to the wirings.

The block selection circuit 23 (FIG. 5) includes a plurality of block selection units 34 that corresponds to the memory blocks BLK. Each block selection unit 34 includes a plurality of block select transistors 35 that corresponds to the word lines WL and the select gate lines SGD, SGS, and SGSb, respectively. The block select transistors 35 are, for example, field-effect type high voltage transistors. The drain electrodes of the block select transistors 35 are electrically connected to the corresponding word lines WL and select gate lines SGD, SGS, and SGSb, respectively. The source electrodes of the block select transistors 35 are electrically connected to the voltage supply lines 31, respectively, via wirings CG, the word line selection circuit 24 (FIG. 6), and the voltage selection circuit 25 (FIG. 6). The gate electrodes of the block select transistors 35 are connected in common to a corresponding block selection line $BLKSEL_H$. The block selection line $BLKSEL_H$ is connected to a corresponding level shifter $LS_{BLK}$. The level shifter $LS_{BLK}$ may include, for example, one or more high voltage inverter circuits provided with an output terminal, a P-type high voltage transistor connected between the output terminal and a voltage supply line 31, an N-type high voltage transistor connected between the output terminal and the voltage supply line to which the ground voltage $V_{SS}$ is supplied, and an input terminal connected to the gate electrodes of the two high voltage transistors. Further, at least one output terminal of the one or more high voltage inverter circuits may be connected to the block selection line $BLKSEL_H$. Further, at least one input terminal of the one or more high voltage inverter circuits may be connected to the block selection line $BLKSEL_L$.

The word line selection circuit 24 (FIG. 6) includes a plurality of word line selection units 36 that corresponds to the word lines WL and the drain-side select gate line SGD. Each word line selection unit 36 includes a plurality of word line select transistors 37, and a plurality of level shifters $LS_{WL}$ connected to the gate electrodes of the plurality of word line select transistors 37. The word line select transistors 37 are, for example, field-effect type high voltage transistors. The drain terminals of the word line select transistors 37 are electrically connected to the corresponding word lines WL and select gate lines SGD, SGS, and SGSb, respectively, via the wirings CG and the block selection circuit 23 (FIG. 5). The source terminals of the word line select transistors 37 are electrically connected to the corresponding voltage supply lines 31, respectively, via the voltage selection circuit 25 (FIG. 6). The gate electrodes of the word line select transistors 37 are connected to the corresponding word line selection lines $WLSEL_H$, respectively. The word line selection lines $WLSEL_H$ are connected to the level shifters $LS_{WL}$, respectively. Each level shifter $LS_{WL}$ may include, for example, one or more high voltage inverter circuits. Further, at least one output terminal of the one or more high voltage inverter circuits may be connected to a word line selection line $WLSEL_H$. Further, at least one input terminal of the one or more high voltage inverter circuits may be connected to a word line selection line $WLSEL_L$.

The voltage selection circuits 25 include a plurality of voltage selection units 38 that corresponds to the word lines WL and the select gate lines SGD, SGS, and SGSb. Each voltage selection unit 38 includes a plurality of voltage select transistors 39 and a plurality of level shifters $LS_V$ connected to the gate electrodes of the plurality of voltage select transistors 39. The voltage select transistors 39 are, for example, field-effect type high voltage transistors. The drain terminals of the voltage select transistors 39 are electrically connected to the corresponding word lines WL and select gate lines SGD, SGS, and SGSb, respectively, via the wirings CG, the block selection circuit 23 (FIG. 5), and the word line selection circuit 24 (FIG. 6). The source terminals of the voltage select transistors 39 are electrically connected to the corresponding voltage supply lines 31, respectively. The gate electrodes of the voltage select transistors 39 are connected to the corresponding voltage selection lines $VSEL_H$, respectively. The voltage selection lines $VSEL_H$ are connected to the level shifters $LS_V$, respectively. Each level shifter $LS_V$ may include, for example, one or more high voltage inverter circuits. Further, at least one output terminal of the one or more high voltage inverter circuits may be connected to a voltage selection line $VSEL_H$. Further, at least one input terminal of the one or more high voltage inverter circuits may be connected to a voltage selection line $VSEL_L$. Further, the voltage selection lines $VSEL_L$ are connected to the sequencer SQC.

[Circuit Configuration of Sense Amplifier Module SAM]

Figure 10:
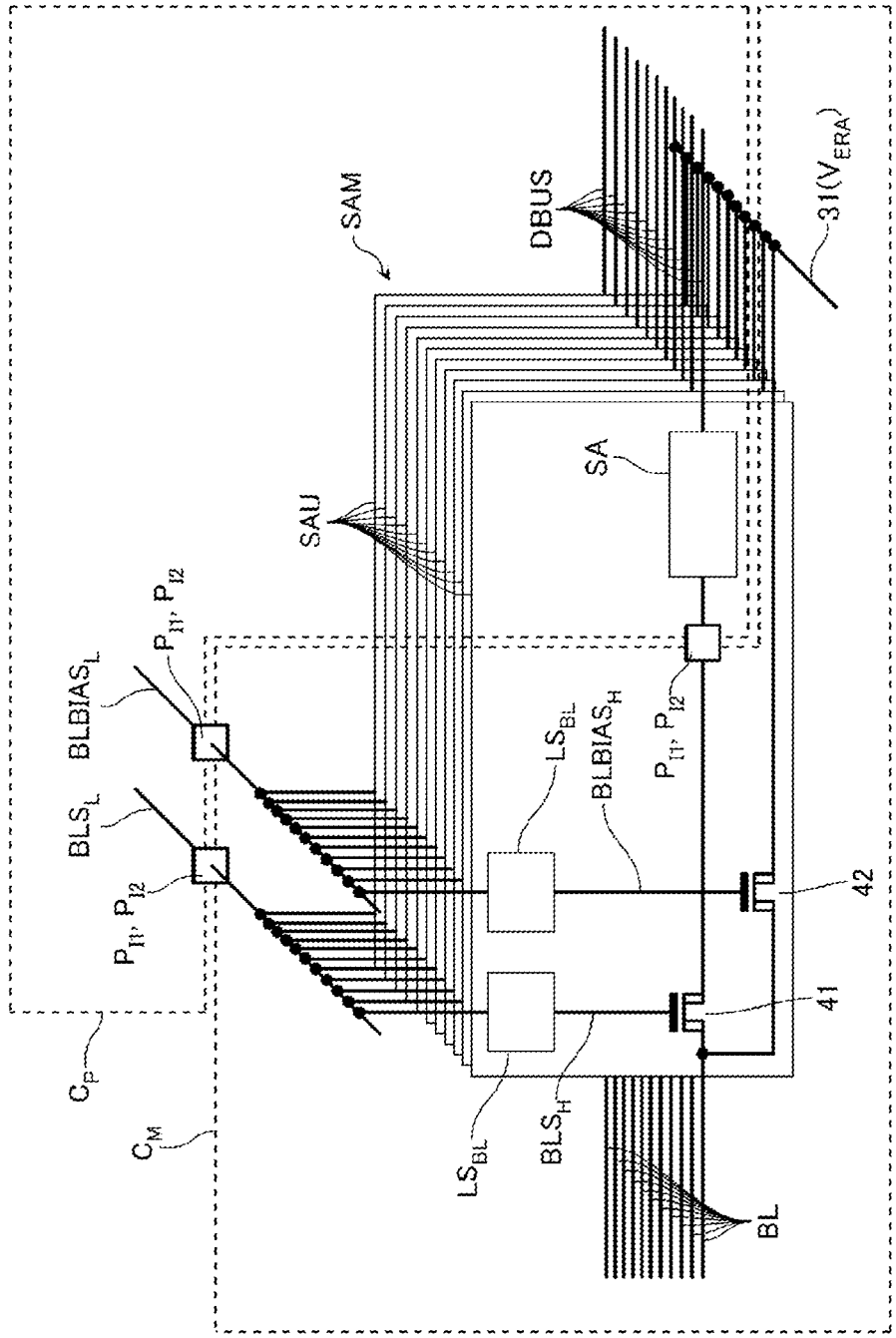
FIG. 10 is a schematic circuit diagram illustrating a portion of the configuration of the memory die of FIG. 4.

For example, as illustrated in FIG. 10, the sense amplifier module SAM (FIG. 4) includes a plurality of sense amplifier units SAU that corresponds to the plurality of bit lines BL. Each sense amplifier unit SAU includes high voltage transistors 41 and 42 connected in parallel to a bit line BL, and two level shifters $LS_{BL}$ connected to the gate electrodes of the high voltage transistors 41 and 42, respectively. Further, the sense amplifier unit SAU includes a sense amplifier SA electrically connected to the bit line BL via the high voltage transistor 41.

The high voltage transistors 41 and 42 are, for example, field-effect type high voltage transistors. The drain terminal of the high voltage transistor 41 is connected to the sense amplifier SA. The drain terminal of the high voltage transistor 42 is connected to the voltage supply line 31 to which an erase voltage $V_{ERA}$ is supplied. The source terminals of the high voltage transistors 41 and 42 are connected to the bit lines BL as described above. The gate electrodes of the high voltage transistors 41 and are connected to signal lines $BLS_H$ and $BLBIAS_H$, respectively. The signal lines $BLS_H$ and $BLBIAS_H$ are connected to the level shifters $LS_{BL}$, respectively. Each level shifter $LS_{BL}$ may include, for example, one or more high voltage inverter circuits. Further, at least one output terminal of the one or more high voltage inverter circuits may be connected to the signal line $BLS_H$ or $BLBIAS_H$. Further, at least one input terminal of the one or more high voltage inverter circuits may be connected to a signal line $BLS_L$ or $BLBIAS_L$. Further, the signal lines $BLS_L$ and $BLBIAS_L$ are connected to the sequencer SQC.

In the example of FIG. 10, the voltage supply line 31 to which the erase voltage $V_{ERA}$ is supplied and the signal lines $BLS_L$ and $BLBIAS_L$ are commonly provided for the plurality of sense amplifier units SAU.

The sense amplifier SA includes, for example, a sense transistor that discharges the charge of a data line according to the current that flows through a bit line BL, a plurality of latch circuits that latches data of the data line, and a voltage control circuit that controls the voltage or current of the bit line BL based on the data of the latch circuits. Further, each sense amplifier SA is connected to the cache memory CM (FIG. 4) via wirings DBUS.

In alternative embodiments, the level shifter $LS_{BL}$ connected to the gate electrode of the high voltage transistor 41 may be omitted. Further, the high voltage transistor 42 and the level shifter $LS_{BL}$ connected to the gate electrode of the high voltage transistor 42 may be omitted. Further, while the example of FIG. 10 shows the level shifters $LS_{BL}$ being provided in each sense amplifier unit SAU, a common level shifter $LS_{BL}$ may be provided for the plurality of sense amplifier units SAU.

[Circuit Configuration of Cache Memory CM]

The cache memory CM (FIG. 4) includes a plurality of latch circuits connected to the latch circuits in the sense amplifier module SAM via the wirings DBUS. Data DAT in the plurality of latch circuits are sequentially transferred to the sense amplifier module SAM or the input/output control circuit I/O.

Further, a decoding circuit and a switch circuit (not illustrated) are connected to the cache memory CM. The decoding circuit decodes a column address CA stored in the address register ADR (FIG. 4). The switch circuit conducts a latch circuit that corresponds to the column address CA with a bus DB (FIG. 4) according to an output signal of the decoding circuit.

[Circuit Configuration of Sequencer SQC]

The sequencer SQC (FIG. 4) outputs an internal control signal to the row decoder RD, the sense amplifier module SAM, and the voltage generation circuit VG according to command data $D_{CMD}$ stored in the command register CMR. Further, the sequencer SQC outputs status data $D_{ST}$ that appropriately indicates its own state, to the status register STR.

Further, the sequencer SQC generates a ready/busy signal, and outputs the generated ready/busy signal to a terminal RY//BY. The access to the memory die MD is basically prohibited during a period when the terminal RY//BY is in the "L" state (busy period). Further, the access to the memory die MD is permitted during a period when the terminal RY//BY is in the "H" state (ready period). Further, the terminal RY//BY is implemented by, for example, the bonding pad electrode $P_X$ described above with reference to FIGS. 2 and 3.

[Circuit Configuration of Input/Output Control Circuit I/O]

The input/output control circuit I/O includes data signal input/output terminals DQ0 to DQ7, toggle signal input/output terminals DQS and/DQS, and input circuits such as comparators and output circuits such as OCDs (off chip drivers) that are connected to the data signal input/output terminals DQ0 to DQ7. Further, the input/output circuit I/O includes shift registers and buffer circuits that are connected to the input circuits and the output circuits. The input circuits, the output circuits, the shift registers, and the buffer circuits are connected to terminals to which the power supply voltage $V_{CCQ}$ and the ground voltage $V_{SS}$ are supplied, respectively. The data signal input/output terminals DQ0 to DQ7, the toggle signal input/output terminals DQS and/DQS, and the terminals to which the power supply voltage $V_{CCQ}$ is supplied are implemented by, for example, the bonding pad electrodes $P_X$ described above with reference to FIGS. 2 and 3. Data input via the data signal input/output terminals DQ0 to DQ7 are output from the buffer circuits to the cache memory CM, the address register ADR or the command register CMR according to the internal control signal from the logic circuit CTR. Further, data output via the data signal input/output terminals DQ0 to DQ7 are input to the buffer circuits from the cache memory CM or the status register STR according to the internal control signal from the logic circuit CTR.

[Circuit Configuration of Logic Circuit CTR]

The logic circuit CTR (FIG. 4) receives external control signals from the controller die CD via external control terminals /CEn, CLE, ALE, /WE, RE, and /RE, and outputs internal control signals to the input/output control circuit I/O in response. Further, the external control terminals /CEn, CLE, ALE, /WE, RE, and /RE are implemented by, for example, the bonding pad electrodes $P_X$ described above with reference to FIGS. 2 and 3.

[Structure of Memory Die MD]

Figure 11:
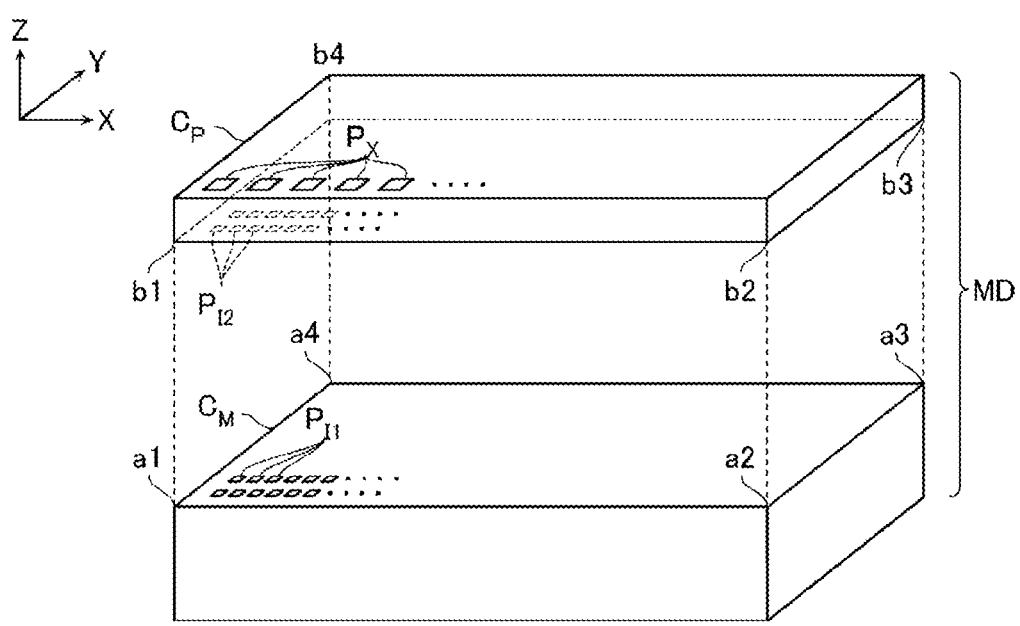
FIG. 11 is a schematic exploded perspective view of the memory die of FIG. 4.

FIG. 11 is a schematic exploded perspective view illustrating an example of the configuration of the semiconductor storage device of the present embodiment. As illustrated in FIG. 11, the memory die MD includes chips $C_M$ and $C_P$. For example, as illustrated in FIG. 4, the chip $C_M$ includes the configuration of the memory cell array MCA (FIG. 5), and the high voltage transistors in the voltage generation circuit VG, the row decoder RD, the sense amplifier module SAM and others. For example, as illustrated in FIG. 4, the chip $C_P$ includes the low voltage transistors in the row decoder RD, the sense amplifier module SAM, the sequencer SQC, the cache memory CM, the address register ADR, the command register CMR, the status register STR, the input/output control circuit I/O, the logic circuit CTR and others.

As illustrated in FIG. 11, a plurality of bonding electrodes $P_{I1}$ is provided on the upper surface of the chip $C_M$. Further, a plurality of bonding electrodes $P_{I2}$ is provided on the lower surface of the chip $C_P$. Further, the plurality of bonding pad electrodes $P_X$ are provided on the upper surface of the chip $C_P$. Hereinafter, for the chip $C_M$, the surface on which the plurality of bonding electrodes $P_{I1}$ are provided will be referred to as the front surface, and the surface opposite to the front surface will be referred to as the back surface. Further, for the chip $C_P$, the surface on which the plurality of bonding electrodes $P_{I2}$ are provided will be referred to as the front surface, and the surface opposite to the front surface (the surface on which the plurality of bonding pad electrodes $P_X$ are provided) will be referred to as the back surface. In the illustrated example, the front surface of the chip $C_M$ is provided above the back surface of the chip $C_M$, and the back surface of the chip $C_P$ is provided above the front surface of the chip $C_P$.

The chips $C_M$ and $C_P$ are arranged such that the front surfaces of the chips $C_M$ and $C_P$ face each other. The plurality of bonding electrodes $P_{I1}$ are provided to correspond to the plurality of bonding electrodes $P_{I2}$, respectively, at positions where the plurality of bonding electrodes $P_{I1}$ are bondable to the plurality of bonding electrodes $P_{I2}$. The bonding electrodes $P_{I1}$ and $P_{I2}$ function as bonding electrodes for bonding the chips $C_M$ and $C_P$ to each other, and electrically conducting the chips $C_M$ and $C_P$ with each other.

In the example of FIG. 11, corners a1, a2, a3, and a4 of the chip $C_M$ correspond to corners b1, b2, b3, and b4 of the chip $C_P$, respectively.

Figure 12:
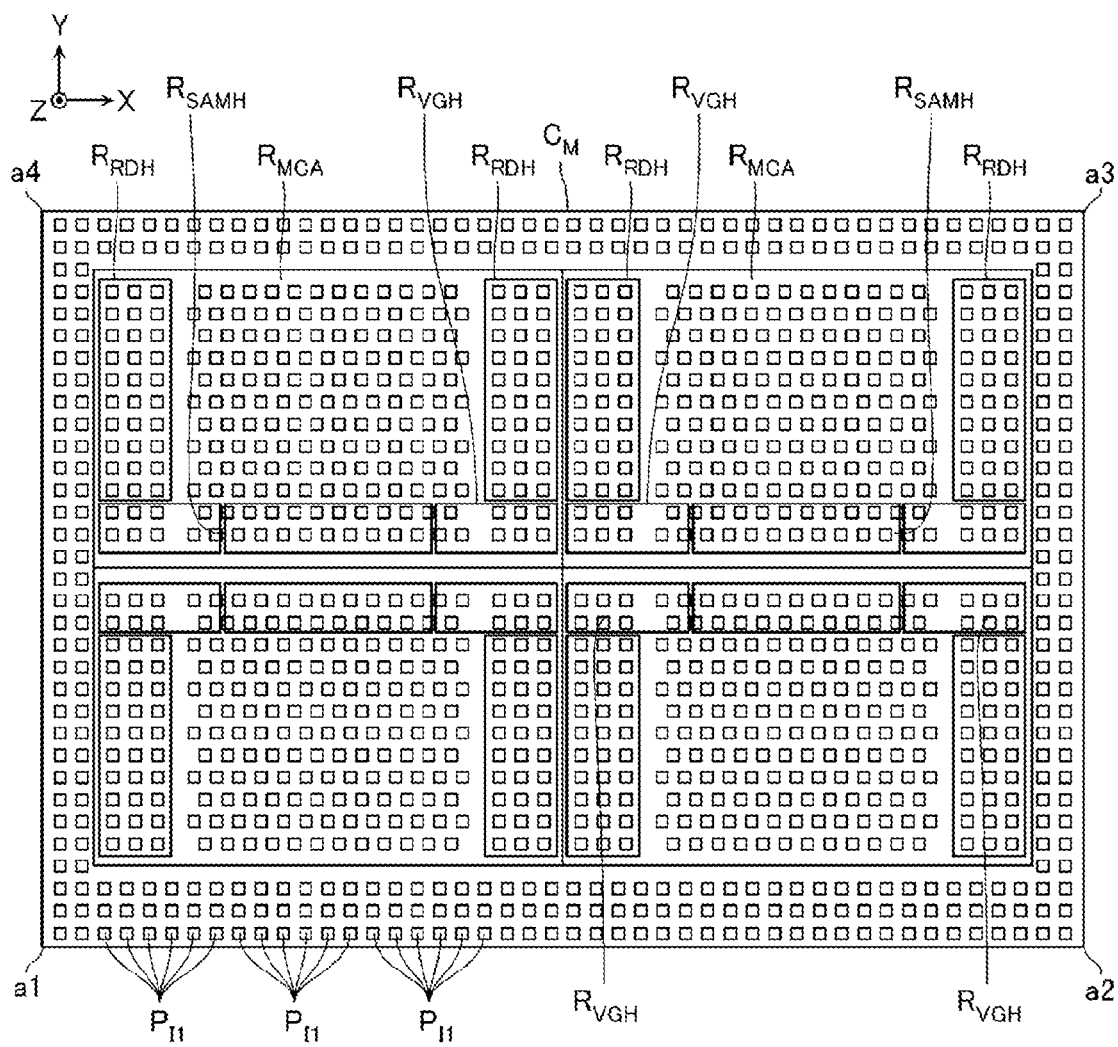
FIG. 12 is a schematic plan view illustrating an example of a configuration of a chip.
Figure 13:
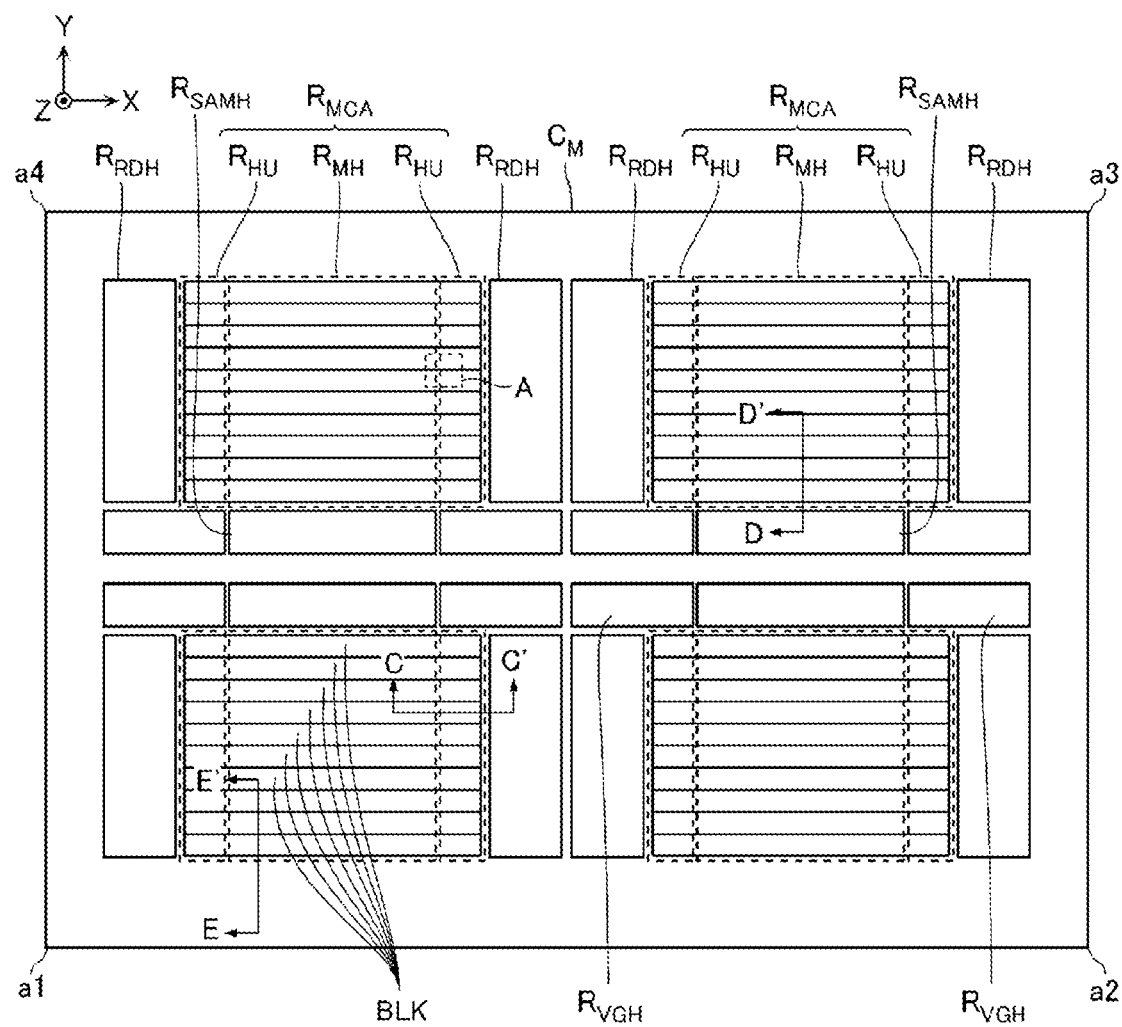
FIG. 13 is a schematic plan view illustrating an internal structure of the chip of FIG. 12.
Figure 14:
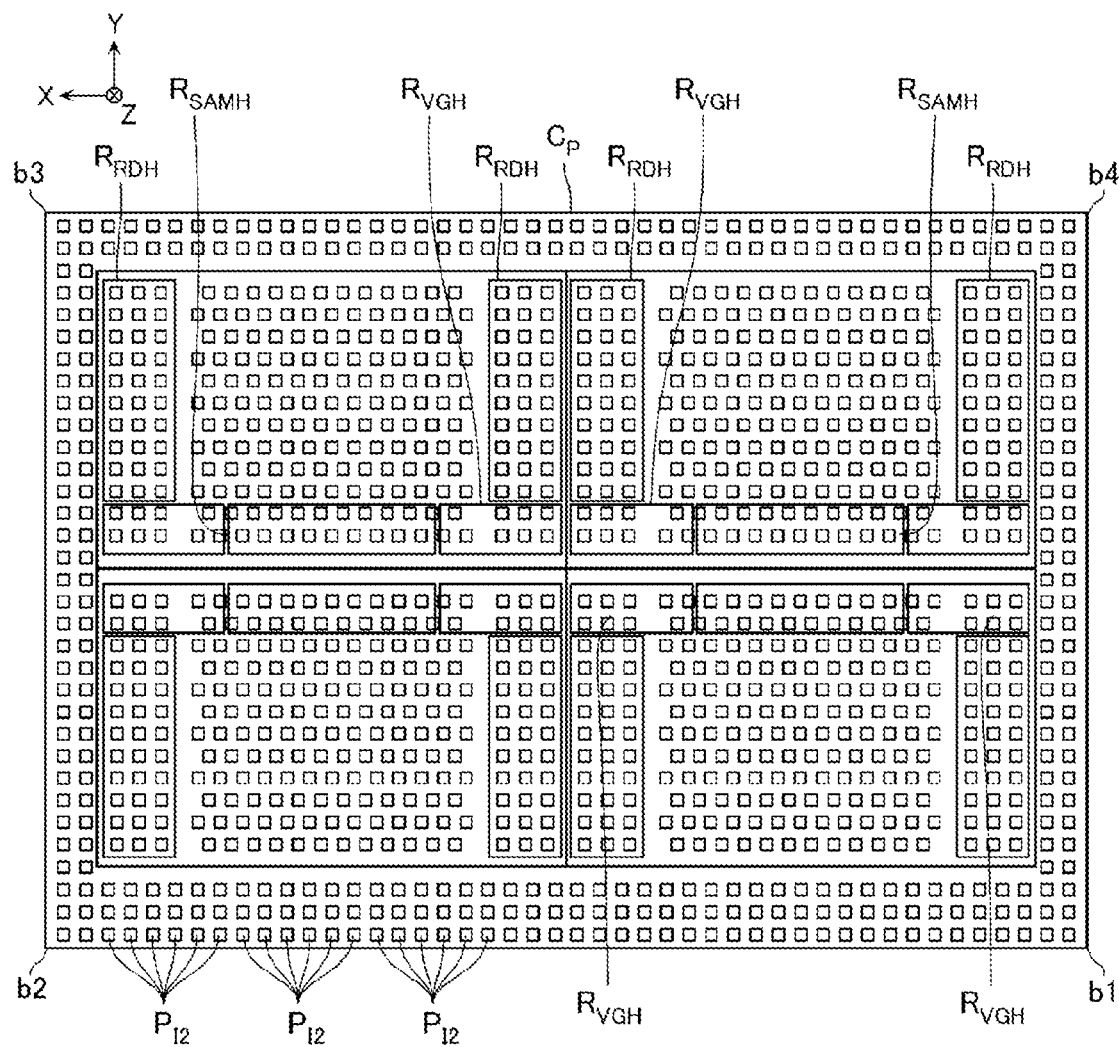
FIG. 14 is a schematic bottom view illustrating an example of a configuration of a chip.
Figure 15:
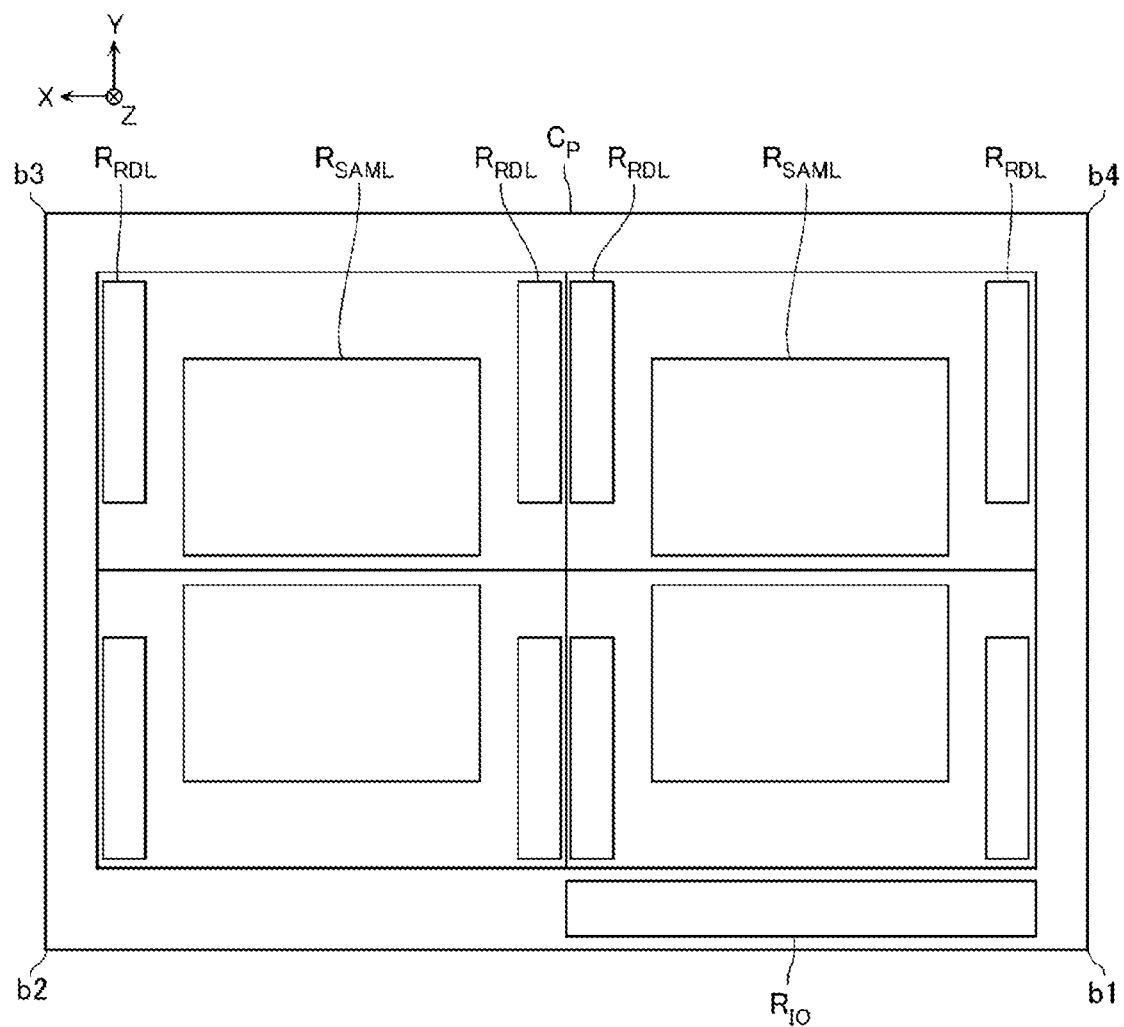
FIG. 15 is a schematic bottom view illustrating an internal structure of the chip of FIG. 14.
Figure 16:
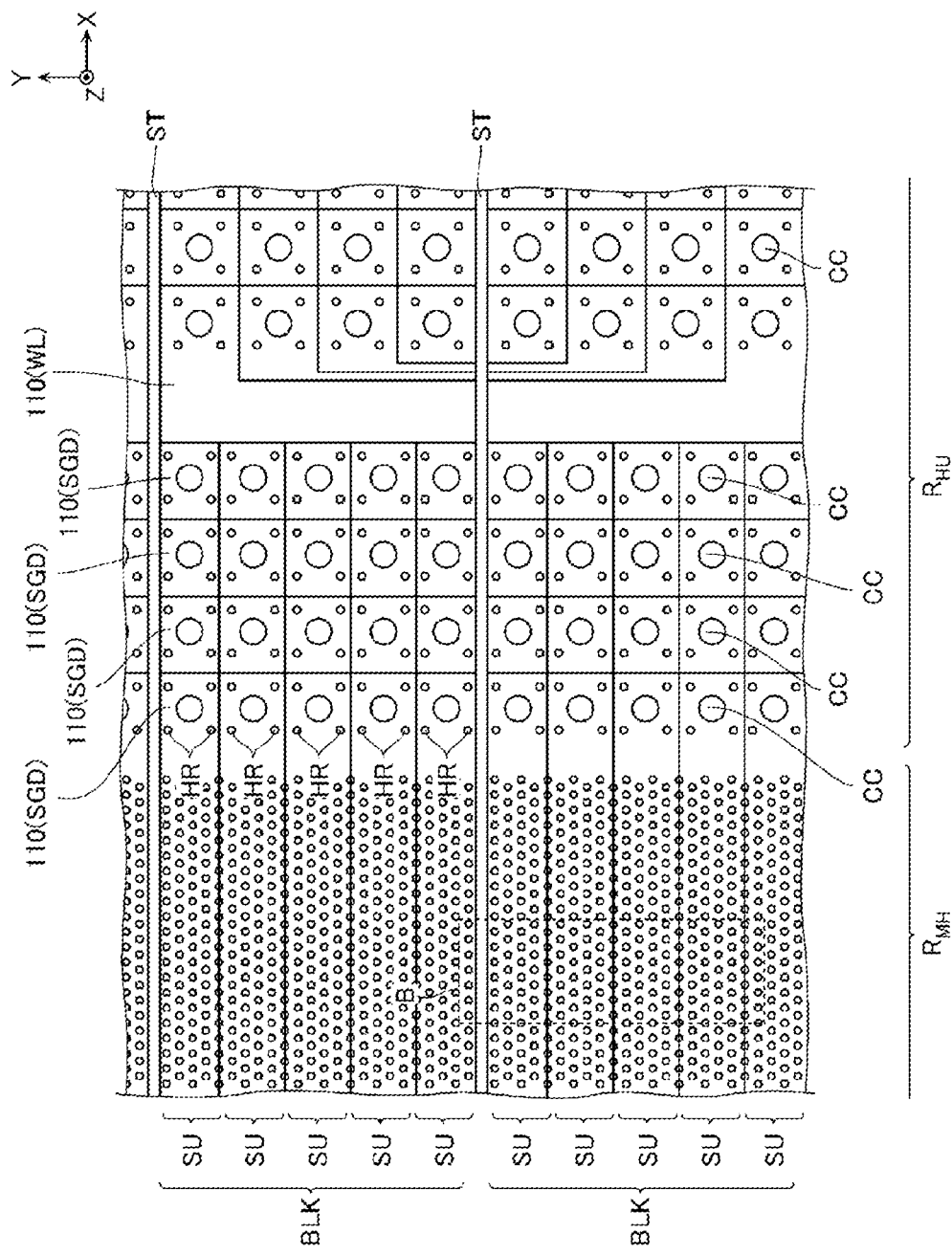
FIG. 16 is a schematic enlarged view of a portion indicated by a symbol "A" in FIG. 13.
Figure 17:
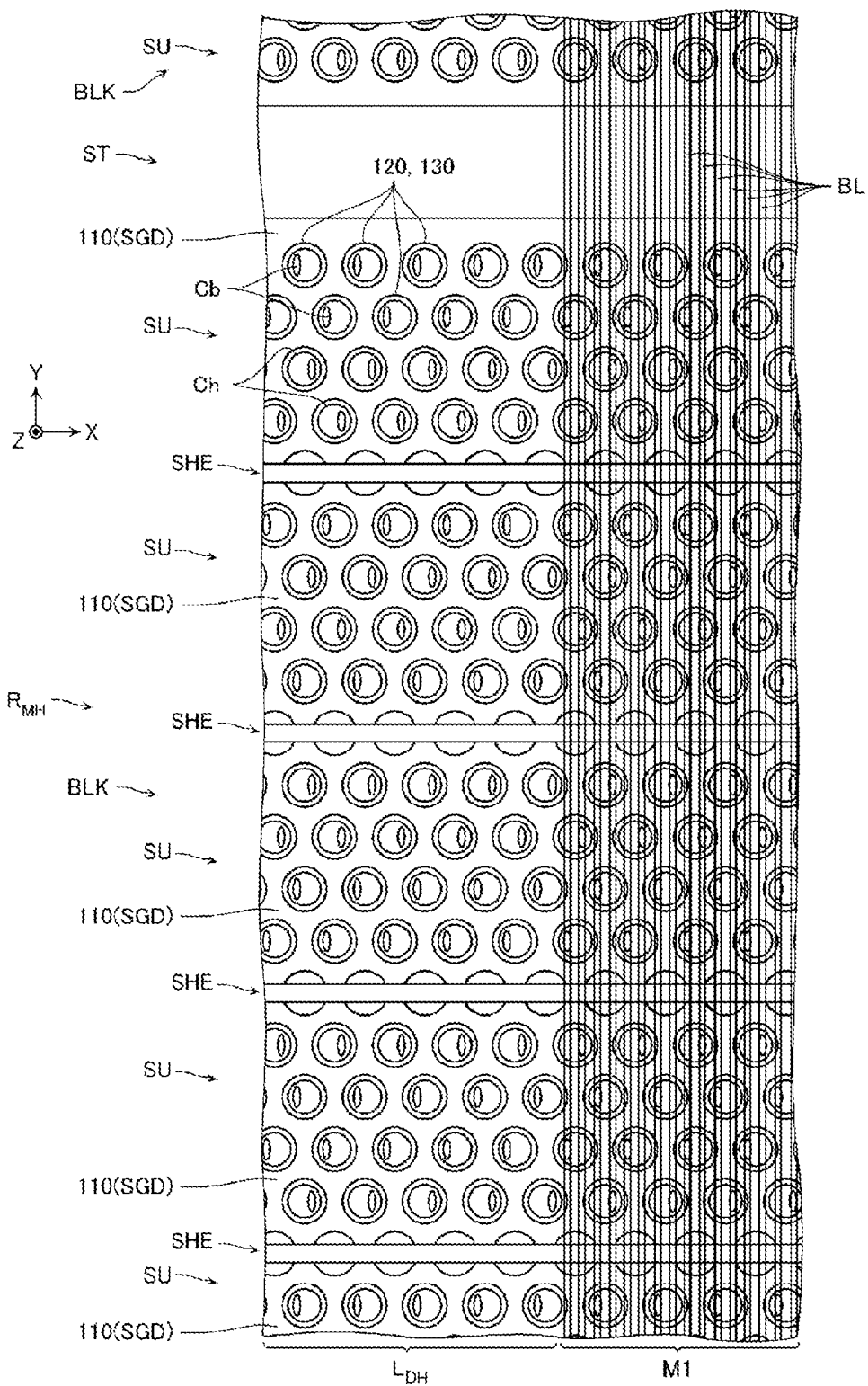
FIG. 17 is a schematic enlarged view of a portion indicated by a symbol "B" in FIG. 16.
Figure 18:
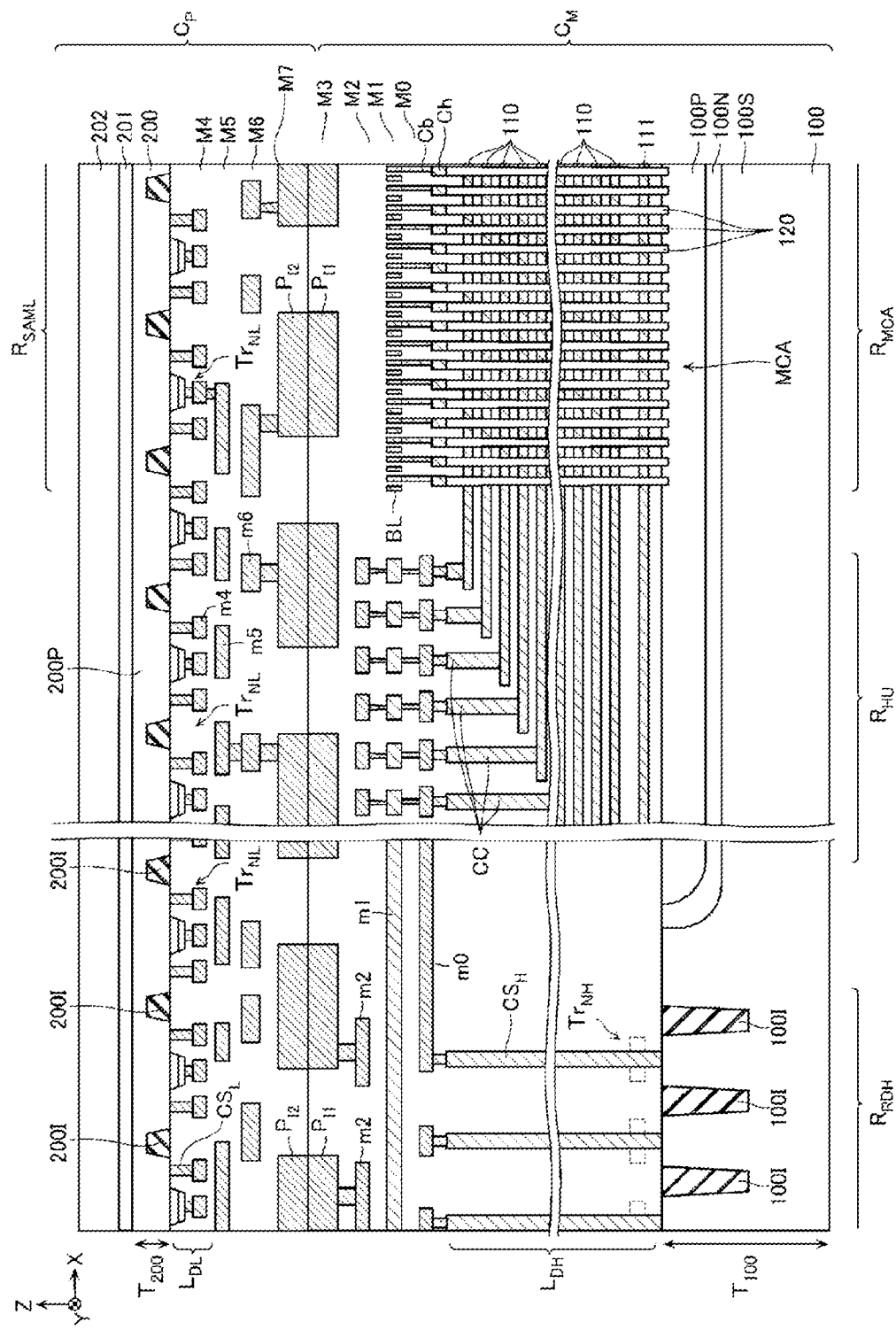
FIG. 18 is a schematic cross-sectional view of the structure illustrated in FIG. 13 which is taken by cutting the structure along line C-C', when viewed along the arrow direction of the line.
Figure 19:
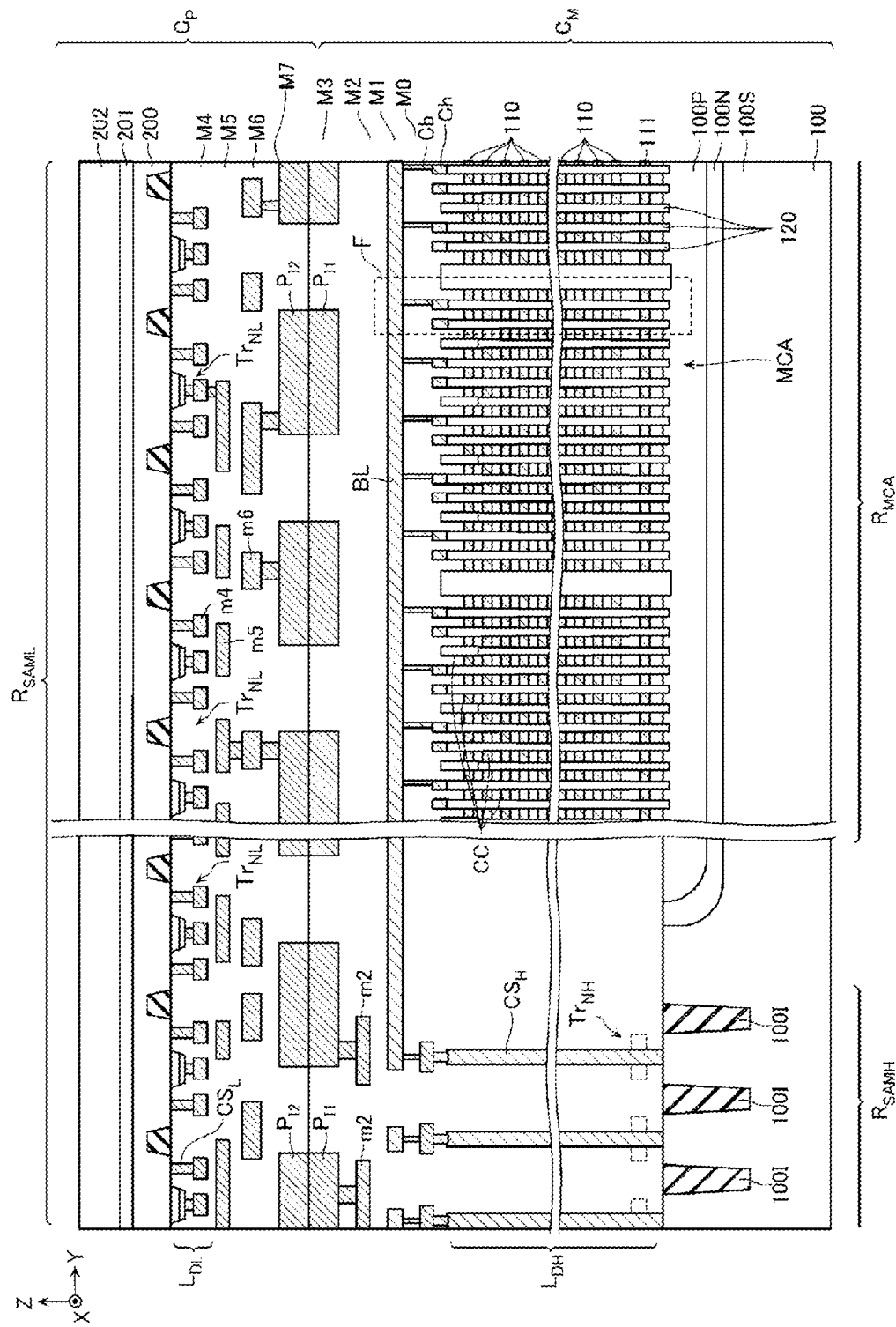
FIG. 19 is a schematic cross-sectional view of the structure illustrated in FIG. 13 which is taken by cutting structure along a line D-D', when viewed along the arrow direction of the line.
Figure 20:
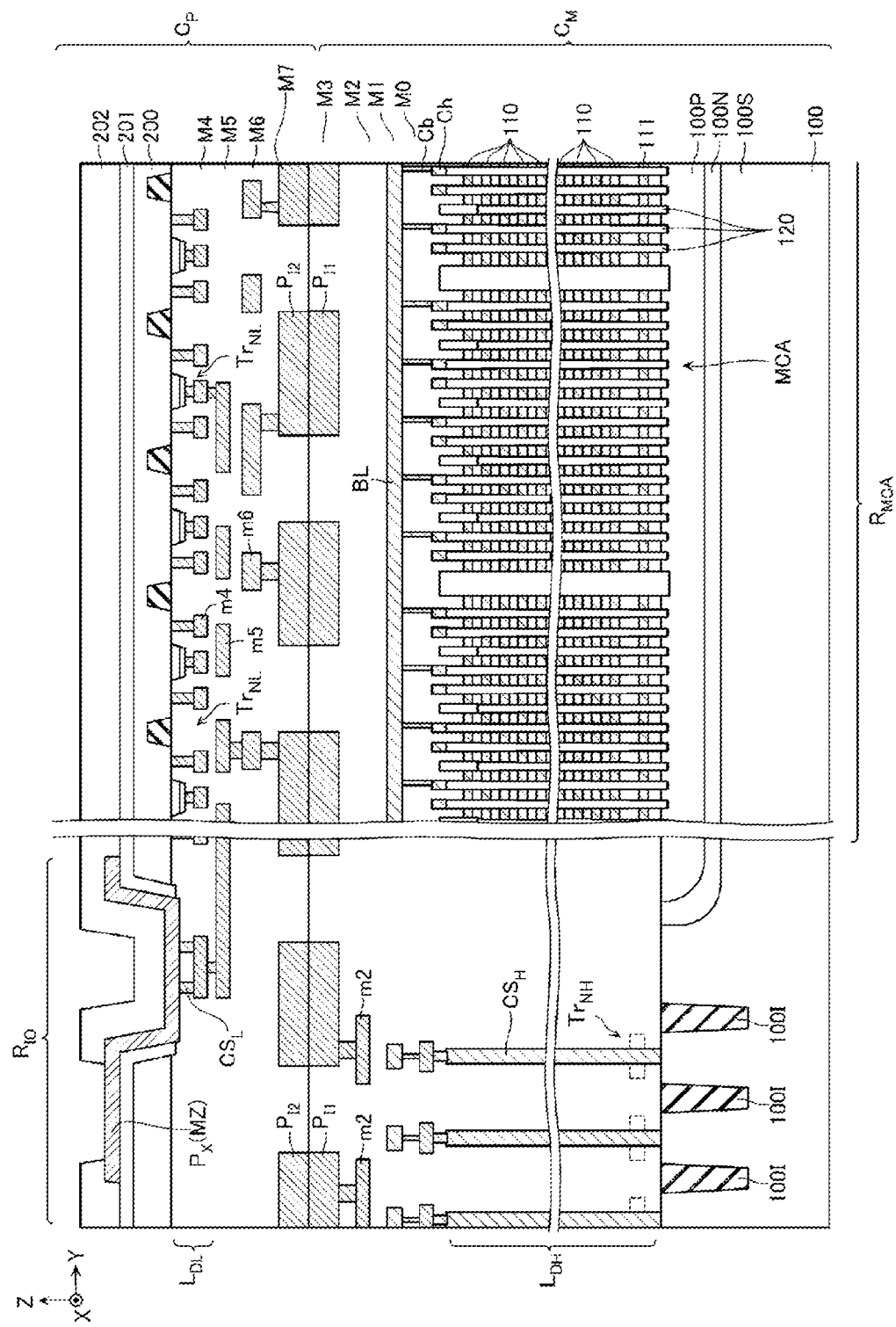
FIG. 20 is a schematic cross-sectional view of the structure illustrated in FIG. 13 which is taken by cutting the structure along a line E-E', when viewed along the arrow direction of the line.
Figure 21:
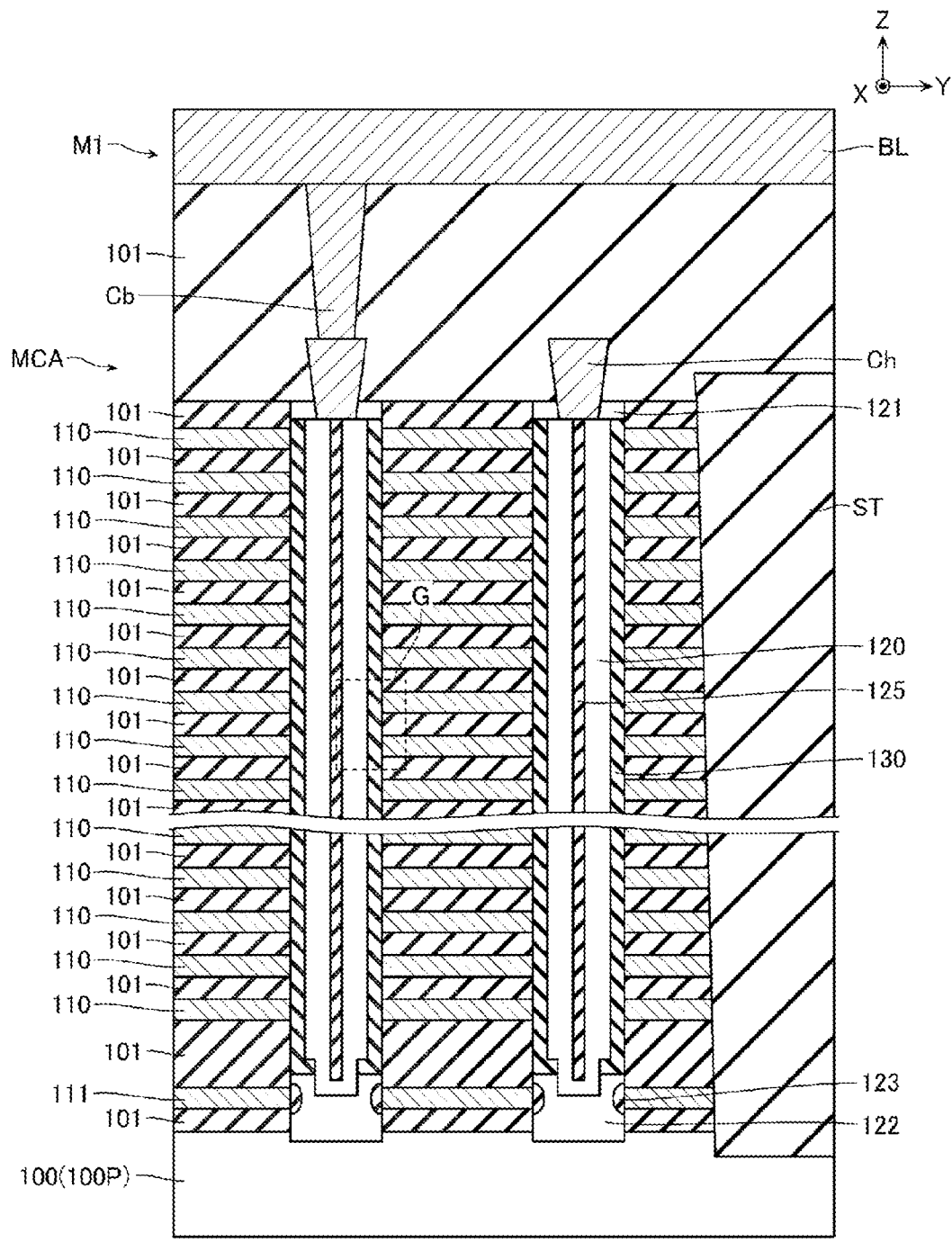
FIG. 21 is a schematic enlarged view of a portion indicated by a symbol "P" in FIG. 19.
Figure 22:
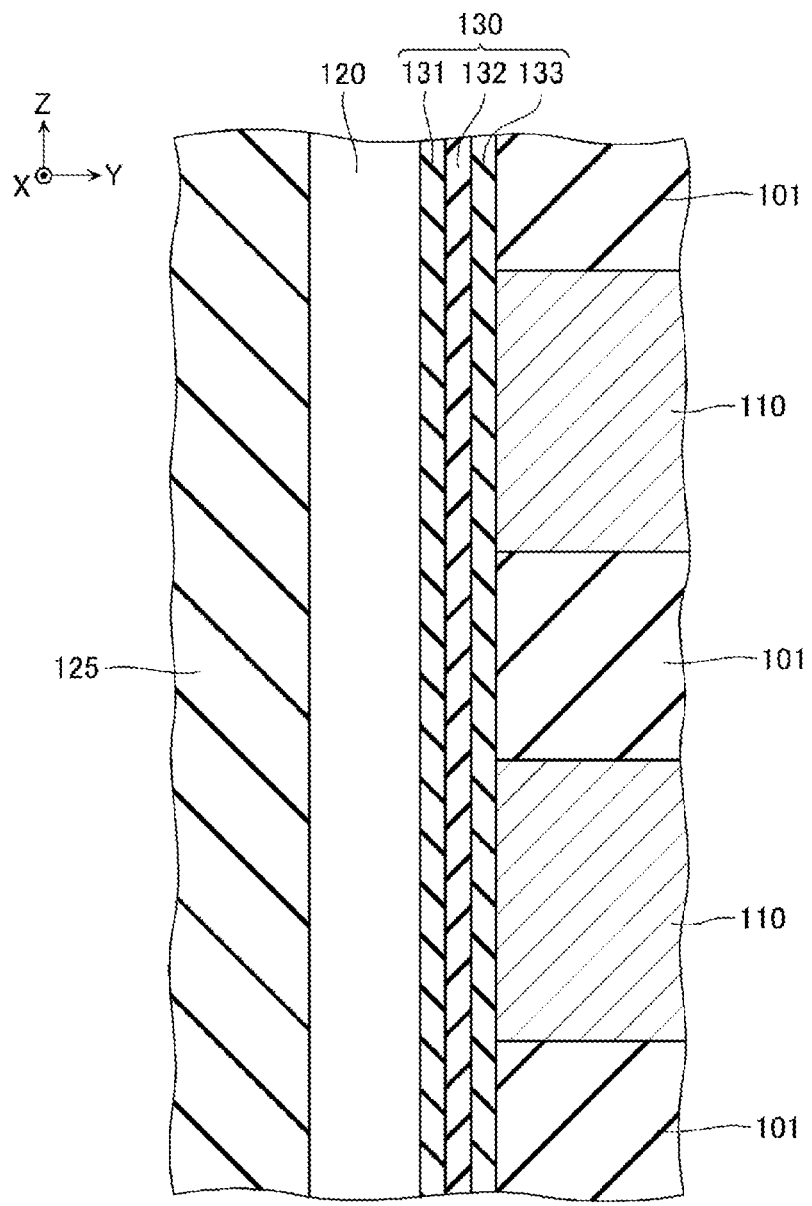
FIG. 22 is a schematic enlarged view of a portion indicated by a symbol "G" in FIG. 21.
Figure 23:
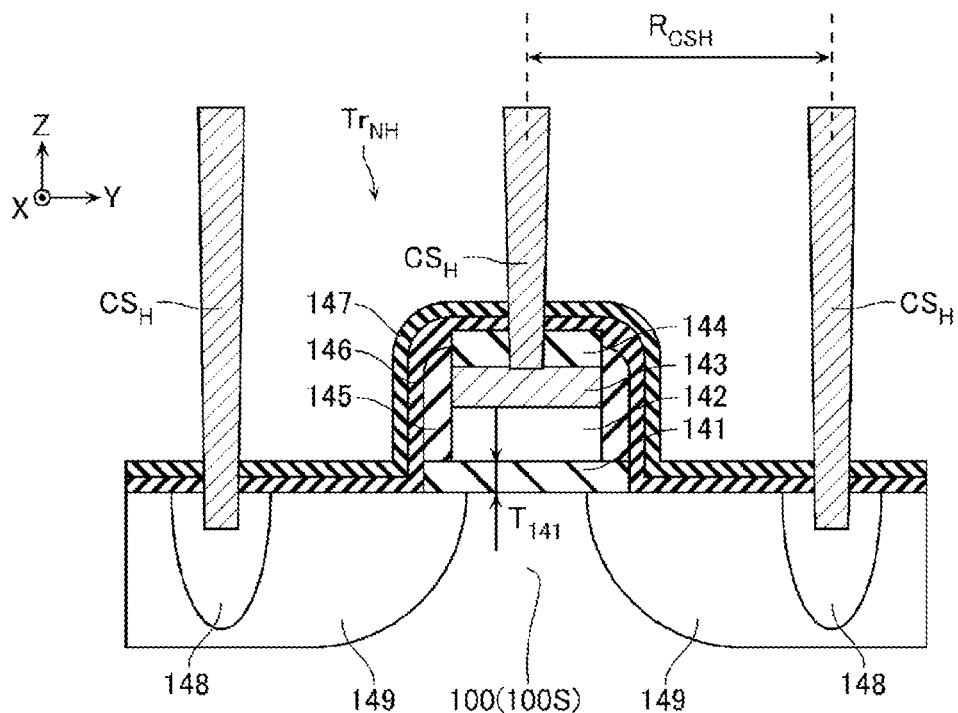
FIG. 23 is a schematic cross-sectional view illustrating a structure of a portion of a chip.
Figure 26:
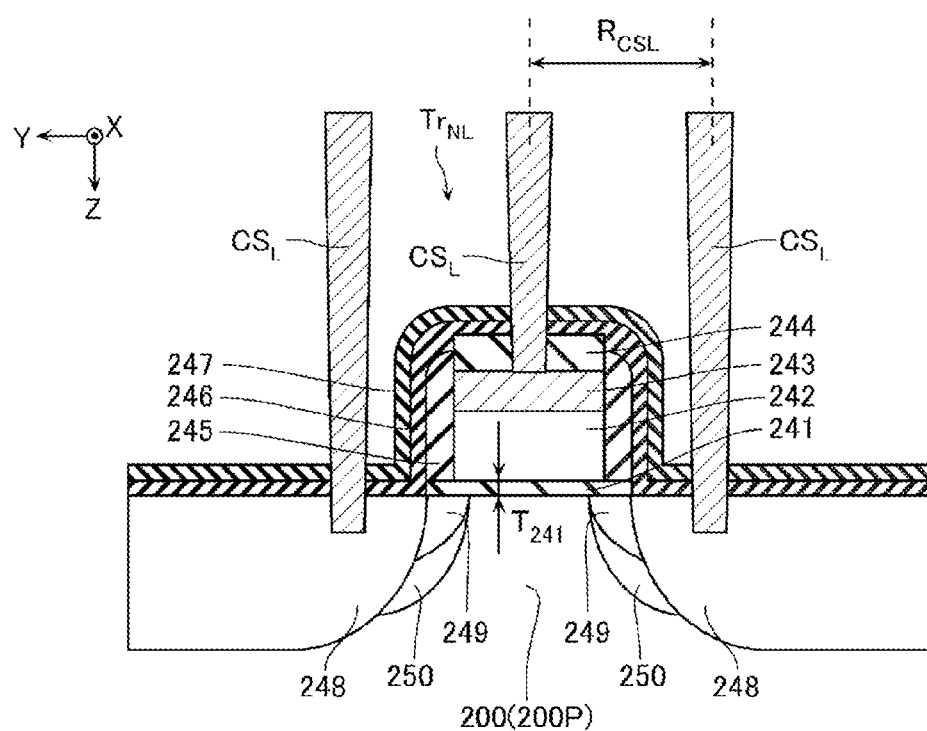
FIG. 26 is a schematic cross-sectional view illustrating a structure of a portion of a chip.
Figure 27:
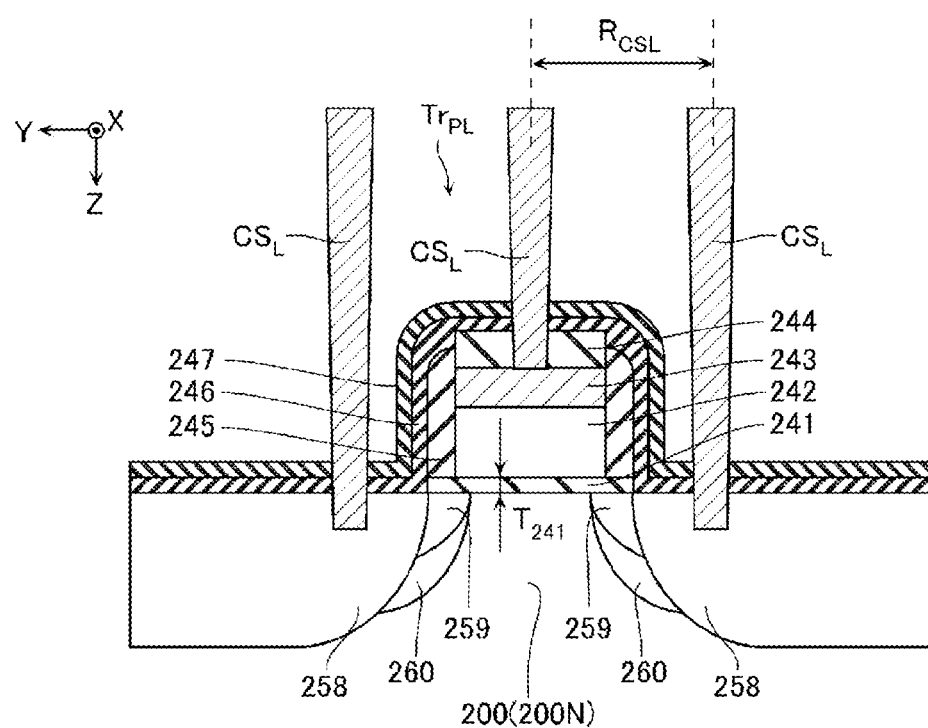
FIG. 27 is a schematic cross-sectional view illustrating a structure of a portion of a chip.

FIG. 12 is a schematic plan view illustrating an example of the configuration of the chip $C_M$. FIG. 13 illustrates the internal structure of the chip $C_M$ when viewed through the front surface of the chip $C_M$ on which the plurality of bonding electrodes $P_{I1}$ are provided. FIG. 14 is a schematic bottom view illustrating an example of the configuration of the chip $C_P$. FIG. 15 illustrates the internal structure of the chip $C_P$ when viewed through the front surface of the chip $C_P$ on which the plurality of bonding electrodes $P_{I2}$ are provided. FIG. 16 is a schematic enlarged view of a portion indicated by a symbol "A" in FIG. 13. FIG. 17 is a schematic enlarged view of a portion indicated by a symbol "B" in FIG. 16. FIG. 18 is a schematic cross-sectional view of the structure illustrated in FIG. 13 which is taken by cutting the structure along line C-C', when viewed along the arrow direction of the line. FIG. 19 is a schematic cross-sectional view of the structure illustrated in FIG. 13 which is taken by cutting the structure along line D-D', when viewed along the arrow direction of the line. FIG. 20 is a schematic cross-sectional view of the structure illustrated in FIG. 13 which is taken by cutting the structure along line E-E', when viewed along the arrow direction of the line. FIG. 21 is a schematic enlarged view of a portion indicated by a symbol "F" in FIG. 19. FIG. 22 is a schematic enlarged view of a portion indicated by a symbol "G" in FIG. 21. FIG. 23 and are schematic cross-sectional views illustrating a structure of a portion of the chip $C_M$. FIGS. 26 and 27 are schematic cross-sectional views illustrating a structure of a portion of the chip $C_P$.

[Structure of Chip $C_M$]

For example, as illustrated in FIGS. 12 and 13, in the chip $C_M$, four memory cell array regions $R_{MCA}$ are arranged in the X direction and the Y direction. Further, row decoder regions $R_{RDH}$ are formed at the positions aligned with each memory cell array region $R_{MCA}$ in the X direction, respectively. Further, sense amplifier module regions $R_{SAMH}$ are formed at positions aligned with each memory cell array region $R_{MCA}$ in the Y direction, respectively. Further, voltage generation circuit regions $R_{VGH}$ are formed at positions aligned with each row decoder region $R_{RDH}$ in the Y direction and aligned with each sense amplifier module region $R_{SAMH}$ in the X direction.

The memory cell array region $R_{MCA}$ includes the configuration of the memory cell array MCA (FIG. 5). For example, in the example of FIG. 13, the memory cell array MCA includes the plurality of memory blocks BLK arranged in the Y direction. Further, the memory cell array region $R_{MCA}$ includes a memory hole region $R_{MH}$ and hookup regions $R_{HU}$ each formed between the memory hole region $R_{MH}$ and the row decoder region $R_{RDH}$. The row decoder region $R_{RDH}$ is provided with the block select transistors 35 (FIG. 5) and the high voltage transistors in the level shifters $LS_{BLK}$ (FIG. 5). The sense amplifier module region $R_{SAMH}$ is provided with the high voltage transistors 41 and 42 (FIG. 10) and the high voltage transistors in the level shifters $LS_{BL}$ (FIG. 10). The voltage generation circuit region $R_{VGH}$ is provided with the word line select transistors 37 (FIG. 6) and the high voltage transistors in the level shifters $LS_{WL}$ (FIG. 6), the voltage select transistors 39 (FIG. 6) and the high voltage transistors in the level shifters $LS_V$ (FIG. 6), and the high voltage transistors 32a2a and 32a2b (FIG. 7) and the high voltage transistors in the level shifters 32a5a and 32a5b (FIG. 8).

For example, as illustrated in FIGS. 18 to 20, the chip $C_M$ includes the semiconductor substrate 100, a device layer $L_{BH}$ formed above the semiconductor substrate 100, and a plurality of wiring layers M0, M1, M2, and M3 formed above the device layer $L_{DH}$.

[Structure of Semiconductor Substrate 100]

The semiconductor substrate 100 is made of, for example, P-type silicon (Si) containing P-type impurities such as boron (B). For example, as illustrated in FIGS. 18 to 20, the surface of the semiconductor substrate 100 is provided with an N-type well region 100N that contains N-type impurities such as, for example, phosphorus (P), a P-type well region 100P that contains P-type impurities such as boron (B), a semiconductor substrate region 100S where the N-type well region 100N and the P-type well region 100P are not formed, and insulating regions 1001.

[Structure of Device Layer $L_{DH}$ in Memory Hole Region $R_{MH}$]

As described above with reference to FIG. 13, the plurality of memory blocks BLK are arranged in the Y direction, in the memory hole region $R_{MH}$. For example, as illustrated in FIG. 16, an inter-block insulating layer ST such as silicon oxide ($SiO_2$) is formed between two memory blocks BLK arranged in the Y direction. Further, each memory block BLK includes the plurality of string units SU arranged in the Y direction. For example, as illustrated in FIG. 17, an inter-string unit insulating layer SHE is formed between two string units SU arranged in the Y direction.

For example, as illustrated in FIG. 21, each string unit SU includes a plurality of conductive layers 110 arranged in the Z direction, a plurality of semiconductor columns 120 that extends in the Z direction, and a plurality of gate insulating films 130 formed between the plurality of conductive layers 110 and the plurality of semiconductor columns 120.

Each conductive layer 110 is a substantially plate-shaped conductive layer that extends in the X direction. The conductive layer 110 may include, for example, a stacked film of a barrier conductive film such as titanium nitride (TiN) and a metal film such as tungsten (W). Further, the conductive layer 110 may contain, for example, polycrystalline silicon containing impurities such as phosphorus (P) or boron (B). An insulating layer 101 such as silicon oxide ($SiO_2$) is formed between the plurality of conductive layers 110 arranged in the Z direction.

A conductive layer 111 is formed below the conductive layers 110. The conductive layer 111 may include, for example, a stacked film of a barrier conductive film such as titanium nitride (TiN) and a metal film such as tungsten (W). Further, an insulating layer 101 such as silicon oxide ($SiO_2$) is formed between the conductive layer 111 and the conductive layers 110.

The conductive layer 111 functions as the source-side select gate line SGSb (FIG. 5) and the gate electrodes of the plurality of source-side select transistors STSb connected to the source-side select gate line SGSb. The conductive layer 111 is electrically independent for each memory block BLK.

Further, among the plurality of conductive layers 110, one or more conductive layers 110 positioned at the lowest or relatively lower layers function as the source-side select gate line SGS (FIG. 5) and the gate electrodes of the plurality of source-side select transistors STS connected to the source-side select gate line SGS. The plurality of conductive layers 110 are electrically independent for each memory block BLK.

Further, the plurality of conductive layers 110 positioned at relatively higher layers function as the word lines WL (FIG. 5) and the gate electrodes of the plurality of memory cells MC (FIG. 5) connected to the word lines WL. The plurality of conductive layers 110 are each electrically independent for each memory block BLK.

Further, one or more conductive layers 110 positioned at relatively further higher layers function as the drain-side select gate line SGD and the gate electrodes of the plurality of drain-side select transistors STD (FIG. 5) connected to the drain-side select gate line SGD. These plurality of conductive layers 110, hereinafter referred to as drain-side conductive layers, have the narrower width in the Y direction than that of the other conductive layers 110. Further, for example, as illustrated in FIG. 17, the inter-string unit insulating layer SHE is formed between two drain-side conductive layers adjacent to each other in the Y direction. The drain-side conductive layers conductive layers are electrically independent for each string unit SU.

For example, as illustrated in FIG. 17, the semiconductor columns 120 are arranged in a predetermined pattern in the X direction and the Y direction. The semiconductor columns 120 function as channel regions of the plurality of memory cells MC and the select transistors STD, STS, and STSb which are provided in one memory string MS (FIG. 5). Each semiconductor column 120 is, for example, a semiconductor layer such as polycrystalline silicon (Si). For example, as illustrated in FIG. 21, the semiconductor column 120 has a substantially cylindrical shape, and an insulating layer 125 such as silicon oxide is formed at the center of the semiconductor column 120. Further, the outer peripheral surface of the semiconductor column 120 is surrounded by the conductive layers 110, and faces the conductive layers 110.

An impurity region 121 containing N-type impurities such as phosphorus (P) is formed at the upper end of the semiconductor column 120. The impurity region 121 is connected to a bit line BL via contacts Ch and Cb.

The lower end of the semiconductor column 120 is connected to the P-type well region 100P of the semiconductor substrate 100 via a semiconductor layer 122 made of single crystal silicon (Si) or the like. The semiconductor layer 122 functions as a channel region of the source-side select transistor STSb. The outer peripheral surface of the semiconductor layer 122 is surrounded by the conductive layer 111, and faces the conductive layer 111. An insulating layer 123 such as silicon oxide is formed between the semiconductor layer 122 and the conductive layer 111.

The gate insulating film 130 has a substantially cylindrical shape that covers the outer peripheral surface of the semiconductor column 120.

For example, as illustrated in FIG. 22, the gate insulating film 130 includes a tunnel insulating film 131, a charge storage film 132, and a block insulating film 133 which are stacked between the semiconductor column 120 and the conductive layers 110. The tunnel insulating film 131 and the block insulating film 133 are, for example, insulating films such as silicon oxide ($SiO_2$). The charge storage film 132 is capable of storing charges such as, for example, silicon nitride ($Si_3N_4$). The tunnel insulating film 131, the charge storage film 132, and the block insulating film 133 each have a substantially cylindrical shape, and extend in the Z direction along the outer peripheral surface of the semiconductor column 120.

Further, FIG. 22 represents an example where the gate insulating film 130 includes the charge storage film 132 such as silicon nitride. However, the gate insulating film 130 may include, for example, a floating gate such as polycrystalline silicon containing N-type or P-type impurities.

[Structure of Device Layer $L_{DH}$ in Hookup Region $R_{HU}$]

As illustrated in FIG. 18, the ends of the plurality of conductive layers 110 in the X direction are formed in the hookup region $R_{HU}$. Further, as illustrated in FIG. 16, a plurality of contacts CC is arranged in the X direction and the Y direction in the hookup region $R_{HU}$. As illustrated in FIG. 18, the plurality of contacts CC extend in the Z direction, and are connected to the conductive layers 110 at the lower ends thereof. Each contact CC may include, for example, a stacked film of a barrier conductive film such as titanium nitride (TiN) and a metal film such as tungsten (W).

Further, as illustrated in FIG. 16, support structures HR are provided in the vicinity of each contact CC in the hookup region $R_{HU}$. Each support structure HR may include, for example, the structure similar to that of the semiconductor column 120 and the gate insulating film 130, or may include an insulating layer such as silicon oxide ($SiO_2$) that extends in the Z direction.

[Structure of Device Layer $L_{DH}$ in Row Decoder Region $R_{RDH}$, Sense Amplifier Module Region $R_{SAMH}$, and Voltage Generation Circuit Region $R_{VGH}$]

A plurality of N-type high voltage transistors $Tr_{NH}$ and a plurality of P-type high voltage transistors $Tr_{PH}$ are provided in the row decoder region $R_{RDH}$, the sense amplifier module region $R_{SAMH}$, and the voltage generation circuit region $R_{VGH}$ of the device layer $L_{DH}$. Further, for example, a voltage higher than 5V, 5V and a voltage lower than 5V may be supplied to the high voltage transistors $Tr_{NH}$ and $Tr_{PH}$.

For example, as illustrated in FIG. 23, the N-type high voltage transistors $Tr_{NH}$ are provided in the semiconductor substrate region 100S of the semiconductor substrate 100. Each high voltage transistor $Tr_{NH}$ includes a gate insulating layer 141 such as silicon oxide ($SiO_2$) formed on a portion of the semiconductor substrate region 100S and the front surface of the semiconductor substrate 100, a gate electrode member 142 such as polycrystalline silicon (Si) formed on the upper surface of the gate insulating layer 141, a gate electrode member 143 such as tungsten (W) formed on the upper surface of the gate electrode member 142, a cap insulating layer 144 such as silicon oxide ($SiO_2$) or silicon nitride ($Si_3N_4$) formed on the upper surface of the gate electrode member 143, and a side wall insulating layer 145 such as silicon oxide ($SiO_2$) or silicon nitride ($Si_3N_4$) formed on the side surfaces of the gate electrode members 142 and 143 and the cap insulating layer 144 in the X or Y direction. Further, the gate electrode member 142 contains, for example, N-type impurities such as phosphorus (P) or arsenic (As), or P-type impurities such as boron (B).

In the illustrated example, the thickness $T_{141}$ coincides with the thickness of the gate insulating layer 141 in the Z direction.

Further, the N-type high voltage transistor $Tr_{NH}$ includes a liner insulating layer 146 such as silicon oxide ($SiO_2$) and a liner insulating layer 147 such as silicon nitride ($Si_3N_4$) that are stacked on the surface of the semiconductor substrate 100, the side surface of the gate insulating layer 141 in the X or Y direction, the side surface of the side wall insulating layer 145 in the X or Y direction, and the upper surface of the cap insulating layer 144.

Further, three contacts $CS_H$ that extend in the Z direction are connected to the N-type high voltage transistor $Tr_{NH}$. Each contact $CS_H$ may include, for example, a stacked film of a barrier conductive film such as titanium nitride (TiN) and a metal film such as tungsten (W). One of the three contacts $CS_H$ penetrates the liner insulating layer 147, the liner insulating layer 146, and the cap insulating layer 144 to be connected to the upper surface of the gate electrode member 143, and functions as a portion of the gate electrode of the high voltage transistor $Tr_{NH}$. Two of the three contacts $CS_H$ penetrate the liner insulating layer 147 and the liner insulating layer 146 to be connected to the surface of the semiconductor substrate 100, and function as the source electrode and the drain electrode of the high voltage transistor $Tr_{NH}$.

In the illustrated example, the distance $R_{CSH}$ coincides with the distance from the central axis of the contact $CS_H$ that functions as a portion of the gate electrode to the central axis of the contact $CS_H$ that functions as a portion of the drain electrode, in the X or Y direction. Further, the distance $R_{CSH}$ coincides with the distance from the central axis of the contact $CS_H$ that functions as a portion of the gate electrode to the central axis of the contact $CS_H$ that functions as a portion of the source electrode, in the X or Y direction.

Further, the N-type high voltage transistor $Tr_{NH}$ has a channel region on a portion of the surface of the semiconductor substrate 100 that faces the gate electrode member 142. Further, a high impurity concentration region 148 is formed at the portion of the surface of the semiconductor substrate 100 that is connected to each contact $CS_H$. Further, a low impurity concentration region 149 is formed in the region of the surface of the semiconductor substrate 100 between the channel region and the high impurity concentration region 148 (the region that does not face the gate electrode member 142). The high impurity concentration region 148 and the low impurity concentration region 149 contain N-type impurities such as phosphorus (P) or arsenic (As). Further, the impurity concentration of the N-type impurities in the high impurity concentration region 148 is higher than the impurity concentration of the N-type impurities in the low impurity concentration region 149.

Figure 24:
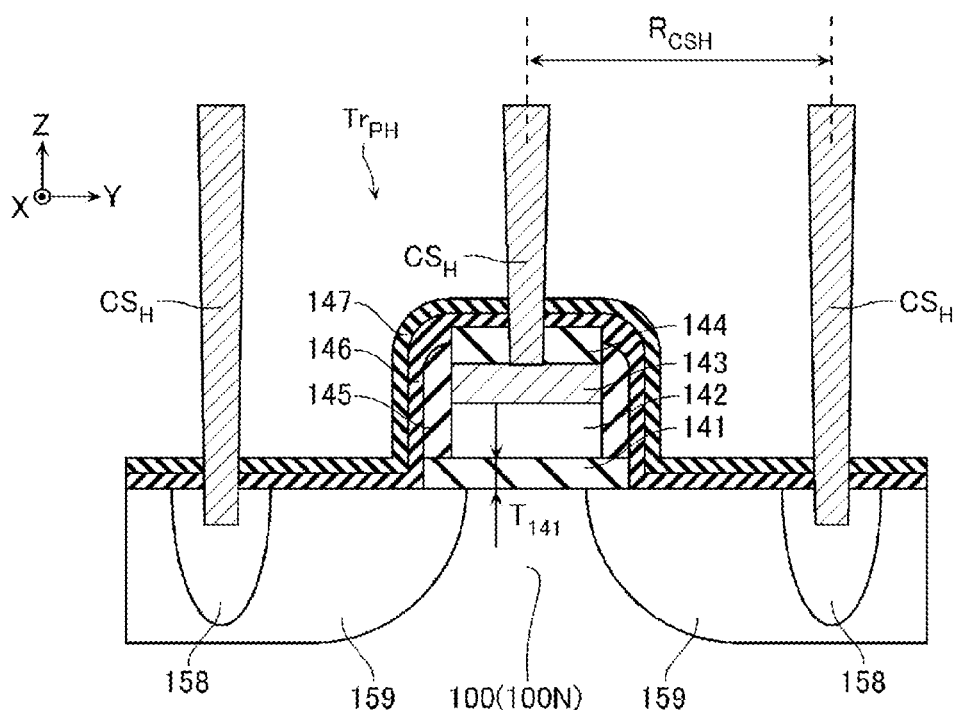
FIG. 24 is a schematic cross-sectional view illustrating a structure of a portion of a chip.

For example, as illustrated in FIG. 24, the P-type high voltage transistor $Tr_{PH}$ is basically similar in configuration to the N-type high voltage transistor $Tr_{NH}$. However, the P-type high voltage transistor $Tr_{PH}$ is provided in the N-type well region 100N, and not in the semiconductor substrate region 100S. Further, instead of the high impurity concentration region 148, a high impurity concentration region 158 is formed at the portion of the surface of the semiconductor substrate 100 that is connected to each contact $CS_H$. Further, instead of the low impurity concentration region 149, a low impurity concentration region 159 is formed in the region of the surface of the semiconductor substrate 100 between the channel region and the high impurity concentration region 158 (the region that does not face the gate electrode member 142). The high impurity concentration region 158 and the low impurity concentration region 159 contain, for example, P-type impurities such as boron (B). Further, the impurity concentration of the P-type impurities in the high impurity concentration region 158 is higher than the impurity concentration of the P-type impurities in the low impurity concentration region 159.

Figure 25:
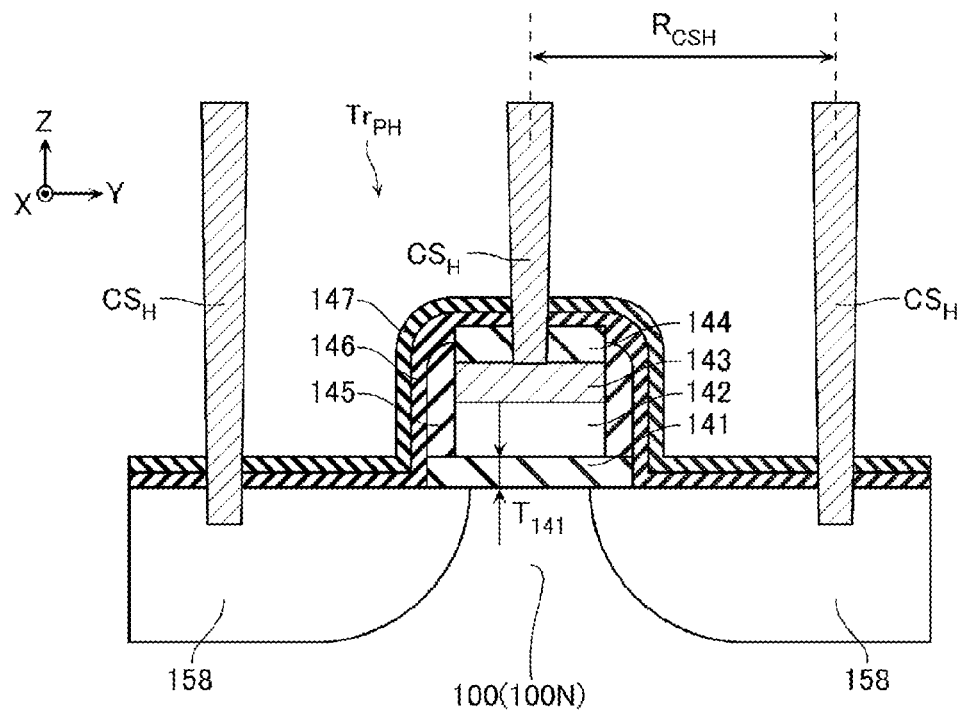
FIG. 25 is a schematic cross-sectional view illustrating a structure of a portion of a chip.

For example, as illustrated in FIG. 25, in the P-type high voltage transistor $Tr_{PH}$, the high impurity concentration region 158 may be formed in the region that extends from the connection portion with the contact $CS_H$ to the portion located directly below the side wall insulating layer 145. In some embodiments, P-type high voltage transistor $Tr_{PH}$ may not include the low impurity concentration region 159.

[Structure of Wirings M0, M1, M2, and M3]

For example, as illustrated in FIG. 18, the plurality of wirings in the wiring layers M0, M1, M2, and M3 are electrically connected to either the configuration of the memory cell array MCA or the configuration of the peripheral circuit PC via the contacts CC and $CS_H$ described above.

The wiring layer MO includes a plurality of wirings m0. Each of the plurality of wirings m0 may include, for example, a stacked film of a barrier conductive film such as titanium nitride (TiN) and a metal film such as tungsten (W).

The wiring layer M1 includes a plurality of wirings m1. Each of the plurality of wirings m1 may include, for example, a stacked film of a barrier conductive film such as titanium nitride (TiN) and a metal film such as copper (Cu). In the example of FIGS. 18 to 20, a portion of the plurality of wirings m1 functions as the bit lines BL. For example, as illustrated in FIG. 17, the bit lines BL are arranged in the X direction and extend in the Y direction. Further, each of the plurality of bit lines BL is connected to one semiconductor column 120 in each string unit SU. Instead of a portion of the wirings m1, a portion of the wirings m0 may function as the bit lines BL.

For example, as illustrated in FIG. 18, the wiring layer M2 includes a plurality of wirings m2. Each of the plurality of wirings m2 may include, for example, a stacked film of a barrier conductive film such as titanium nitride (TiN) and a metal film such as copper (Cu) or aluminum (Al).

For example, as illustrated in FIGS. 18 to 20, the wiring layer M3 includes the plurality of bonding electrodes $P_{f1}$. Each of the plurality of bonding electrodes $P_{f1}$ may include, for example, a stacked film of a barrier conductive film such as titanium nitride (TiN) and a metal film such as copper (Cu). For example, as illustrated in FIG. 12, the plurality of bonding electrodes $P_{f1}$ are provided in the row decoder region $R_{RDH}$. At least a portion of the bonding electrodes $P_{f1}$ functions as a portion of the block selection lines $BLKSEL_L$ (FIG. 5). Further, for example, as illustrated in FIG. 12, the plurality of bonding electrodes $P_{f1}$ are provided in the sense amplifier module region $R_{SAMH}$. At least a portion of the bonding electrodes $P_{f1}$ functions as a portion of the signal line $BLS_L$ (FIG. 10), a portion of the signal line $BLBIAS_L$ (FIG. 10) or a portion of the wiring that connects the high voltage transistor 41 and the sense amplifier SA. Further, for example, as illustrated in FIG. 12, the plurality of bonding electrodes $P_{f1}$ are provided in the voltage generation circuit region $R_{VGH}$. At least a portion of the bonding electrodes $P_{f1}$ functions as a portion of the word line selection lines $WLSEL_L$ (FIG. 6), a portion of the voltage selection lines $VSEL_L$ (FIG. 6), a portion of the input terminals of the AND circuits 32a4 (FIG. 8) or a portion of the signal lines connected to the gate electrodes of the transistors 32b7 (FIG. 9).

[Structure of Chip $C_P$]

For example, as illustrated in FIG. 15, in the chip $C_P$, four sense amplifier module regions $R_{SAML}$ are arranged in the X direction and the Y direction. Further, row decoder regions $R_{RDL}$ are provided at the positions aligned with each sense amplifier module region $R_{SAML}$ in the X direction, respectively. Further, an input/output circuit region $R_{IO}$ is formed at the end of the chip $C_P$ in the Y direction.

The sense amplifier module region $R_{SAML}$ is provided with the low voltage transistors of the sense amplifier module SAM. The row decoder region $R_{RDL}$ is provided with the low voltage transistors of the row decoder RD. The input/output circuit region $R_{IO}$ is provided with the low voltage transistors of the input/output control circuit I/O and the logic circuit CTR.

For example, as illustrated in FIGS. 18 to 20, the chip $C_P$ includes a semiconductor substrate 200, a device layer $L_{DL}$ formed below the semiconductor substrate 200, and a plurality of wiring layers M4, M5, M6, and M7 formed below the device layer $L_{DL}$.

[Structure of Semiconductor Substrate 200]

The semiconductor substrate 200 is made of, for example, P-type silicon (Si) containing P-type impurities such as boron (B). The surface of the semiconductor substrate 200 is provided with, for example, an N-type well region 200N (FIG. 27) that contains N-type impurities such as phosphorus (P), a P-type well region 200P (FIG. 26) that contains P-type impurities such as boron (B), and an insulating region 200I (FIG. 18).

Further, the thickness $T_{200}$ of the semiconductor substrate 200 in the Z direction is smaller than the thickness $T_{100}$ of the semiconductor substrate 100 in the Z direction. The thickness $T_{200}$ may be, for example, ½ of or smaller than the thickness $T_{100}$. More preferably, the thickness $T_{200}$ may be ⅕ of or smaller than the thickness $T_{100}$. More preferably, the thickness $T_{200}$ may be ¹⁄₁₀ of or smaller than the thickness $T_{100}$.

Further, as illustrated in FIG. 20, an insulating layer 201 such as silicon oxide ($SiO_2$) and an insulating layer 202 such as polyimide are formed on the upper surface of the semiconductor substrate 200. Further, a metal wiring MZ such as aluminum (Al) is formed between the insulating layers 201 and 202 at one end of the upper surface of the chip $C_P$ in the Y direction. A portion of the metal wiring MZ is exposed to the outside of the chip $C_P$ through an opening formed in the insulating layer 202. The exposed portion of the metal wiring MZ functions as the bonding pad electrode $P_X$ described above. Further, a portion of the metal wiring MZ is electrically connected to the configuration of the device layer $L_{DL}$ via a contact $CS_L$ provided in the device layer $L_{DL}$.

[Structure of Device Layer $L_{DL}$]

In the device layer $L_{DL}$, a plurality of N-type low voltage transistors $Tr_{NL}$ and a plurality of P-type low voltage transistors $Tr_{PL}$ are provided. Further, the voltage supplied to the low voltage transistors $Tr_{NL}$ and $Tr_{PL}$ is lower than, for example, 5V.

For example, as illustrated in FIG. 26, the N-type low voltage transistors $Tr_{NL}$ are provided in the P-type well region 200P of the semiconductor substrate 200. Each low voltage transistor $Tr_{NL}$ includes a gate insulating layer 241 such as silicon oxide ($SiO_2$) formed on a portion of the P-type well region 200P and the surface of the semiconductor substrate 200, a gate electrode member 242 such as polycrystalline silicon (Si) provided on the upper surface of the gate insulating layer 241, a gate electrode member 243 such as tungsten (W) provided on the upper surface of the gate electrode member 242, a cap insulating layer 244 such as silicon nitride ($Si_3N_4$) formed on the upper surface of the gate electrode member 243, and a side wall insulating layer 245 such as silicon nitride ($Si_3N_4$) formed on the side surfaces of the gate electrode members 242 and 243 and the cap insulating layer 244 in the X or Y direction.

In the illustrated example, the thickness $T_{241}$ coincides with the thickness of the gate insulating layer 241 in the Z direction. The thickness $T_{241}$ is smaller than the thickness $T_{141}$ (FIG. 23).

Further, the N-type low voltage transistor $Tr_{NL}$ includes a liner insulating layer 246 such as silicon oxide ($SiO_2$) and a liner insulating layer 247 such as silicon nitride ($Si_3N_4$) that are stacked on the surface of the semiconductor substrate 200, the side surface of the gate insulating layer 241 in the X or Y direction, the side surface of the side wall insulating layer 245 in the X or Y direction, and the upper surface of the cap insulating layer 244.

Further, three contacts $CS_L$ that extend in the Z direction are connected to the N-type low voltage transistor $Tr_{NL}$. Each contact $CS_L$ may include, for example, a stacked film of a barrier conductive film such as titanium nitride (TiN) and a metal film such as tungsten (W). One of the three contacts $CS_L$ penetrates the liner insulating layer 247, the liner insulating layer 246, and the cap insulating layer 244 to be connected to the upper surface of the gate electrode member 243, and functions as a portion of the gate electrode of the low voltage transistor $Tr_{NL}$. Two of the three contacts $CS_L$ penetrate the liner insulating layer 247 and the liner insulating layer 246 to be connected to the surface of the semiconductor substrate 200, and function as the source electrode and drain electrode of the low voltage transistor $Tr_{NL}$.

Further, in the illustrated example, the distance $R_{CSL}$ coincides with the distance from the central axis of the contact $CS_L$ that functions as a portion of the gate electrode to the central axis of the contact $CS_L$ that functions as a portion of the drain electrode, in the X or Y direction. Further, in the illustrated example, the distance $R_{CSL}$ coincides with the distance from the central axis of the contact $CS_L$ that functions as a portion of the gate electrode to the central axis of the contact $CS_L$ that functions as a portion of the source electrode, in the X or Y direction. The distance $R_{CSL}$ is shorter than the distance $R_{CSH}$ (FIG. 23).

Further, the N-type low voltage transistor $Tr_{NL}$ has a channel region on a portion of the surface of the semiconductor substrate 200 that faces the gate electrode member 242. A high impurity concentration region 248 is formed in the region of the surface of the semiconductor substrate 200 that extends from the connection portion with the contact $CS_L$ to the facing surface with the gate electrode member 242. A first low impurity concentration region 249 is formed between the high impurity concentration region 248 and the channel region, and in a portion of the surface of the semiconductor substrate 200 that faces the gate electrode member 242. A second low impurity concentration region 250 is formed in a region of the semiconductor substrate 200 closer to the back surface thereof, than the first low impurity concentration region 249 that is closer to the surface of the semiconductor substrate 200. The high impurity concentration region 248 and the first low impurity concentration region 249 contain, for example, N-type impurities such as phosphorus (P) or arsenic (As). The impurity concentration in the first low impurity concentration region 249 is lower than the impurity concentration in the high impurity concentration region 248. The second low impurity concentration region 250 contains, for example, P-type impurities such as boron (B). Alternatively, the second low impurity concentration region 250 may be omitted.

For example, as illustrated in FIG. 27, the P-type low voltage transistor $Tr_{PL}$ is basically similar in configuration to the N-type low voltage transistor $Tr_{NL}$. However, the P-type low voltage transistor $Tr_{PL}$ is provided in the N-type well region 200N, and not in the P-type well region 200P. Instead of the high impurity concentration region 248, a high impurity concentration region 258 is formed in the region of the surface of the semiconductor substrate 200 that extends from the connection portion with the contact $CS_L$ to the facing surface with the gate electrode member 242. Instead of the first low impurity concentration region 249, a first low impurity concentration region 259 is formed between the high impurity concentration region 258 and the channel region, and in a portion of the surface of the semiconductor substrate 200 that faces the gate electrode member 242. Instead of the second low impurity concentration region 250, a second low impurity concentration region 260 is formed in the region of the semiconductor substrate 200 closer to the back surface thereof, than the first low impurity concentration region 259 that is in the vicinity of the surface of the semiconductor substrate 200. The high impurity concentration region 258 and the first low impurity concentration region 259 contain, for example, P-type impurities such as boron (B). The impurity concentration in the first low impurity concentration region 259 is lower than the impurity concentration in the high impurity concentration region 258. The second low impurity concentration region 260 contains, for example, N-type impurities such as phosphorus (P) or arsenic (As). Alternatively, the second low impurity concentration region 260 may be omitted.

[Structure of Wirings M4, M5, M6, and M7]

For example, as illustrated in FIGS. 18 to 20, the plurality of wirings in the wiring layers M4, M5, M6, and M7 are electrically connected to the configuration of the peripheral circuit PC via, for example, the contacts $CS_L$ described above.

The wiring layer M4 includes a plurality of wirings m4. Each of the plurality of wirings m4 may include, for example, a stacked film of a barrier conductive film such as titanium nitride (TiN) and a metal film such as tungsten (W).

The wiring layer M5 includes a plurality of wirings m5. Each of the plurality of wirings m5 may include, for example, a stacked film of a barrier conductive film such as titanium nitride (TiN) and a metal film such as tungsten (W).

The wiring layer M6 includes a plurality of wirings m6. Each of the plurality of wirings m6 may include, for example, a stacked film of a barrier conductive film such as titanium nitride (TiN) and a metal film such as copper (Cu).

For example, as illustrated in FIGS. 18 to 20, the wiring layer M7 includes the plurality of bonding electrodes $P_{I2}$. Each of the plurality of bonding electrodes $P_{I2}$ may include, for example, a stacked film of a barrier conductive film such as titanium nitride (TiN) and a metal film such as copper (Cu). For example, as illustrated in FIG. 14, the plurality of bonding electrodes $P_{I2}$ are provided in the region that corresponds to the row decoder region $R_{RDH}$ of the chip $C_M$. At least a portion of the bonding electrodes $P_{I2}$ functions as a portion of $BLKSEL_L$ (FIG. 5). Further, for example, as illustrated in FIG. 14, the plurality of bonding electrodes $P_{I2}$ are provided in the region that corresponds to the sense amplifier module region $R_{SAMH}$ of the chip $C_M$. At least a portion of the bonding electrodes $P_{I2}$ functions as a portion of the signal line $BLS_L$ (FIG. 10), a portion of the signal line $BLBIAS_L$ (FIG. 10) or a portion of the wiring that connects the high voltage transistor 41 and the sense amplifier SA. Further, for example, as illustrated in FIG. 14, the plurality of bonding electrodes $P_{I2}$ are provided in the region that corresponds to the voltage generation circuit region $R_{VGH}$ of the chip $C_M$. At least a portion of the bonding electrodes $P_{I2}$ functions as a portion of the word line selection lines $WLSEL_L$ (FIG. 6), a portion of the voltage selection lines $VSEL_L$ (FIG. 6), a portion of the input terminal of the AND circuit 32a4 (FIG. 8) or a portion of the signal lines connected to the gate electrodes of the transistors 32b7 (FIG. 9).

[Relationship among Memory Cell Array MCA, High Voltage Transistor, and Low Voltage Transistor in Manufacturing Process]

For example, a semiconductor storage device is known which is manufactured by forming both the memory cell array MCA and the peripheral circuit PC on a single wafer. In the process of manufacturing the semiconductor storage device, for example, a plurality of transistors that make up the peripheral circuit PC is formed on the wafer, and then, the memory cell array MCA is formed thereon.

Here, with the progress of the high-speed operation of the semiconductor storage device, it is required to adopt low voltage transistors that operate at a relatively higher speed, as the low voltage transistors that make up the peripheral circuit PC. However, in the low voltage transistors, the length of a channel may be shorter than a predetermined length, or a gate insulating film may be thinner than a predetermined thickness. When the low voltage transistors are adopted, for example, impurities such as boron (B) contained in the semiconductor substrate or the gate electrodes of the low voltage transistors may diffuse to the channel regions of the low voltage transistors during a thermal process for crystallizing the semiconductor columns 120 in the memory cell array MCA, and as a result, a short-channel effect or the like may occur.

In order to solve this problem, for example, it may be conceived to form the memory cell array MCA on one wafer, form the peripheral circuit PC on another wafer, and bond the wafers to each other. In this case, for example, it may also be conceived to form both the high voltage transistors and the low voltage transistors on the wafer on which the peripheral circuit PC is to be formed.

However, the inventors have found upon their review that it may be preferable to form the low voltage transistors and the high voltage transistors on separate wafers.

Further, the channel length of a high voltage transistor is longer than the channel length of a low voltage transistor, and the thickness of a gate insulating film of a high voltage transistor is thicker than the thickness of a gate insulating film of a low voltage transistor. Thus, the high voltage transistor is resistant to heat, as compared with the low voltage transistor.

Thus, in the present embodiment, the configuration of the memory cell array MCA and the high voltage transistors of the peripheral circuit PC are formed on the chip $C_M$, and the low voltage transistors of the peripheral circuit PC are formed on the chip $C_P$.

[Reduction of Dead Space]

With the progress of the high integration of a semiconductor storage device, the area of the memory cell array MCA has decreased. Here, the high integration of the memory cell array MCA may be implemented by increasing the number of conductive layers 110 stacked in the Z direction (FIGS. 18 to 20). When the memory cell array MCA highly integrated in this way and the peripheral circuit PC are formed on separate chips, the area of the chip of the peripheral circuit PC may be larger than the area of the chip of the memory cell array MCA. In this case, a dead space may occur in the chip of the memory cell array MCA.

Accordingly, in the present embodiment, the configuration of the memory cell array MCA and the high voltage transistors of the peripheral circuit PC are formed on the chip $C_M$, and the low voltage transistors of the peripheral circuit PC are formed in the chip $C_P$.

According to this configuration, it is possible to reduce the difference in area between the chips $C_M$ and $C_P$ even when the high integration of the memory cell array MCA is progressed.

Further, when the area of the chip $C_P$ is left even with this configuration, it is possible to provide a larger number of latch circuits than the number of bits of data recorded in each memory cell MC, in the sense amplifier SA. As a result, it is possible to provide a semiconductor storage device that operates more preferably.

[Accuracy of Alignment when Wafers are Bonded]

When the memory cell array MCA is mounted on one chip, and both the high voltage transistors and the low voltage transistors of the peripheral circuit PC are mounted on the other chip, the configuration of the memory cell array MCA and the configuration of the peripheral circuit PC are connected to each other via bonding electrodes.

In this case, for example, bonding electrodes that correspond to all of the word lines WL in the memory cell array MCA may be required. For example, when the number of memory blocks BLK in the memory cell array MCA is 1,000 and the number of word lines WL in a memory block BLK is 100, 100,000 corresponding bonding electrodes may be required.

Thus, as a result of the high integration of the semiconductor storage device, the layout pattern on the bonding surface becomes fine. Accordingly, when the wafers are bonded to each other, it may be necessary to perform a more accurate alignment.

Thus, in the present embodiment, the configuration of the memory cell array MCA and the high voltage transistors of the peripheral circuit PC are mounted on the chip $C_M$, and the low voltage transistors of the peripheral circuit PC are mounted in the chip $C_P$.

In this case, for example, it may be preferable that bonding electrodes are provided at the connection portion between the high voltage transistors and the low voltage transistors. For example, when the number of memory blocks BLK in the memory cell array MCA is 1,000 and the number of word lines WL in a memory block BLK is 100, about 1,200 bonding electrodes may be provided which correspond to 1,000 block selection lines $BLKSEL_L$ required for selecting blocks (FIG. 5), about 200 word selection lines $WLSEL_L$ required for selecting word lines WL (FIG. 6), and about several to dozens of voltage selection lines $VSEL_L$ required for selecting voltages (FIG. 6).

According to this configuration, the number of bonding electrodes required for connecting the chips to each other may be significantly reduced. As a result, the required accuracy of alignment when the wafers are bonded to each other may be relaxed, so that the yield of the semiconductor storage device may be improved.

[Arrangement of Bonding Pad Electrodes $P_X$]

When a semiconductor storage device is manufactured by bonding the front surfaces of two wafers to each other, the bonding pad electrodes $P_X$ are provided on the back surface of either one of the wafers. When the bonding pad electrodes $P_X$ are provided, it may be conceived to form a plurality of through via holes in either one of the wafers, and connect the bonding pad electrodes $P_X$ and the configuration on the front surface of the wafer to each other through the through via holes. Here, when a through via hole has a relatively large aspect ratio, the manufacturing costs may increase. Accordingly, it is desirable that the thickness of the wafer on which the bonding pad electrodes $P_X$ are provided is relatively small.

Here, for the driving of the high voltage transistors $Tr_{NH}$ and $Tr_{PH}$, a relatively deep depletion layer may be formed in the semiconductor substrate region 100S. When the depletion layer reaches the back surface of the semiconductor substrate 100, the high voltage transistors $Tr_{NH}$ and $Tr_{PH}$ may not operate preferably. Accordingly, it is preferable to make the thickness of the semiconductor substrate 100 on which the high voltage transistors $Tr_{NH}$ and $Tr_{PH}$ are to be provided, relatively large.

Thus, in the semiconductor storage device according to the present embodiment, the thickness of the chip $C_P$ on which the high voltage transistors are not provided is made smaller than the thickness of the chip $C_M$. Further, the bonding pad electrodes $P_X$ are provided on the back surface of the chip $C_P$.

Second Embodiment

Figure 28:
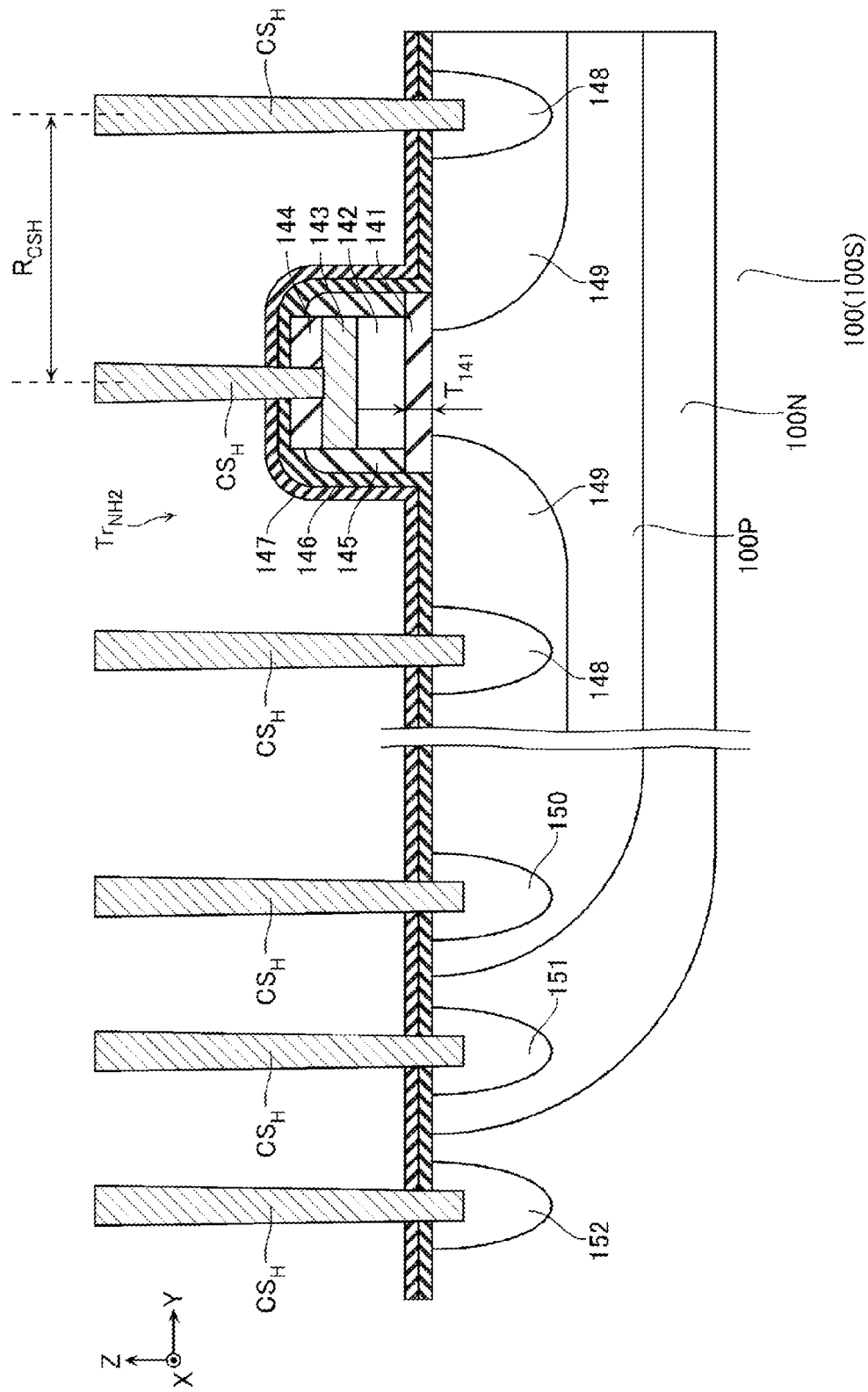
FIG. 28 is a schematic cross-sectional view illustrating a configuration of a portion of a semiconductor storage device according to a second embodiment.

Next, a semiconductor storage device according to a second embodiment will be described with reference to FIG. 28. FIG. 28 is a schematic cross-sectional view illustrating a configuration of a portion of the semiconductor storage device according to the second embodiment.

In the first embodiment, the configurations of the high voltage transistors $Tr_{NH}$ and $Tr_{PH}$ are illustrated with reference to FIGS. 23 and 24. However, the configurations are merely examples, and the configurations of the high voltage transistors $Tr_{NH}$ and $Tr_{PH}$ may be appropriately adjusted.

For example, the semiconductor storage device according to the second embodiment is basically similar in configuration to the semiconductor storage device according to the first embodiment. However, the semiconductor storage device according to the second embodiment includes a plurality of high voltage transistors $Tr_{NH2}$ (FIG. 28), instead of at least a portion of the plurality of high voltage transistors $Tr_{NH}$ (FIG. 23). For example, the high voltage transistors $Tr_{NH2}$ are used as the block select transistors 35 (FIG. 5), the word line select transistors 37 (FIG. 6), the voltage select transistors 39 (FIG. 6) and others.

Each high voltage transistor $Tr_{NH2}$ (FIG. 28) according to the second embodiment is basically similar in configuration to the high voltage transistor $Tr_{NH}$ (FIG. 23) according to the first embodiment. However, the high voltage transistor $Tr_{NH2}$ according to the second embodiment is provided in the P-type well region 100P, and not in the semiconductor substrate region 100S. Further, the P-type well region 100P that corresponds to the high voltage transistor $Tr_{NH2}$ is electrically separated from the semiconductor substrate region 100S via the N-type well region 100N.

Contacts $CS_H$ are connected to the P-type well region 100P that corresponds to the high voltage transistor $Tr_{NH2}$, the N-type well region 100N, and the semiconductor substrate region 100S. Further, high impurity concentration regions 150, 151, and 152 are formed at the connection portions of the P-type well region 100P, the N-type well region 100N, and the semiconductor substrate region 100S with the contacts $CS_H$, respectively. The high impurity concentration regions 150 and 152 contain, for example, P-type impurities such as boron (B). The high impurity concentration region 151 contains, for example, N-type impurities such as phosphorus (P) or arsenic (As).

Further, the semiconductor storage device according to the second embodiment is configured to be able to supply a voltage having a negative polarity to the drain electrode of the high voltage transistor $Tr_{NH2}$ and the P-type well region 100P during the read operation or the like. For example, the semiconductor storage device according to the second embodiment may include a charge pump circuit or the like capable of outputting a voltage having a negative polarity.

Third Embodiment

Figure 29:
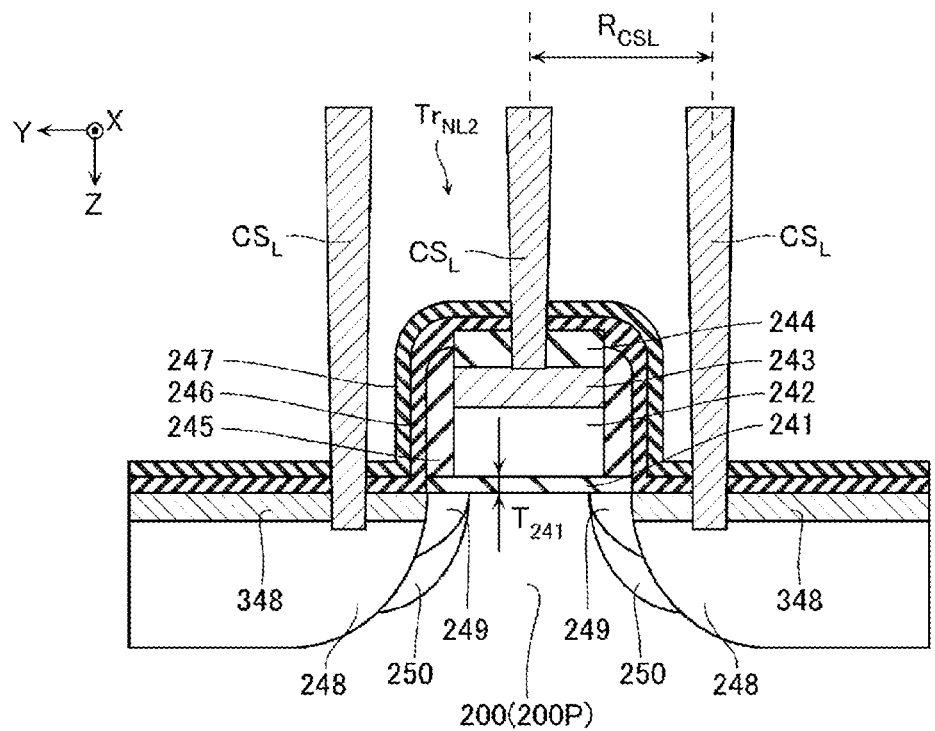
FIG. 29 is a schematic cross-sectional view illustrating a configuration of a portion of a semiconductor storage device according to a third embodiment.
Figure 30:
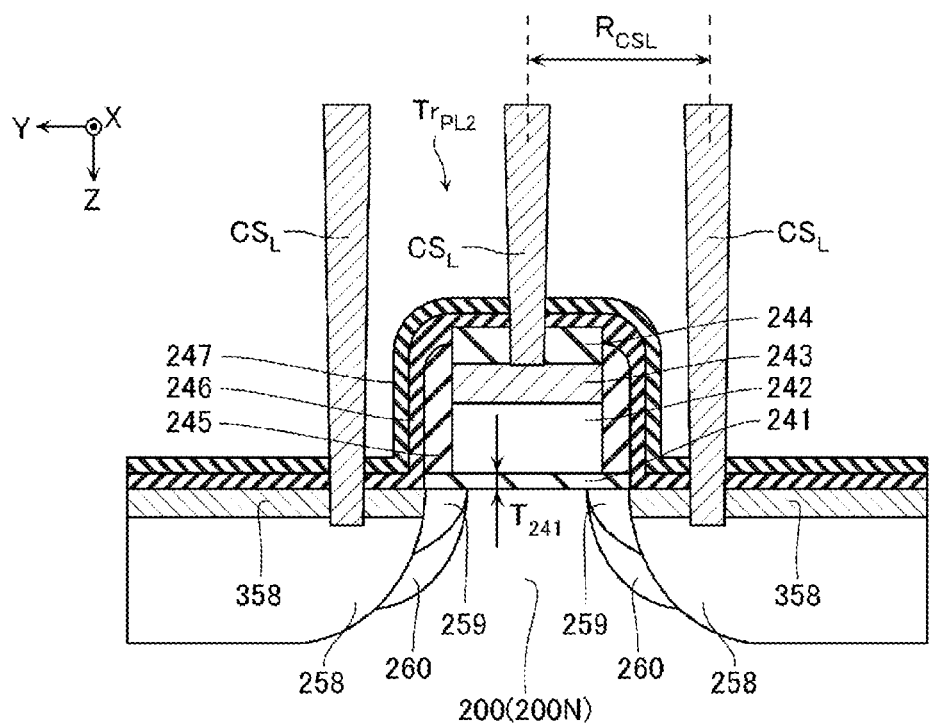
FIG. 30 is a schematic cross-sectional view illustrating a configuration of a portion of the semiconductor storage device according to the third embodiment.

Next, a semiconductor storage device according to a third embodiment will be described with reference to FIGS. 29 and 30. FIGS. 29 and 30 are schematic cross-sectional views illustrating a configuration of a portion of the semiconductor storage device according to the third embodiment.

In the first embodiment, the configurations of the low voltage transistors $Tr_{NL}$ and $Tr_{PL}$ are illustrated with reference to FIGS. 26 and 27. However, the configurations are merely examples, and the configurations of the low voltage transistors $Tr_{NL}$ and $Tr_{PL}$ may be appropriately adjusted.

For example, the semiconductor storage device according to the third embodiment is basically similar in configuration to the semiconductor storage device according to the first embodiment. However, the semiconductor storage device according to the third embodiment includes a plurality of low voltage transistors $Tr_{NL2}$ (FIG. 29) and $Tr_{PL2}$ (FIG. 30), instead of at least a portion of the plurality of low voltage transistors $Tr_{NL}$ (FIG. 26) and $Tr_{PL}$ (FIG. 27).

Each of the low voltage transistors $Tr_{NL2}$ (FIG. 29) and $Tr_{PL2}$ (FIG. 30) according to the third embodiment is basically similar in configuration to the low voltage transistor $Tr_{NL}$ (FIG. 23) according to the first embodiment. However, in the third embodiment, silicide regions 348 and 358 are formed at the portions of the high impurity concentration regions 248 and 258 of the low voltage transistors $Tr_{NL2}$ and $Tr_{PL2}$ that correspond to the surface of the semiconductor substrate 200. The silicide regions 348 and 358 contain metal atoms, in addition to the materials contained in the high impurity concentration regions 248 and 258.

The low voltage transistors $Tr_{NL2}$ and $Tr_{PL2}$ illustrated in FIGS. 29 and 30 may operate at a higher speed than that of the low voltage transistors $Tr_{NL}$ and $Tr_{PL}$ illustrated in FIGS. 26 and 27. However, when the low voltage transistors $Tr_{NL2}$ and $Tr_{PL2}$ illustrated in FIGS. 29 and 30 are manufactured, it is necessary to perform a silicidation for the portions of the surface of the wafer that correspond to the high impurity concentration regions 248 and 258.

Here, when both the low voltage transistors and the high voltage transistors are formed on one wafer, it may be difficult to perform the silicidation process.

Here, in the process of manufacturing the semiconductor storage device according to the present embodiment, the configuration of the memory cell array MCA and the high voltage transistors of the peripheral circuit PC are formed on the chip $C_M$, and the low voltage transistors of the peripheral circuit PC are formed on the chip $C_P$, as in the semiconductor storage device according to the first embodiment. Accordingly, the low voltage transistors $Tr_{NL2}$ and $Tr_{PL2}$ illustrated in FIGS. 29 and 30 may be relatively easily adopted.

Further, in the semiconductor storage device according to the third embodiment, the high voltage transistor $Tr_{NH2}$ according to the second embodiment may also be adopted.

Fourth Embodiment

Figure 31:
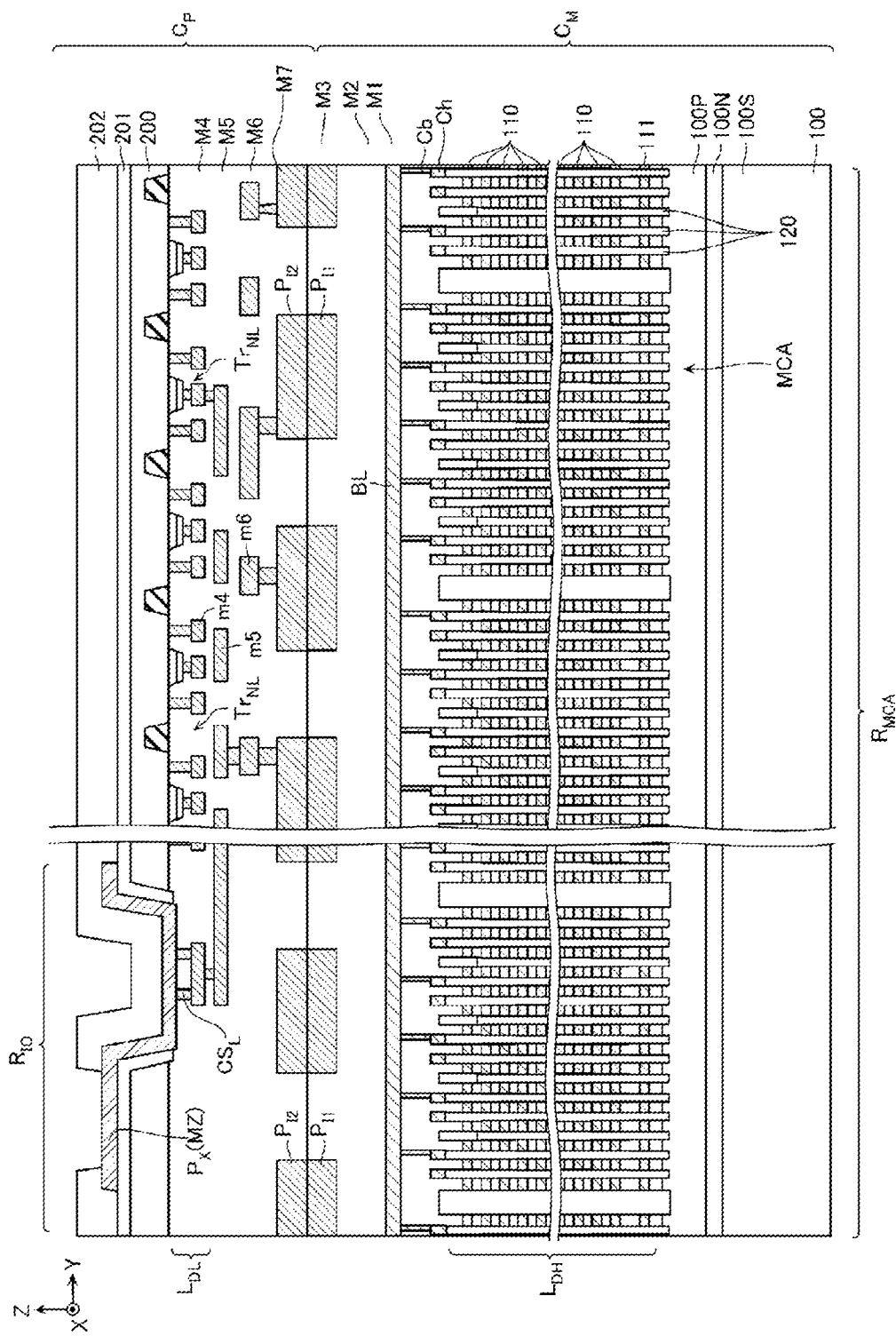
FIG. 31 is a schematic cross-sectional view illustrating a configuration of a portion of a semiconductor storage device according to a fourth embodiment.

Next, a semiconductor storage device according to a fourth embodiment will be described with reference to FIG. 31. FIG. 31 is a schematic cross-sectional view illustrating a configuration of a portion of the semiconductor storage device according to the fourth embodiment.

As illustrated in FIGS. 15 and 20, in the semiconductor storage device according to the first embodiment, the input/output circuit region $R_{IO}$ is formed outside the memory cell array region $R_{MCA}$ (the region that does not overlap with the memory cell array region $R_{MCA}$ when viewed from the Z direction). However, this configuration is merely an example, and the position of the input/output circuit region $R_{IO}$ may be appropriately adjusted.

For example, the semiconductor storage device according to the fourth embodiment is basically similar in configuration to the semiconductor storage device according to the first embodiment. However, in the semiconductor storage device according to the fourth embodiment, for example, as illustrated in FIG. 31, the input/output circuit region $R_{IO}$ is formed inside the memory cell array region $R_{MCA}$ (the region that overlaps with the memory cell array region $R_{MCA}$ when viewed from the Z direction).

According to this configuration, the area of the memory die MD may be reduced.

Further, when the memory cell array MCA is provided on one wafer, and the peripheral circuit PC is provided on another wafer, the high voltage transistors are also provided on the wafer of the peripheral circuit PC, and thus, it is relatively difficult to reduce the thickness of the wafer of the peripheral circuit PC. In this case, for example, it may be conceived to reduce the thickness of the wafer of the memory cell array MCA, and provide the bonding pad electrodes $P_X$ on the same wafer.

In this configuration, in order to connect the bonding pad electrodes $P_X$ provided on the chip of the memory cell array MCA to the input/output control circuit I/O and the logic circuit CTR provided on the chip of the peripheral circuit PC, it is necessary to provide contact electrodes that extend in the Z direction, on the chip of the cell array MCA. Further, such contact electrodes need to be arranged to avoid the configuration of the memory cell array MCA. Accordingly, when the memory cell array MCA is provided on one wafer, and the peripheral circuit PC is provided on another wafer, the input/output circuit region $R_{IO}$ may not be provided inside the memory cell array region $R_{MCA}$.

By contrast, in the semiconductor storage device according to the present embodiment, all of the bonding pad electrodes $P_X$, the input/output control circuit I/O, and the logic circuit CTR are provided on the chip $C_P$. Accordingly, the position of the input/output circuit region $R_{IO}$ may be adjusted without being restricted from the position of the memory cell array MCA.

Further, in the semiconductor storage device according to the fourth embodiment, the high voltage transistor $Tr_{NH2}$ according to the second embodiment may also be adopted. Further, in the semiconductor storage device according to the fourth embodiment, the low voltage transistors $Tr_{NL2}$ and $Tr_{PL2}$ according to the third embodiment may also be adopted.

Fifth Embodiment

Figure 32:
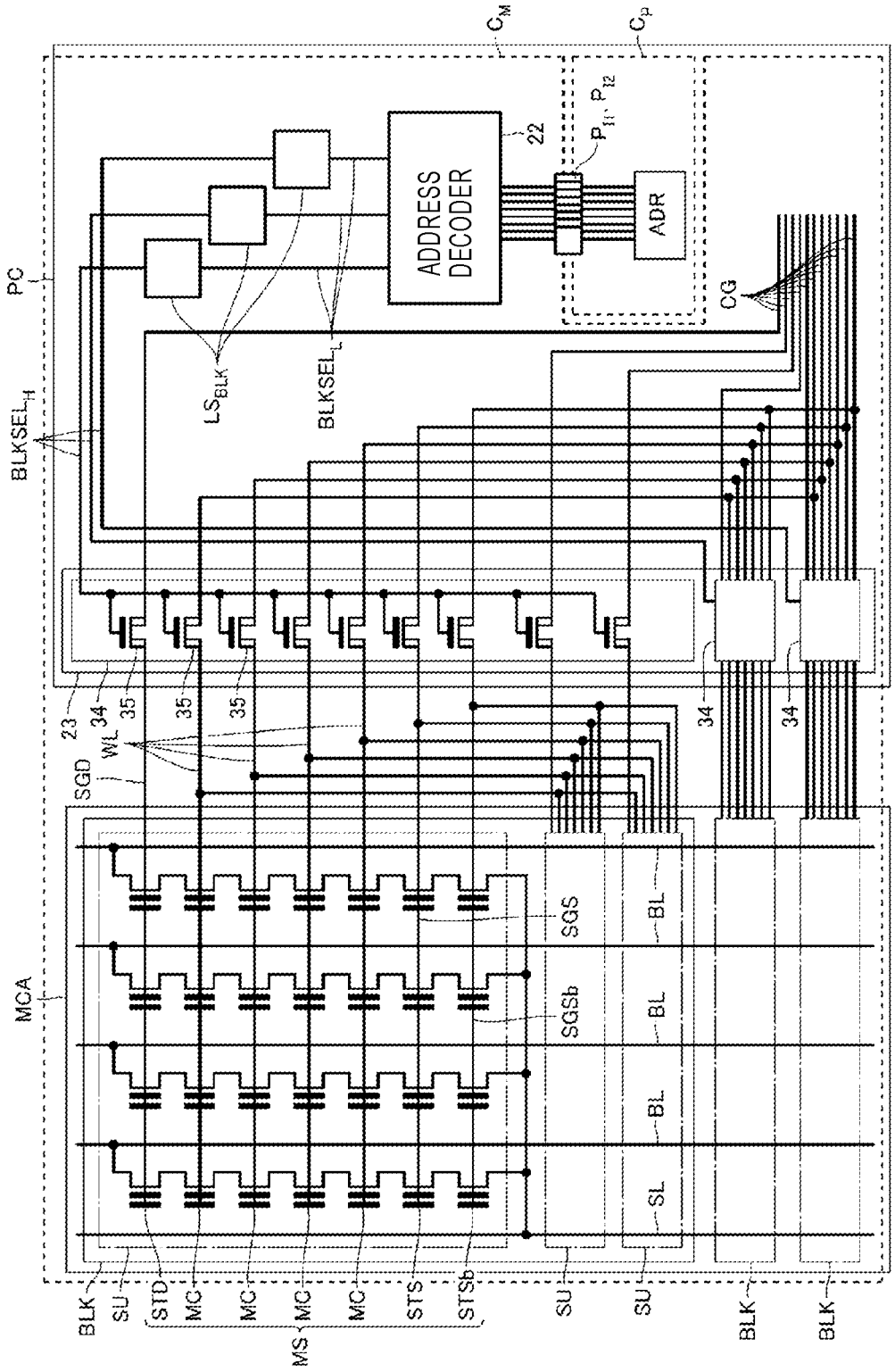
FIG. 32 is a schematic circuit diagram illustrating a configuration of a portion of a semiconductor storage device according to a fifth embodiment.

Next, a semiconductor storage device according to a fifth embodiment will be described with reference to FIG. 32. FIG. 32 is a schematic circuit diagram illustrating a configuration of a portion of the semiconductor storage device according to the fifth embodiment.

FIGS. 4 to 10 illustrate the circuits or elements in the chip $C_M$ and the circuits or elements in the chip $C_P$. However, the configuration is merely an example, and a chip to which circuits or elements belong, and circuits or elements to be provided in the chip may be appropriately adjusted.

For example, the semiconductor storage device according to the fifth embodiment is basically similar in configuration to the semiconductor storage device according to the first embodiment. However, in the semiconductor storage device according to the fifth embodiment, for example, as illustrated in FIG. 32, at least a portion of the address decoder 22 is provided on the chip $C_M$, rather than the chip $C_P$.

That is, the address decoder 22 according to the first embodiment is made up by the low voltage transistors provided on the chip $C_P$. Meanwhile, at least a portion of the address decoder 22 according to the present embodiment is made up by the high voltage transistors provided on the chip $C_M$.

Further, in the first embodiment, for example, as illustrated in FIG. 5, a portion of the bonding electrodes $P_{I1}$ and $P_{I2}$ functions as a portion of the block selection lines $BLKSEL_L$. Meanwhile, in the fifth embodiment, for example, as illustrated in FIG. 32, a portion of the bonding electrodes $P_{I1}$ and $P_{I2}$ functions as a portion of a data bus connected between the address register ADR and the address decoder 22. Further, the data bus is used for transferring a block address in the row address RA.

Here, in the structure of the first embodiment, for example, when the number of memory blocks BLK in the memory cell array MCA is 1,000, about 1,000 bonding electrodes are required for selecting the memory blocks BLK. Meanwhile, in the structure of the fifth embodiment, for example, about 10 bonding electrodes that correspond to the number of bits of a block address may be required for selecting the memory blocks BLK.

That is, according to the present embodiment, the number of bonding electrodes required for the connection between the chips may be further significantly reduced. As a result, the required accuracy of the alignment when the chips are bonded to each other may be further relaxed, so that the yield of the semiconductor storage device may be further improved.

Further, the low voltage transistors may operate at a higher speed than the high voltage transistors. Accordingly, it is preferable to provide the circuit that operates at a relatively high speed, on the chip $C_P$. Here, the operation speed of the address decoder 22 may be slow, as compared with other circuits.

Further, FIG. 32 illustrates the configuration in which the portion of the address decoder 22 that decodes a block address is provided on the chip $C_M$. However, a portion of the address decoder 22 to be provided on the chip $C_M$ may be appropriately adjusted. For example, the portion of the address decoder 22 that decodes a page address (the portion illustrated in FIG. 6) may be provided on the chip $C_M$. In this case, for example, at least a portion of the plurality of bonding electrodes $P_{I1}$ provided in the voltage generation circuit region $R_{VGH}$, and at least a portion of the plurality of bonding electrodes $P_{I2}$ bonded to the plurality of bonding electrodes $P_{I1}$ function as a portion of the data bus connected between the address register ADR and the address decoder 22.

Further, in the semiconductor storage device according to the fifth embodiment, the high voltage transistor $Tr_{NH2}$ according to the second embodiment may also be adopted. Further, in the semiconductor storage device according to the fifth embodiment, the low voltage transistors $Tr_{NL2}$ and $Tr_{PL2}$ according to the third embodiment may also be adopted. Further, in the semiconductor storage device according to the fifth embodiment, the input/output circuit region $R_{IO}$ may be provided at a position that overlaps with the memory cell array region $R_{MCA}$ when viewed from the Z direction, as in the fourth embodiment.

Sixth Embodiment

Figure 33:
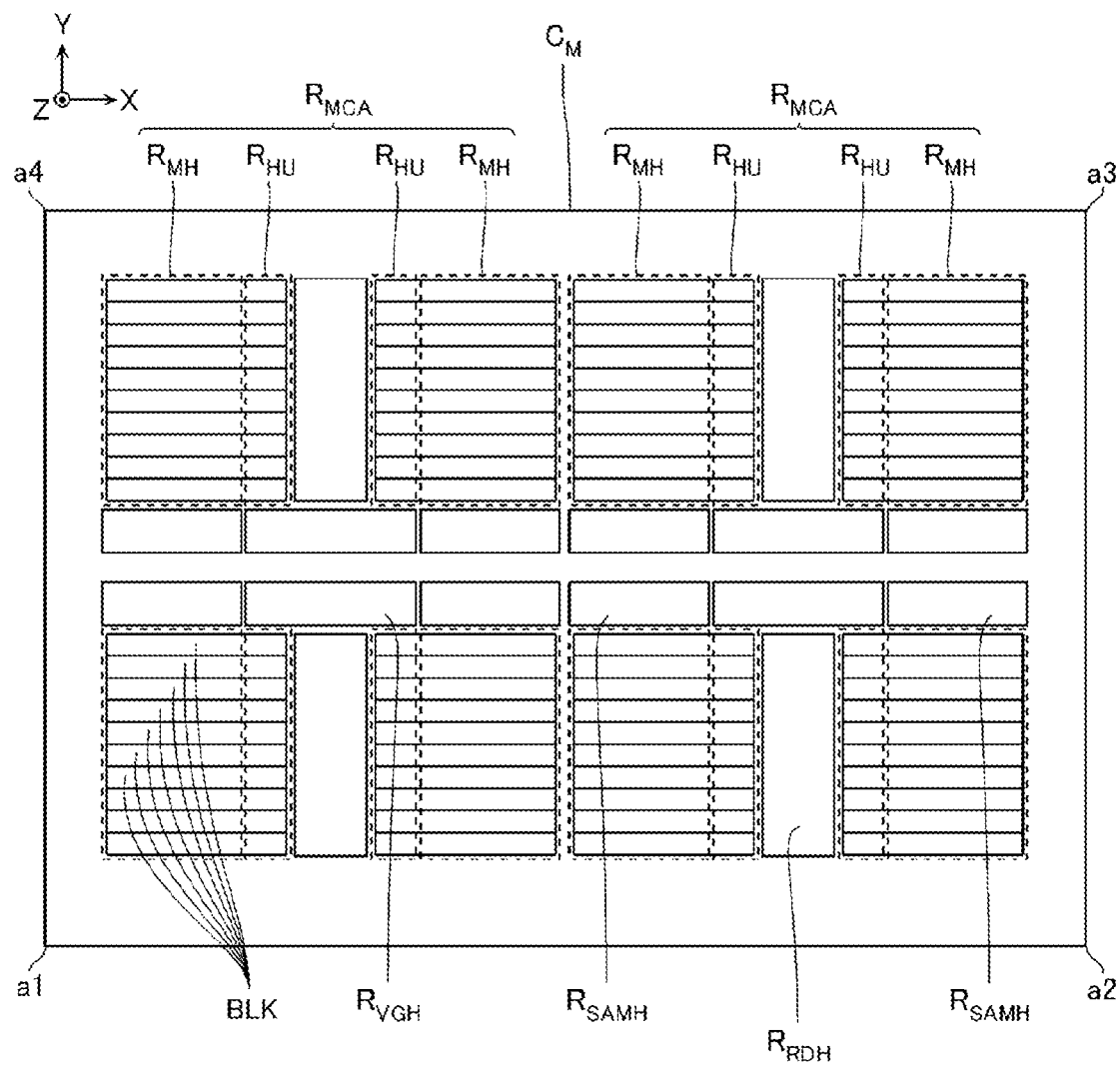
FIG. 33 is a schematic plan view illustrating a configuration of a portion of a semiconductor storage device according to a sixth embodiment.

Next, a semiconductor storage device according to a sixth embodiment will be described with reference to FIG. 33. FIG. 33 is a schematic plan view illustrating a configuration of a portion of the semiconductor storage device according to the sixth embodiment.

FIGS. 12 to 15 illustrate the layout pattern of each element in the chips $C_M$ and $C_P$. However, the configuration is merely an example, and the arrangement of each element may be appropriately adjusted.

For example, the semiconductor storage device according to the sixth embodiment is basically similar in configuration to the semiconductor storage device according to the first embodiment.

However, in the semiconductor storage device according to the first embodiment, for example, as illustrated in FIG. 13, the row decoder region $R_{RDH}$ is formed at each of one side and the other side of the memory cell array region $R_{MCA}$ in the X direction. Further, the hookup region $R_{HU}$ is formed between the memory hole region $R_{MH}$ and the row decoder region $R_{RDH}$.

Meanwhile, in the semiconductor storage device according to the sixth embodiment, for example, as illustrated in FIG. 33, the memory cell array region $R_{MCA}$ is divided into two regions in the X direction, and the row decoder region $R_{RDH}$ is formed between the two regions. Further, the hookup region $R_{HU}$ is formed between the memory hole region $R_{MH}$ and the row decoder region $R_{RDH}$.

Further, in the semiconductor storage device according to the sixth embodiment, the high voltage transistor $Tr_{NH2}$ according to the second embodiment may also be adopted. Further, in the semiconductor storage device according to the sixth embodiment, the low voltage transistors $Tr_{NL2}$ and $Tr_{PL2}$ according to the third embodiment may also be adopted. Further, in the semiconductor storage device according to the sixth embodiment, the input/output circuit region $R_{IO}$ may be formed at a position that overlaps with the memory cell array region $R_{MCA}$ when viewed from the Z direction, as in the fourth embodiment. Further, in the semiconductor storage device according to the sixth embodiment, at least a portion of the address decoder 22 may be provided on a chip $C_M$, rather than the chip $C_P$, as in the fifth embodiment.

Seventh Embodiment

Figure 34:
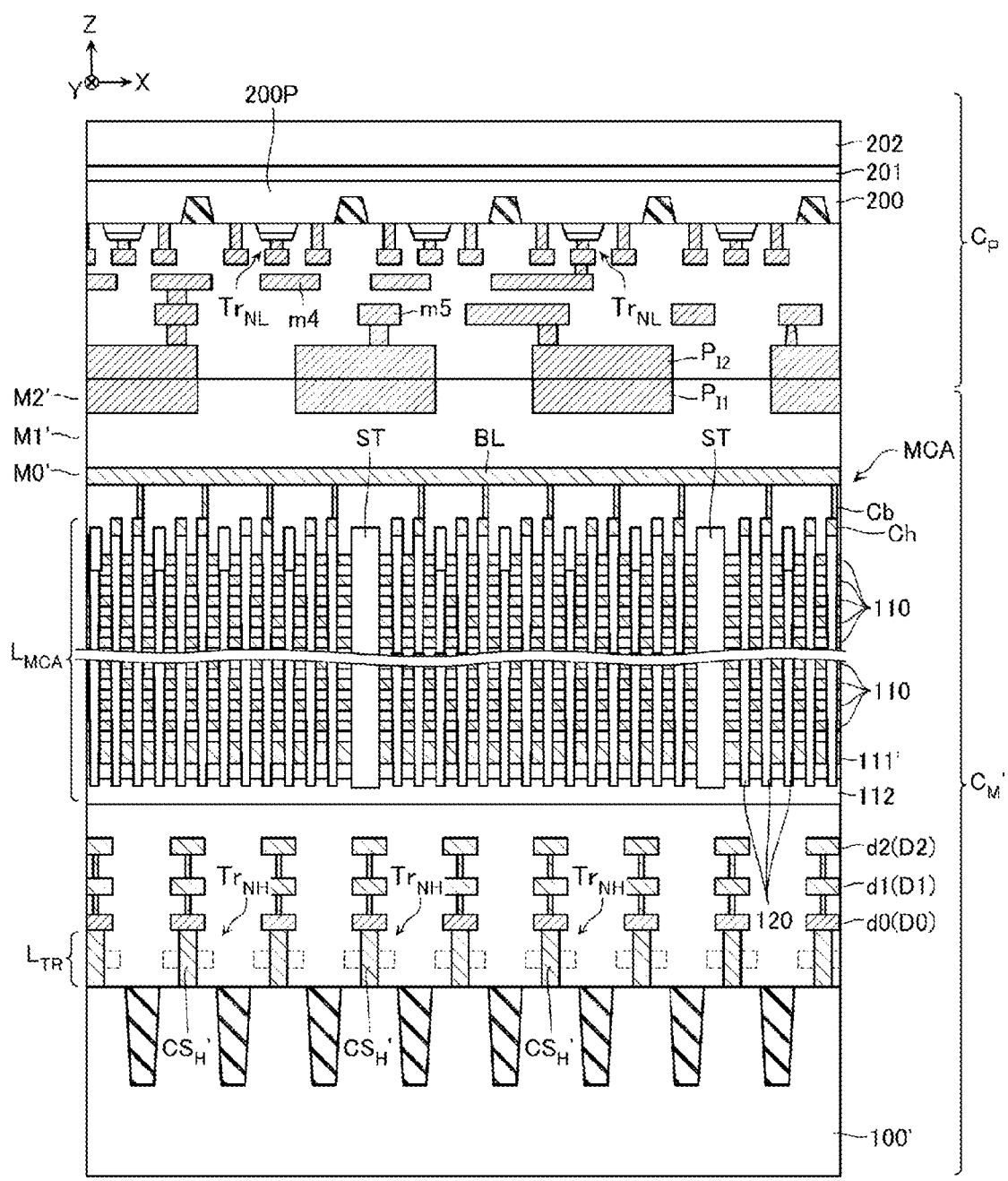
FIG. 34 is a schematic cross-sectional view illustrating a configuration of a portion of a semiconductor storage device according to a seventh embodiment.
Figure 35:
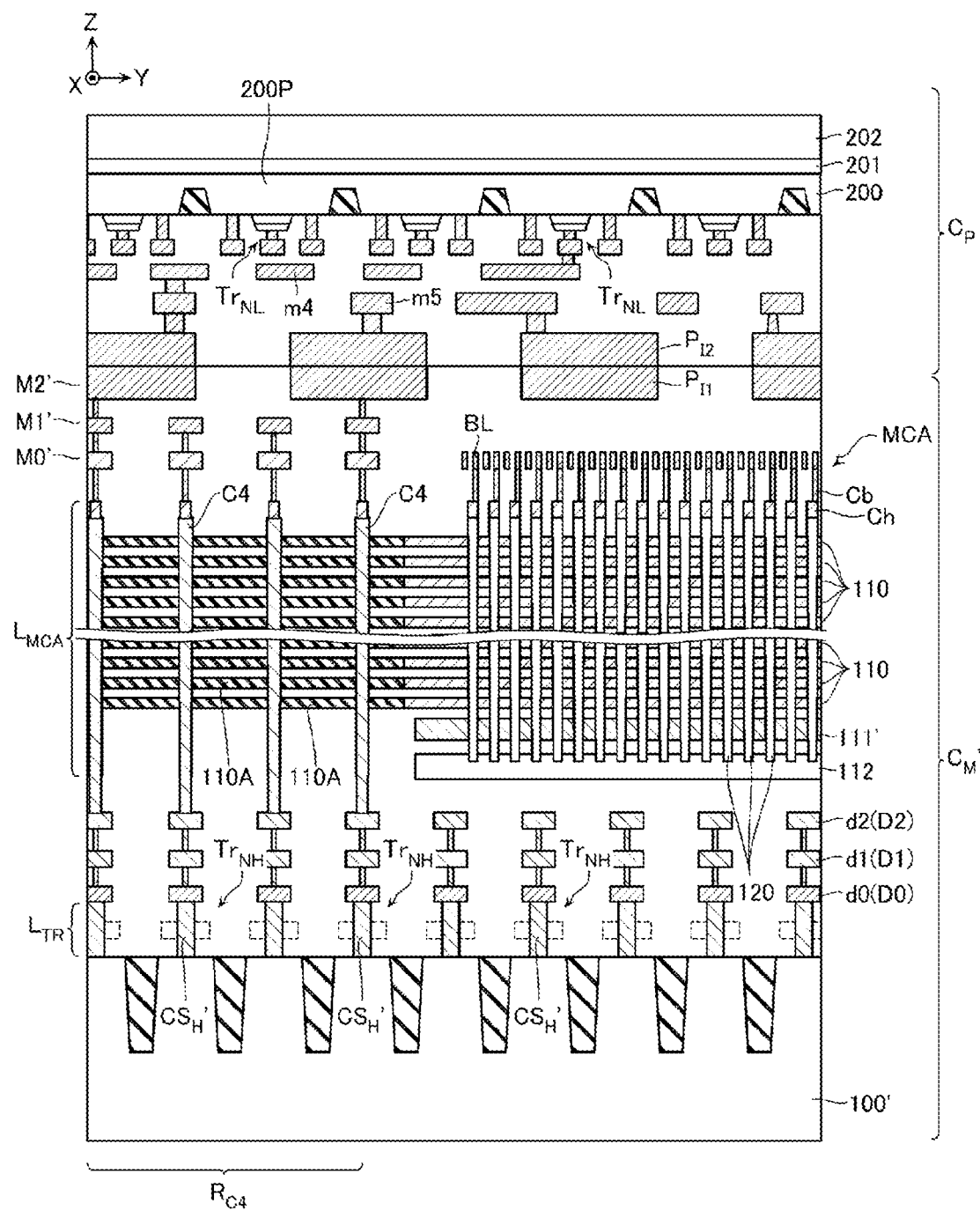
FIG. 35 is a schematic cross-sectional view illustrating a configuration of a portion of the semiconductor storage device according to the seventh embodiment.

Next, a semiconductor storage device according to a seventh embodiment will be described with reference to FIGS. 34 and 35. FIGS. 34 and 35 are schematic cross-sectional views illustrating a configuration of a portion of the semiconductor storage device according to the seventh embodiment.

The semiconductor storage device according to the seventh embodiment is basically similar in configuration to the semiconductor storage device according to the first embodiment. However, for example, as illustrated in FIGS. 34 and 35, the semiconductor storage device according to the seventh embodiment includes the chip $C_M'$, instead of the chip $C_M$. The chip $C_M'$ is basically similar in configuration to the chip $C_M$, and is provided with a semiconductor substrate 100', a transistor layer $L_{TR}$ formed above the semiconductor substrate 100', a plurality of wiring layers D0, D1, and D2 formed above the transistor layer $L_{TR}$, a memory cell array layer $L_{MCA}$ formed above the plurality of wiring layers D0, D1, and D2, and a plurality of wiring layers M0', M1', and M2' formed above the memory cell array layer $L_{MCA}$.

The semiconductor substrate 100' is basically similar in configuration to the semiconductor substrate 100. However, the semiconductor substrate 100' is separated from the configuration of the memory cell array MCA. Further, the arrangement of the high voltage transistors on the semiconductor substrate 100' is different from the arrangement of the high voltage transistors on the semiconductor substrate 100.

In the transistor layer $L_{TR}$, the plurality of high voltage transistors $Tr_{NH}$ and $Tr_{PH}$ and a plurality of contacts $CS_H'$ are provided. Each contact $CS_H'$ is basically similar in configuration to the contact $CS_H$. However, as illustrated in FIGS. 18 to 20, the upper end of the contact $CS_H$ is provided near or above the upper end of the semiconductor column 120. Meanwhile, as illustrated in FIGS. 34 and 35, the upper end of the contact $CS_H'$ is provided below the lower end of the semiconductor column 120.

The plurality of wirings in the wiring layers D0, D1, and D2 are electrically connected to at least either one of the configuration of the memory cell array MCA and the configuration of the peripheral circuit PC via, for example, the contacts $CS_H'$. The wiring layers D0, D1, and D2 include a plurality of wirings d0, d1, and d2, respectively. Each of the plurality of wirings d0, d1, and d2 may include, for example, a stacked film of a barrier conductive film such as titanium nitride (TiN) and a metal film such as tungsten (W).

The memory cell array layer $L_{MCA}$ is provided with structures substantially similar to the structure of the memory hole region $R_{MH}$ and the structure of the hookup region $R_{HU}$ in the device layer $L_{DH}$ of the chip $C_M$. However, the lower end of the semiconductor column 120 according to the present embodiment is connected to a conductive layer 112, rather than the upper surface of the semiconductor substrate 100. The conductive layer 112 includes, for example, a semiconductor layer such as polycrystalline silicon (Si) containing N-type impurities such as phosphorus (P). Further, in the memory cell array layer $L_{MCA}$ according to the present embodiment, a conductive layer 111' is formed, instead of the conductive layer 111. The conductive layer 111' is, for example, a semiconductor layer such as polycrystalline silicon (Si) containing N-type impurities such as phosphorus (P).

Further, as illustrated in FIG. 35, a through contact region $R_{C4}$ may be formed in a portion of the memory cell array layer $L_{MCA}$. The through contact region $R_{C4}$ includes a plurality of insulating layers 110A arranged in the Z direction, and a plurality of through contacts C4 that extends in the Z direction. Each insulating layer 110A is, for example, an insulating layer such as silicon nitride ($Si_3N_4$). Although not illustrated, an insulating layer 101 is formed between the plurality of insulating layers 110A arranged in the Z direction. Each through contact C4 may include, for example, a stacked film of a barrier conductive film such as titanium nitride (TiN) and a metal film such as tungsten (W). The through contact C4 penetrates the plurality of insulating layers 110A stacked in the Z direction, and extends in the Z direction to electrically connect the configuration of the wiring layer D2 and the configuration of the wiring layer M0' to each other.

The plurality of wirings in the wiring layers M0', M1', and M2' are electrically connected to, for example, at least either one of the high voltage transistors in the chip $C_M$ and the low voltage transistors in the chip $C_P$. For example, the wiring layers M0', M1', and M2' may be substantially similar in configuration to the wiring layers M1, M2, and M3.

Next, the layout pattern of the semiconductor storage device according to the seventh embodiment will be described with reference to FIGS. 36 to 40. FIGS. 36 to 40 are schematic plan views of the chip $C_M'$.

In the chip $C_M$ according to the first embodiment, all of the configuration of the memory cell array MCA and the high voltage transistors $Tr_{NH}$ and $Tr_{PH}$ in the peripheral circuit PC are provided in the device layer $L_{DH}$. Meanwhile, in the chip $C_M'$ according to the seventh embodiment, the configuration of the memory cell array MCA is provided in the memory cell array layer $L_{MCA}$, and the high voltage transistors $Tr_{NH}$ and $Tr_{PH}$ in the peripheral circuit PC are provided in the transistor layer $L_{TR}$. Accordingly, at least a portion of the high voltage transistors $Tr_{NH}$ and $Tr_{PH}$ in the peripheral circuit PC may be provided at a position that overlaps with the configuration of the memory cell array MCA when viewed from the Z direction.

Figure 36:
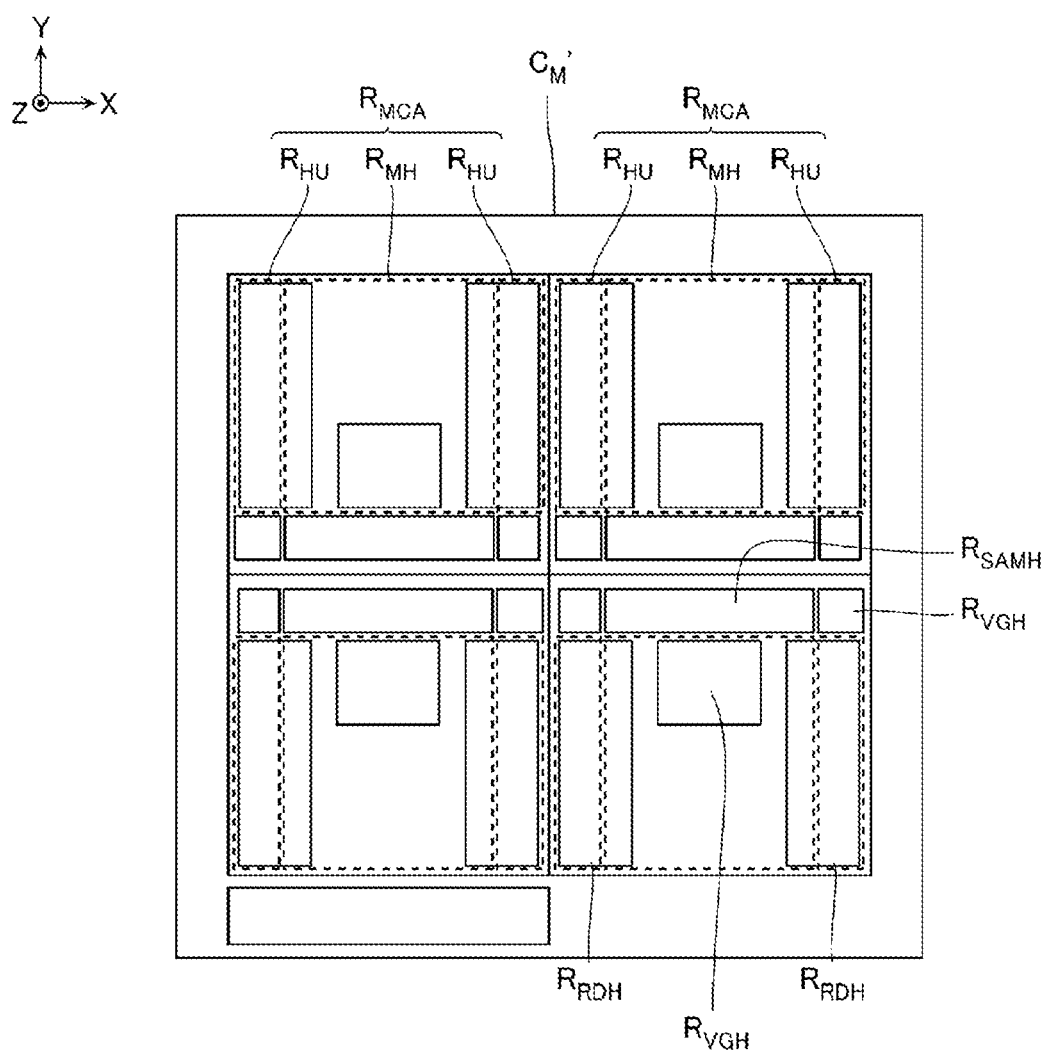
FIG. 36 is a schematic plan view illustrating an example of a configuration of a chip.

For example, in the example of FIG. 36, the chip $C_M'$ is provided with four memory cell array regions $R_{MCA}$ arranged in the X direction and the Y direction. Further, the row decoder region $R_{RDH}$ is formed at a position that overlaps with portions of the hookup region $R_{HU}$ and the memory hole region $R_{MH}$ when viewed from the Z direction. Further, the sense amplifier module region $R_{SAMH}$ is formed at a position that does not overlap with the memory cell array region $R_{MCA}$ when viewed from the Z direction. Further, a portion of the voltage generation circuit region $R_{VGH}$ is formed at a position aligned with the row decoder region $R_{RDH}$ in the Y direction and aligned with the sense amplifier module region $R_{SAMH}$ in the X direction. Further, a portion of the voltage generation circuit region $R_{VGH}$ is formed at a position that overlaps with the memory hole region $R_{MH}$ when viewed from the Z direction.

Figure 37:
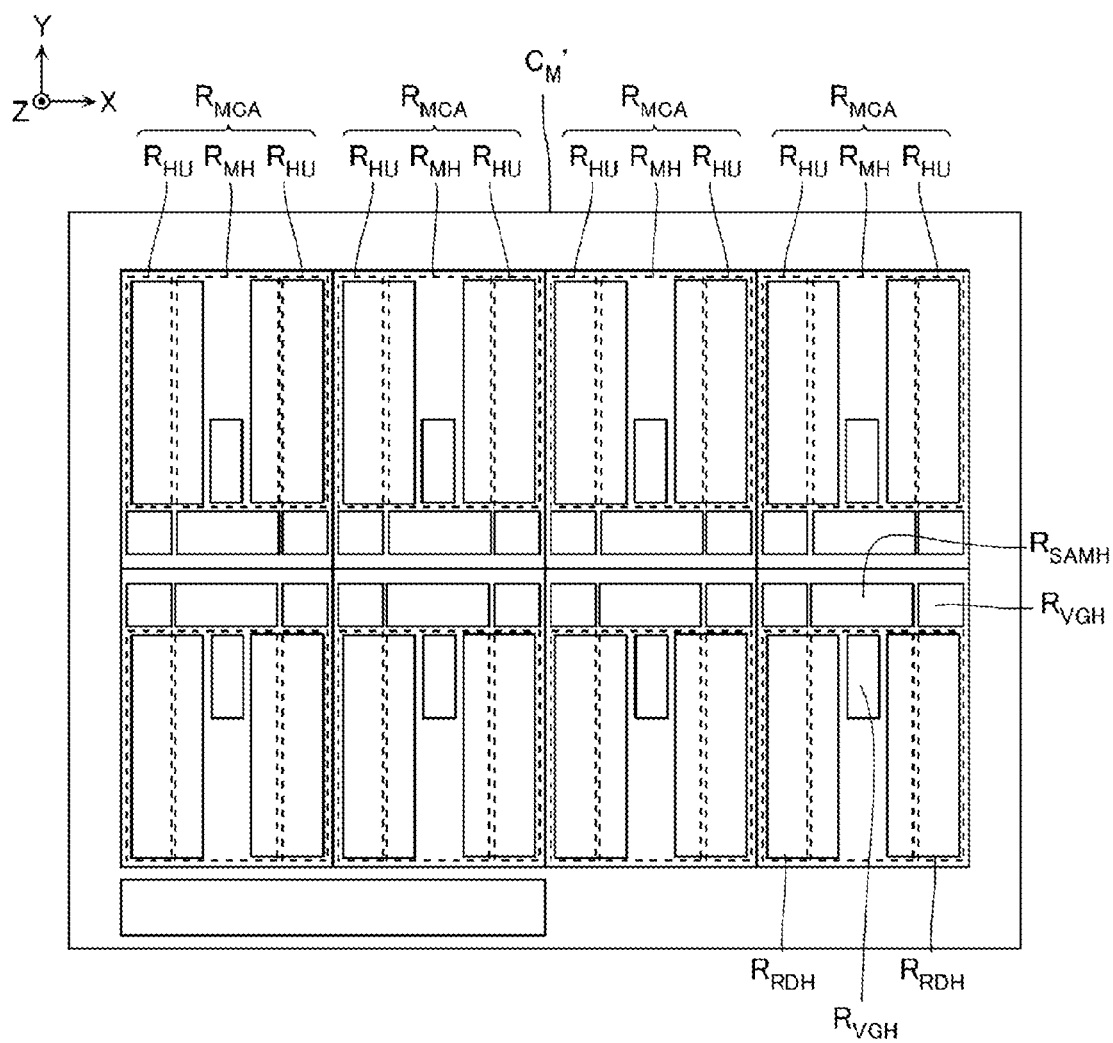
FIG. 37 is a schematic plan view illustrating an example of a configuration of a chip.

Further, for example, in the example of FIG. 37, the chip $C_M'$ is provided with four memory cell array regions $R_{MCA}$ arranged in the X direction, and four memory cell array regions $R_{MCA}$ arranged to correspond to the former four memory cell array regions $R_{MCA}$, respectively, in the Y direction. Further, the row decoder region $R_{RDH}$, the sense amplifier module region $R_{SAMH}$ and the voltage generation circuit region $R_{VGH}$ are arranged in the similar aspect illustrated in FIG. 36, for the eight memory cell array regions $R_{MCA}$.

Here, with the progress of the high integration of a semiconductor storage device, the delay of the voltage transmission speed in the conductive layer 110 is increasing. In order to prevent this influence, for example, it may be conceived to divide each memory cell array region $R_{MCA}$ in the X direction, thereby reducing the length of the conductive layer 110 in the X direction in each memory cell array region $R_{MCA}$. However, for example, when one memory cell array region $R_{MCA}$ is divided into two memory cell array regions $R_{MCA}$ in the X direction, it is necessary to form the hookup region $R_{HU}$ and the row decoder region $R_{RDH}$ to correspond to each memory cell array region $R_{MCA}$. Accordingly, the area of the hookup region $R_{HU}$ and the row decoder region $R_{RDH}$ may be doubled, and as a result, the area of the chip $C_M'$ in the X direction may increase.

Thus, in the configuration illustrated in FIGS. 36 and 37, the row decoder region $R_{RDH}$ is formed at the position that overlaps with the memory cell array region $R_{MCA}$ when viewed from the Z direction. According to this configuration, even when one memory cell array region $R_{MCA}$ is divided into two memory cell array regions $R_{MCA}$ in the X direction, the area of the row decoder region $R_{RDH}$ is not doubled. Further, in the present embodiment, the low voltage transistors of the row decoder RD are provided on the chip $C_P$. Accordingly, the area of the row decoder region $R_{RDH}$ is relatively small, and it is relatively easy to fit the row decoder region $R_{RDH}$ in the region that overlaps with the memory cell array region $R_{MCA}$. Thus, it is possible to reduce the delay of the voltage transmission speed in the conductive layer 110, while preventing the increase in area of the chip $C_M'$ in the X direction.

Figure 38:
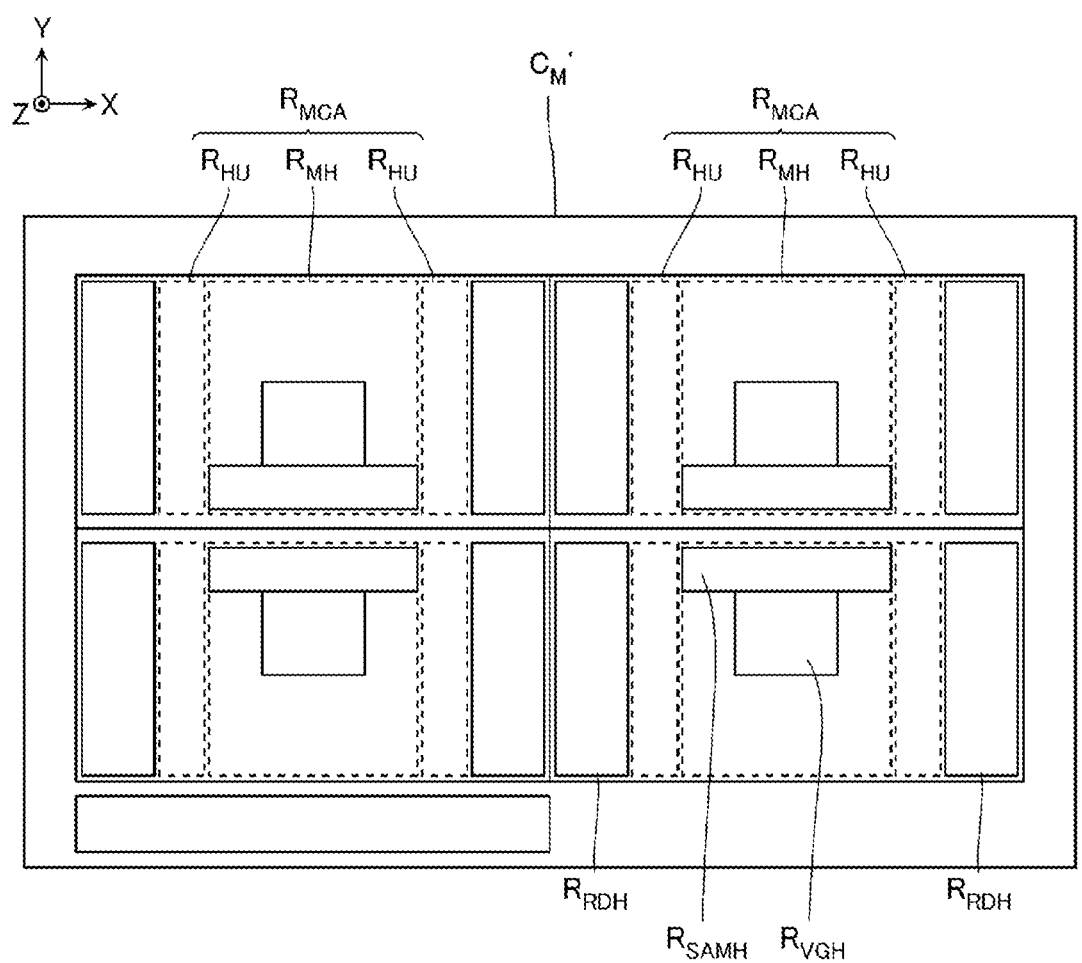
FIG. 38 is a schematic plan view illustrating an example of a configuration of a chip.

Further, for example, in the example of FIG. 38, the chip $C_M'$ is provided with four memory cell array regions $R_{MCA}$ arranged in the X direction and the Y direction. Further, the row decoder region $R_{RDH}$ is formed at a position that does not overlap with the memory cell array region $R_{MCA}$ when viewed from the Z direction. Further, the sense amplifier module region $R_{SAMH}$ is formed at a position that overlaps with a portion of the memory hole region $R_{MH}$ when viewed from the Z direction. Further, the voltage generation circuit region $R_{VGH}$ is formed at a position that overlaps with the memory hole region $R_{MH}$ when viewed from the Z direction.

Figure 39:
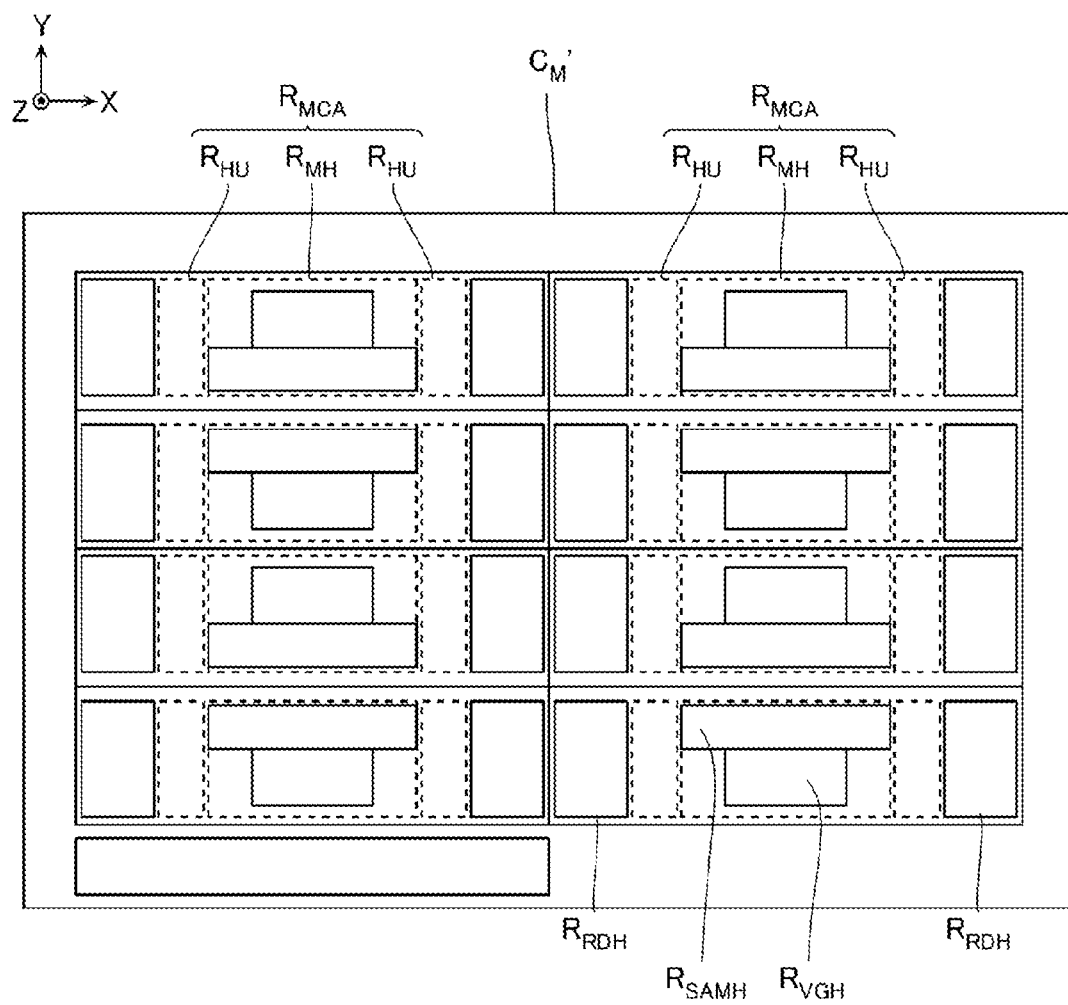
FIG. 39 is a schematic plan view illustrating an example of a configuration of a chip.

Further, for example, in the example of FIG. 39, the chip $C_M'$ is provided with four memory cell array regions $R_{MCA}$ arranged in the Y direction, and four memory cell array regions $R_{MCA}$ arranged to correspond to the former four memory cell array regions $R_{MCA}$, respectively, in the X direction. Further, the row decoder region $R_{RDH}$, the sense amplifier module region $R_{SAMH}$, and the voltage generation circuit region $R_{VGH}$ are arranged in the aspect illustrated in FIG. 38, for the eight memory cell array regions $R_{MCA}$.

Here, as the operation of a semiconductor storage device becomes complicated, it is required to increase the voltage transmission speed in the bit lines BL. To this end, for example, it may be conceived to divide each memory cell array region $R_{MCA}$ in the Y direction, thereby reducing the length of the bit lines BL in the Y direction in each memory cell array region $R_{MCA}$. However, for example, when one memory cell array region $R_{MCA}$ is divided into two memory cell array regions $R_{MCA}$ in the Y direction, it is necessary to form the sense amplifier module region $R_{SAMH}$ to correspond to each memory cell array region $R_{MCA}$. Thus, the area of the sense amplifier module region $R_{SAMH}$ may be doubled, and as a result, the area of the chip $C_M'$ in the Y direction may increase.

Thus, in the configuration illustrated in FIGS. 38 and 39, the sense amplifier module region $R_{SAMH}$ is formed at a position that overlaps with the memory cell array region $R_{MCA}$ when viewed from the Z direction. According to this configuration, even when one memory cell array region $R_{MCA}$ is divided into two memory cell array regions $R_{MCA}$ in the Y direction, the area of the sense amplifier module region $R_{SAMH}$ is not doubled. Further, in the present embodiment, the low voltage transistors of the sense amplifier module SAM are provided on the chip $C_P$. Thus, the area of the sense amplifier module region $R_{SAMH}$ is relatively small, and it is relatively easy to fit the sense amplifier module region $R_{SAMH}$ in the region that overlaps with the memory cell array region $R_{MCA}$. Thus, it is possible to increase the voltage transmission speed in the bit lines BL, while preventing the increase in area of the chip $C_M'$ in the Y direction.

Figure 40:
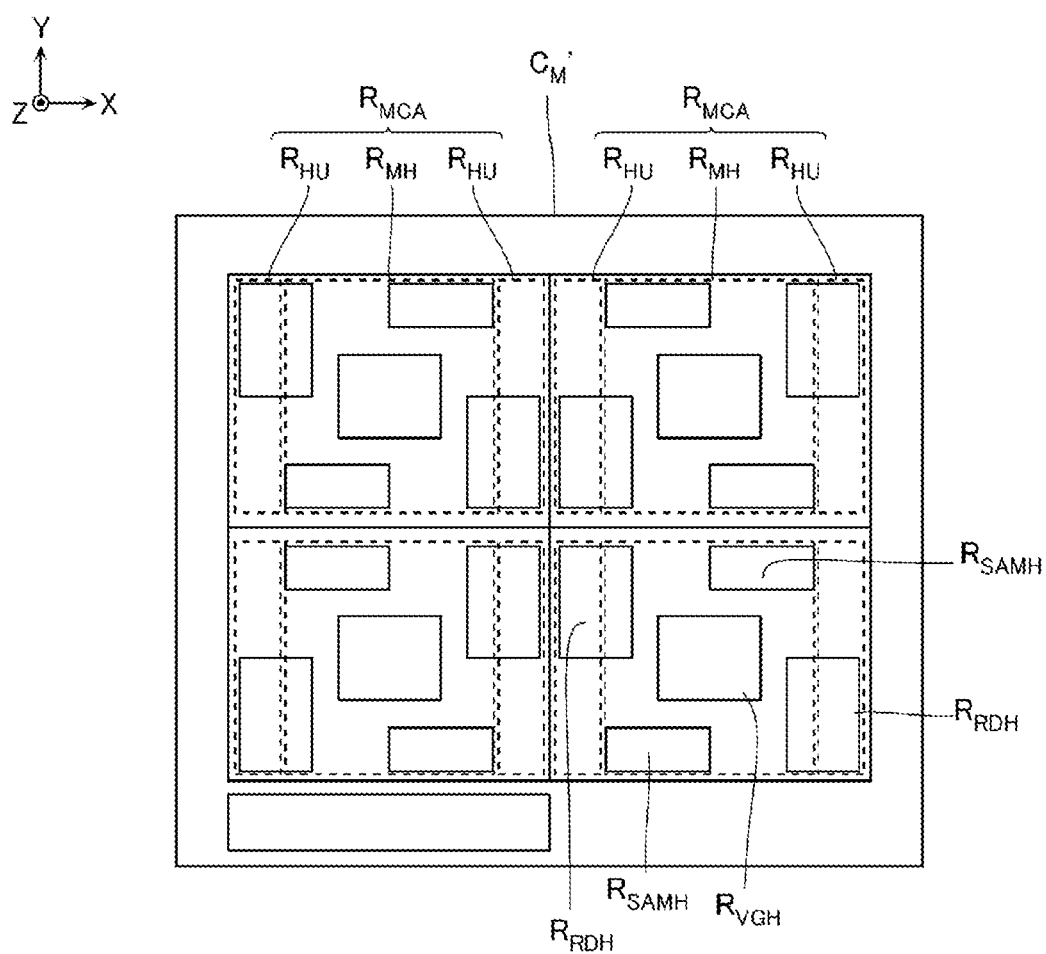
FIG. 40 is a schematic plan view illustrating an example of a configuration of a chip.

Further, for example, in the example of FIG. 40, the chip $C_M'$ is provided with four memory cell array regions $R_{MCA}$ arranged in the X direction and the Y direction. Further, the row decoder region $R_{RDH}$ that corresponds to a portion of the word lines WL (e.g., the word lines WL provided on the upper side in FIG. 40) is formed at a position overlapping with portions of the hookup region $R_{HU}$ and the memory hole region $R_{MH}$ that correspond to one side of the memory cell array region $R_{CMA}$ in the X direction (the left side in FIG. 40) and one side thereof in the Y direction (the upper side in FIG. 40), when viewed from the Z direction. Further, the row decoder region $R_{RDH}$ that corresponds to a portion of the word lines WL (e.g., the word lines WL provided on the lower side in FIG. 40) is formed at a position overlapping with portions of the hookup region $R_{HU}$ and the memory hole region $R_{MH}$ that correspond to the other side of the memory cell array region $R_{CMA}$ in the X direction (the right side in FIG. 40) and the other side thereof in the Y direction (the lower side in FIG. 40), when viewed from the Z direction. Further, the sense amplifier module region $R_{SAMH}$ that corresponds to a portion of the bit lines BL (e.g., the bit lines BL provided on the left side in FIG. 40) is formed at a position overlapping with a portion of the memory hole region $R_{MH}$ that corresponds to one side of the memory cell array region $R_{CMA}$ in the X direction (the left side in FIG. 40) and the other thereof in the Y direction (the lower side in FIG. 40), when viewed from the Z direction. Further, the sense amplifier module region $R_{SAMH}$ that corresponds to a portion of the bit lines BL (e.g., the bit lines BL provided on the right side in FIG. 40) is formed at a position overlapping with a portion of the memory hole region $R_{MH}$ that corresponds to the other side of the memory cell array region $R_{CMA}$ in the X direction (the right side in FIG. 40) and one side thereof in the Y direction (the upper side in FIG. 40), when viewed from the Z direction. Further, the voltage generation circuit region $R_{VGH}$ is formed at a position that overlaps with a portion of the memory hole region $R_{MH}$ when viewed from the Z direction.

According to this configuration, the increase in area of the chip $C_M$ may be prevented, even when the memory cell array region $R_{MCA}$ is divided in both the X direction and the Y direction.

Further, in the semiconductor storage device according to the seventh embodiment, the high voltage transistor $Tr_{NH2}$ according to the second embodiment may also be adopted. Further, in the semiconductor storage device according to the seventh embodiment, the low voltage transistors $Tr_{NL2}$ and $Tr_{PL2}$ according to the third embodiment may also be adopted. Further, in the semiconductor storage device according to the seventh embodiment, the input/output circuit region $R_{IO}$ may be formed at a position that overlaps with the memory cell array region $R_{MCA}$ when viewed from the Z direction, as in the fourth embodiment. Further, in the semiconductor storage device according to the seventh embodiment, at least a portion of the address decoder 22 may be provided on the chip $C_M'$, rather than the chip $C_P$, as in the fifth embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a first chip; and
a second chip,
wherein the first chip includes
a first semiconductor substrate,
a plurality of first conductive layers arranged in a first direction intersecting a surface of the first semiconductor substrate, and extending in a second direction intersecting the first direction,
a first semiconductor column extending in the first direction and facing the plurality of first conductive layers,
a first charge storage film provided between the plurality of first conductive layers and the first semiconductor column,
a plurality of first transistors provided on the first semiconductor substrate, each of the first transistors including a first gate insulating film provided on the first semiconductor substrate, and
a plurality of first bonding electrodes electrically connected to at least a portion of the plurality of first transistors,
wherein the second chip includes
a second semiconductor substrate,
a plurality of second transistors provided on the second semiconductor substrat, each of the second transistors including a second gate insulating film provided on the second semiconductor substrate, and
a plurality of second bonding electrodes electrically connected to at least a portion of the plurality of second transistors, and bonded to the plurality of first bonding electrodes,
wherein a thickness of the second semiconductor substrate in the first direction is smaller than a thickness of the first semiconductor substrate in the first direction, and
wherein a thickness of the second gate insulating film in the first direction is smaller than a thickness of the first gate insulating film in the first direction.

2. The semiconductor storage device according to claim 1, wherein
each of the plurality of first transistors also includes a first gate electrode provided on the first gate insulating film, a first gate contact electrode provided on the first gate electrode, a first drain contact electrode provided on the first semiconductor substrate, and a first source contact electrode provided on the first semiconductor substrate, and
each of the plurality of second transistors also includes a second gate electrode provided on the second gate insulating film, a second gate contact electrode provided on the second gate electrode, a second drain contact electrode provided on the second semiconductor substrate, and a second source contact electrode provided on the second semiconductor substrate.

3. The semiconductor storage device according to claim 2, wherein
a first distance, which is the shortest distance along a direction that is parallel to the surface of the first semiconductor substrate, from the first gate contact electrode to the first drain contact electrode, is greater than a second distance, which is the shortest distance along a direction that is parallel to the surface of the second semiconductor substrate, from the second gate contact electrode to the second drain contact electrode.

4. The semiconductor storage device according to claim 2, wherein a connection portion of the second semiconductor substrate with the second drain contact electrode and a connection portion of the second semiconductor substrate with the second source contact electrode include metal atoms.

5. The semiconductor storage device according to claim 1, wherein a voltage higher than 5V is supplied to the plurality of first transistors, and a voltage lower than 5V is supplied to the plurality of second transistors.

6. The semiconductor storage device according to claim 1, further comprising:
a third transistor electrically connected to any of the plurality of conductive layers;
a first level shifter circuit connected to a gate electrode of the third transistor;
a first decode circuit connected to an input terminal of the first level shifter circuit; and
a first register circuit connected to the first decode circuit,
wherein the plurality of first transistors includes the third transistor and a transistor in the first level shifter circuit.

7. The semiconductor storage device according to claim 6, wherein
the plurality of first transistors further includes a transistor in the first decode circuit, and a transistor in the first register circuit, and
one of the plurality of first bonding electrodes and one of the plurality of second bonding electrodes are provided in a signal path between the transistor in the first level shifter circuit and the transistor in the first decode circuit.

8. The semiconductor storage device according to claim 6, wherein the plurality of first transistors further includes a transistor in the first decode circuit, and the plurality of second transistors includes a transistor in the first register circuit, and one of the plurality of first bonding electrodes and one of the plurality of second bonding electrodes are provided in a signal path between the transistor in the first decode circuit and the transistor in the first register circuit.

9. The semiconductor storage device according to claim 1, wherein the second chip includes a plurality of bonding pad electrodes, and the plurality of second transistors include a fourth transistor electrically connected to any of the plurality of bonding pad electrodes without passing through another transistor.

10. The semiconductor storage device according to claim 9, wherein the second chip includes a plurality of bonding pad electrodes, and at least one of the plurality of bonding pad electrodes is provided at a position that overlaps with at least one of the plurality of first conductive layers when viewed from the first direction.

11. The semiconductor storage device according to claim 1, the plurality of first transistors further includes a fifth transistor electrically connected to the first semiconductor column without passing through another transistor.

12. The semiconductor storage device according to claim 1, wherein the first semiconductor column is connected to the first semiconductor substrate.

13. The semiconductor storage device according to claim 1, wherein the first semiconductor column is spaced from the first semiconductor substrate.

14. The semiconductor storage device according to claim 13, wherein a thickness of the second semiconductor substrate in the first direction is ½ or smaller than a thickness of the first semiconductor substrate in the first direction.

15. The semiconductor storage device according to claim 13, wherein the plurality of the second transistors are low voltage transistors, and the plurality of the first transistors are high voltage transistors configured to be supplied a first voltage larger than a second voltage supplying to the low voltage transistors.

16. A semiconductor storage device, comprising:
a first chip having a first semiconductor substrate on which a memory cell array and a plurality of high voltage transistors are formed, and a plurality of first bonding electrodes electrically connected to at least a portion of the plurality of high voltage transistors; and
a second chip having a second semiconductor substrate on which a plurality of low voltage transistors are formed and a plurality of second bonding electrodes electrically connected to at least a portion of the plurality of low voltage transistors, and bonded to the plurality of first bonding electrodes, wherein
the memory cell array includes a plurality of first conductive layers arranged in a first direction intersecting a surface of the first semiconductor substrate, and extending in a second direction intersecting the first direction, a plurality of semiconductor columns extending in the first direction and facing the plurality of first conductive layers, and a plurality of first charge storage films formed between the plurality of first conductive layers and each of the semiconductor columns,
the high voltage transistors and the low voltage transistors are transistors of a peripheral circuit for the memory cell array, and each transistor of the peripheral circuit to which more than 5V is supplied is a high voltage transistor that is formed on the first semiconductor substrate, and
a thickness of a gate insulating film in each of the low voltage transistors in the first direction is smaller than a thickness of a gate insulating film of any of the high voltage transistors in the first direction.

17. The semiconductor storage device according to claim 16, wherein a thickness of the second semiconductor substrate in the first direction is smaller than a thickness of the first semiconductor substrate in the first direction.

18. The semiconductor storage device according to claim 16, wherein each of the plurality of high voltage transistors is formed closer to the first semiconductor substrate than any of the plurality of semiconductor columns.

* * * * *